(12) United States Patent
Jannard et al.

(10) Patent No.: US 9,955,051 B2
(45) Date of Patent: Apr. 24, 2018

(54) MODULAR MOTION CAMERA

(71) Applicant: RED.COM, LLC, Irvine, CA (US)

(72) Inventors: James H. Jannard, Las Vegas, NV (US); Peter Jarred Land, Los Angeles, CA (US)

(73) Assignee: RED.COM, LLC, Irvine, CA (US)

( * ) Notice: Subject to any disclaimer, the term of this patent is extended or adjusted under 35 U.S.C. 154(b) by 0 days.

(21) Appl. No.: 15/089,217

(22) Filed: Apr. 1, 2016

(65) Prior Publication Data

US 2016/0295079 A1    Oct. 6, 2016

Related U.S. Application Data

(60) Provisional application No. 62/142,995, filed on Apr. 3, 2015, provisional application No. 62/146,162, filed on Apr. 10, 2015, provisional application No. 62/146,165, filed on Apr. 10, 2015, provisional application No. 62/146,169, filed on Apr. 10, 2015.

(51) Int. Cl.
| | |
|---|---|
| *H04N 5/225* | (2006.01) |
| *G06F 3/16* | (2006.01) |
| *H04N 5/232* | (2006.01) |
| *H05K 7/20* | (2006.01) |
| *G03B 17/00* | (2006.01) |
| *G03B 19/18* | (2006.01) |

(52) U.S. Cl.
CPC .......... *H04N 5/2252* (2013.01); *G03B 17/00* (2013.01); *G03B 19/18* (2013.01); *G06F 3/16* (2013.01); *H04N 5/2251* (2013.01); *H04N 5/2253* (2013.01); *H04N 5/2254* (2013.01); *H04N 5/2257* (2013.01); *H04N 5/23209* (2013.01); *H05K 7/20145* (2013.01); *H05K 7/20172* (2013.01); *G03B 2217/002* (2013.01)

(58) Field of Classification Search
None
See application file for complete search history.

(56) References Cited

U.S. PATENT DOCUMENTS

| | | |
|---|---|---|
| 2,570,824 A | 10/1951 | Lindenblad |
| 3,524,392 A | 8/1970 | Langnau et al. |
| | (Continued) | |

FOREIGN PATENT DOCUMENTS

| | | |
|---|---|---|
| CN | 102665069 A | 9/2012 |
| CN | 101800356 B | 1/2013 |
| | (Continued) | |

OTHER PUBLICATIONS

Title: Translation of JP06070209A Author: Hanaoka, Shunsuke Date: Mar. 1994.*

(Continued)

*Primary Examiner* — Twyler Haskins
*Assistant Examiner* — Wesley Chiu
(74) *Attorney, Agent, or Firm* — Knobbe, Martens, Olson & Bear LLP

(57) ABSTRACT

Modular digital camera systems are disclosed. The modular digital camera system can include a brain module configured to be releasably coupled to one or more of a port extender module, power module, display module, and handle module. The brain module and other accessory modules can be structured according to some embodiments to increase an ease of coupling and decoupling the modules.

20 Claims, 45 Drawing Sheets

(56) References Cited

U.S. PATENT DOCUMENTS

| | | | |
|---|---|---|---|
| 4,012,741 A | | 3/1977 | Johnson |
| 4,222,649 A | | 9/1980 | Niwa et al. |
| 4,281,909 A | | 8/1981 | Ishibashi et al. |
| 4,547,815 A | | 10/1985 | Kimura |
| 4,733,245 A | | 3/1988 | Mussler et al. |
| 5,132,800 A | * | 7/1992 | Wada ............... G11B 31/006 348/372 |
| 5,189,520 A | * | 2/1993 | Okayasu ............ H04N 5/2251 348/376 |
| 5,229,777 A | | 7/1993 | Doyle |
| 5,469,211 A | * | 11/1995 | Maruichi ............ H04N 5/2251 348/211.2 |
| 5,555,252 A | | 10/1996 | Brock et al. |
| 5,568,205 A | * | 10/1996 | Hurwitz ............. G11B 27/028 348/722 |
| 5,611,769 A | | 3/1997 | Monroe |
| 5,655,381 A | | 8/1997 | Huttenlocher et al. |
| 5,754,227 A | | 5/1998 | Fukuoka |
| 5,815,205 A | | 9/1998 | Hashimoto et al. |
| 6,181,883 B1 | | 1/2001 | Oswal |
| 6,215,660 B1 | | 4/2001 | Lin |
| 6,368,447 B1 | | 4/2002 | Boyd et al. |
| 6,582,240 B2 | | 6/2003 | Suto |
| 6,628,326 B1 | * | 9/2003 | Manico ............ H04N 1/00347 348/211.12 |
| 7,016,603 B2 | | 3/2006 | Clark |
| 7,253,840 B2 | * | 8/2007 | Kayanuma ......... H04N 1/00204 348/375 |
| 7,495,702 B2 | | 2/2009 | Herranen et al. |
| 7,542,093 B2 | | 6/2009 | Katakai |
| 7,589,780 B2 | | 9/2009 | Takizawa et al. |
| 7,632,025 B2 | | 12/2009 | Sung et al. |
| 7,796,187 B2 | | 9/2010 | Shangguan et al. |
| 7,889,240 B2 | | 2/2011 | Hashimoto et al. |
| 7,907,411 B2 | | 3/2011 | Whittum et al. |
| 8,199,251 B2 | | 6/2012 | Woodman |
| 8,274,559 B2 | | 9/2012 | Amling et al. |
| 8,471,917 B2 | | 6/2013 | Werth et al. |
| 8,477,238 B2 | | 7/2013 | Jannard |
| 8,525,925 B2 | | 9/2013 | Jannard |
| 8,638,392 B2 | | 1/2014 | Woodman |
| 8,648,758 B2 | | 2/2014 | Johnson |
| 8,860,893 B2 | | 10/2014 | Kawashima |
| 8,872,121 B2 | | 10/2014 | Kato et al. |
| D726,805 S | * | 4/2015 | Jannard .................... D16/237 |
| 9,086,835 B2 | | 7/2015 | Beeze et al. |
| 9,188,839 B2 | | 11/2015 | Rodriguez et al. |
| 9,204,111 B2 | | 12/2015 | Smart et al. |
| 2003/0021602 A1 | * | 1/2003 | Ford ..................... G03B 17/00 396/427 |
| 2003/0112338 A1 | * | 6/2003 | Pelletier ................ H04B 10/40 348/211.99 |
| 2004/0169771 A1 | | 9/2004 | Washington et al. |
| 2004/0201684 A1 | | 10/2004 | Janson, Jr. |
| 2005/0237491 A1 | | 10/2005 | Lin |
| 2006/0056049 A1 | | 3/2006 | Tokiwa |
| 2006/0098116 A1 | | 5/2006 | Manico et al. |
| 2006/0256199 A1 | | 11/2006 | Takahashi |
| 2006/0256230 A1 | | 11/2006 | Maeda |
| 2006/0290893 A1 | | 12/2006 | Lim |
| 2008/0198082 A1 | | 8/2008 | Soler Castany |
| 2008/0260377 A1 | * | 10/2008 | Sakata .................. G03B 17/02 396/535 |
| 2009/0002549 A1 | | 1/2009 | Kobayashi |
| 2009/0191755 A1 | | 7/2009 | Ma et al. |
| 2010/0111489 A1 | | 5/2010 | Presler |
| 2010/0165188 A1 | * | 7/2010 | Jannard ............... H04N 5/2252 348/375 |
| 2011/0115891 A1 | | 5/2011 | Trusty |
| 2012/0050608 A1 | | 3/2012 | Makara |
| 2012/0285146 A1 | | 11/2012 | Ikeda |
| 2013/0050032 A1 | | 2/2013 | Shiu et al. |
| 2013/0242099 A1 | | 9/2013 | Sauer et al. |
| 2014/0055671 A1 | | 2/2014 | Kawamura |
| 2014/0063334 A1 | | 3/2014 | McBride |
| 2014/0111393 A1 | | 4/2014 | Tong et al. |
| 2014/0208557 A1 | | 7/2014 | Sugihara |
| 2014/0226036 A1 | | 8/2014 | Jannard et al. |
| 2014/0270687 A1 | | 9/2014 | Jannard et al. |
| 2015/0055297 A1 | | 2/2015 | Chilek et al. |
| 2015/0062409 A1 | | 3/2015 | Tsuzuki |
| 2015/0236447 A1 | * | 8/2015 | Nakajima ............. G03B 17/56 403/322.4 |
| 2015/0263432 A1 | | 9/2015 | White |
| 2015/0288393 A1 | | 10/2015 | Han |
| 2015/0288942 A1 | | 10/2015 | Jannard et al. |
| 2016/0050347 A1 | | 2/2016 | Liu |
| 2017/0070681 A1 | * | 3/2017 | Nattress ............. H04N 5/23293 |

FOREIGN PATENT DOCUMENTS

| | | |
|---|---|---|
| CN | 202738001 U | 2/2013 |
| CN | 103293831 A | 9/2013 |
| CN | 204408527 U | 6/2015 |
| CN | 204633943 U | 9/2015 |
| CN | 204906532 U | 12/2015 |
| EP | 0018476 B1 | 1/1984 |
| JP | 06070209 A * | 3/1994 |
| JP | 10294981 A | 11/1998 |
| JP | 2005-181922 A | 7/2005 |
| JP | 2007-166006 A | 6/2007 |
| JP | 2008-219610 A | 9/2008 |
| JP | 2014-235206 A | 12/2014 |
| KR | 100668276 B1 | 1/2007 |
| WO | WO 2000/068770 A1 | 11/2000 |
| WO | WO 2014-065042 | 5/2014 |
| WO | WO 2015/013054 A1 | 1/2015 |

OTHER PUBLICATIONS

Invitation to Pay Additional Fees and Annex to Form PCT/ISA/206 Communication Relating to the Results of the Partial International Search for International Application No. PCT/US2016/025603 dated Jun. 7, 2016.

Sony / Showcase Digital Motion Picture Cameras, F55, Exceptional visual storytelling. https://pro.sony.com/bbsc/ssr/show-highend/re-source.solutions.bbsccms-assets-show-highend-f55camera.shtml. retrieved Feb. 26, 2016, in 18 pages.

DSMC2 Redvolt Expander, RED Digital store (US), http.//www.red.com/store/products/dsmc2-redvolt-expander, retrieved Mar. 14, 2016, in 2 pages.

Network Camera: Installation Manual V5.0, Hikvision, Hangzhou Hikvision Digital Technology Co., Ltd. http://www.hikvision.com, in 95 pages.

DSMC2 Base Expander, RED Digital Cinema store (US), http://www.red.com/store/products/dsmc2-base-expander, retrieved Mar. 4, 2016, in 2 pages.

V. Ratna Bhargavi et al., "Gain Enhancement of V-slotted Triangular Shape Microstrip Patch Antenna for Wimax Applications," International Journal of Engineering Research and Applications (IJERA), May-Jun. 2012, pp. 1187-1193, vol. 2, Issue 3.

Pixim, Every Pixel Tells a Story, "D8800C Seawolf Board Camera Reference Design", revised Aug. 2010, Pixim Inc., in 2 pages.

Audine CCD-Camera Project, Audine Group, http://www.konradhorn.de/seite4.htm, retrieved Mar. 14, 2016, in 10 pages.

Chung, Dan, "Hands on with the RED Raven", News Shooter, Nov. 13, 2015, in 11 pages.

Ramping production of the new revisions of cooled CCD cameras, Moravian Instruments, Inc. http://www.gxccd.com/art?id=437&lang=409&style=4, updated Dec. 29, 2014, 2 pages.

Multi Interface Shoe, Wikipedia, http://en.wikipedia.org/wiki/Multi_Interface_Shoe, retrieved Mar. 30, 2015, in 5 pages.

Panasonic, "Operating Instructions: LCD View Finder Model No. AK-HVF70G," © Panasonic Corporation 2012, in 16 pages.

RED 4K Broadcast Module, RED Digital Cinema store (US), http://www.red.com/store/products/red-4k-broadcast -module, retrieved Mar. 20, 2015, 1 page.

(56) References Cited

OTHER PUBLICATIONS

Pro I/O Module, RED Digital Cinema store (US), http://www.red.com/store/products/pro-io-module, retrieved Mar. 20, 2015, in 1 page.
1 Adaptor Module, RED Digital Cinema store (US), http://www.red.com/store/products/plus1-monitor-adaptor, retrieved Mar. 20, 2015, in 1 page.
DSMC Side Handle, RED Digital Cinema store (US), http://www.red.com/store/products/dsmc-side-handle, retrieved Mar. 20, 2015, in 1 page.
Sony, HD Electronic Viewfinder, HDVF-700A, printed in Japan, Feb. 13, 2000, in 30 pages.
Sony, "HD/SD System Camera HXC-D70," 2011, Sony Electronics Inc., 8 pages.
Sony, "HDVF-EL70/HDVF-EL75—HD Electronic Viewfinder," 2010, Sony Corporation, 2 pages.
Sony, "HXR-NX70U, NXCAM Compact Size Camcorder," 2012, Sony Electronics Inc., 4 pages.
Sony, "PXW-X70: 1.0-inch type CMOS Compact Solid-State Memory Camcorder," Sony Electronics Inc., 2014, 4 pages.
RED Touch 9.0" LCD, RED Digital Cinema store (US), http://www.red.com/store/products/red-touch-9-lcd, URL accessed on Mar. 10, 2014, in 2 pages.
RED Touch 7.0" LCD, RED Digital Cinema store (US), http://www.red.com/store/products/red-touch-7-lcd, URL accessed on Feb. 2, 2015, in 2 pages.
Cavity-Backed Slot Antennas, http://www.antenna-theory.com/antennas/aperture/slot2.php, accessed on Mar. 31, 2012, in 4 pages.
Slot Antennas, http://www.antenna-theory.com/antennas/aperture/slot.php, accessed on Mar. 18, 2012, in 4 pages.
International Search Report and Written Opinion for International application No. PCT/US2016/025603, dated Aug. 16, 2016 in 16 pages.

\* cited by examiner

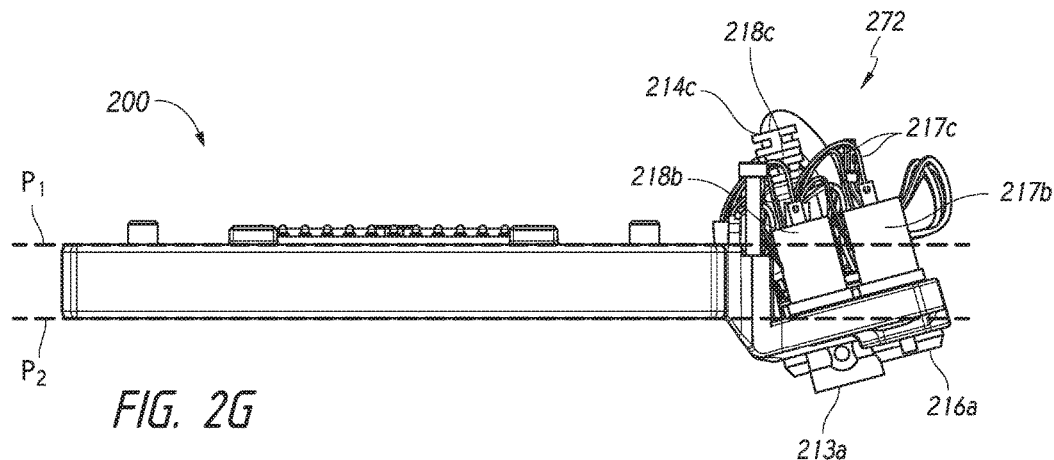
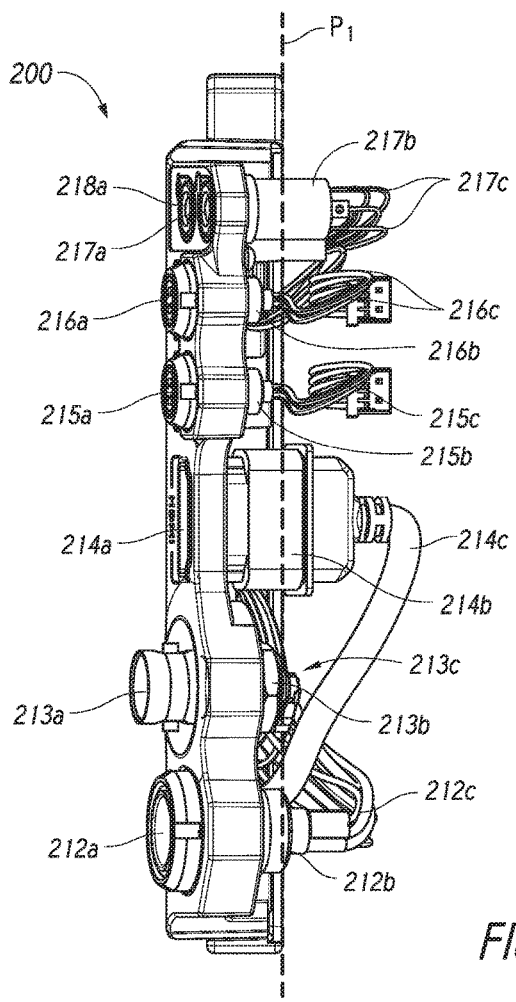

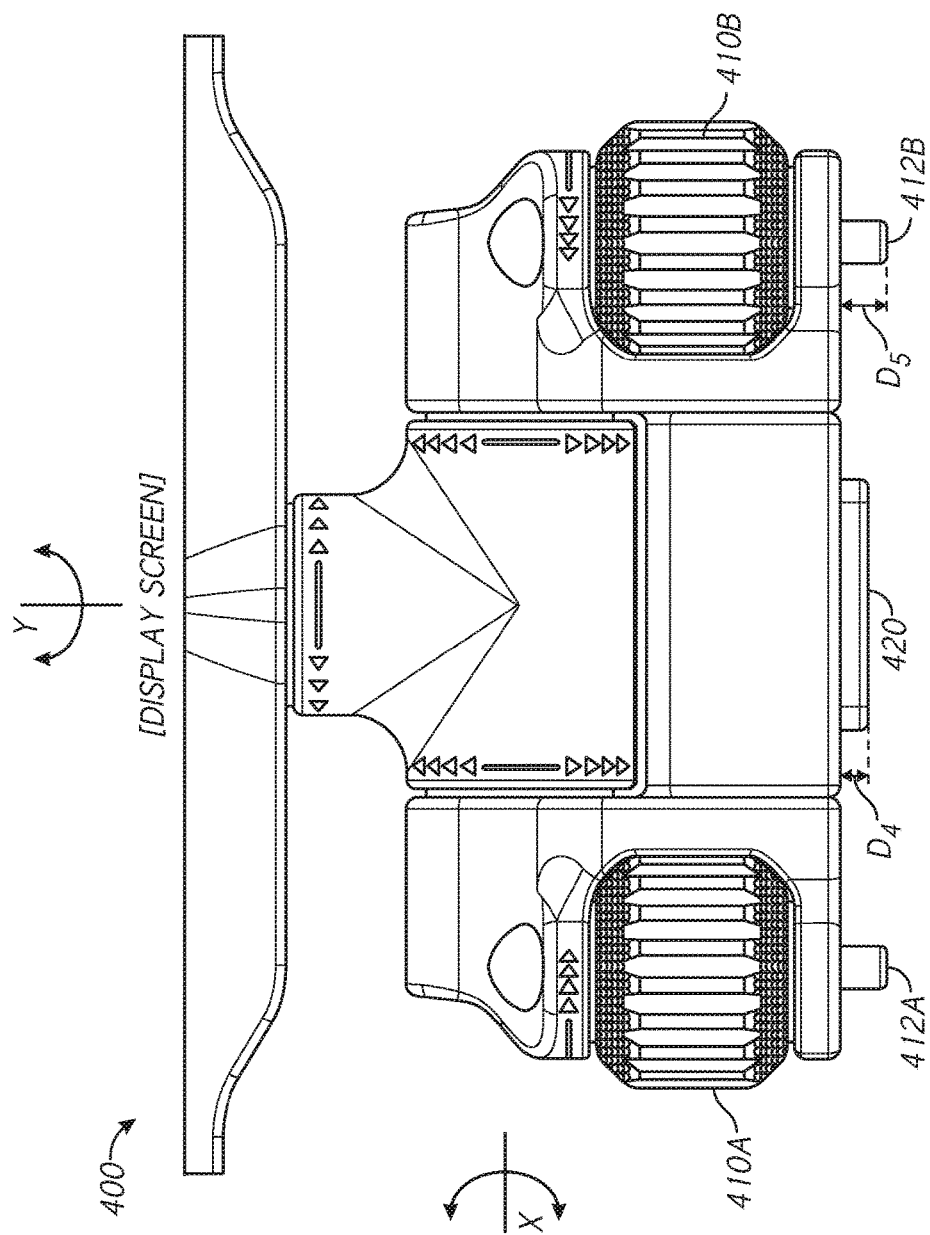

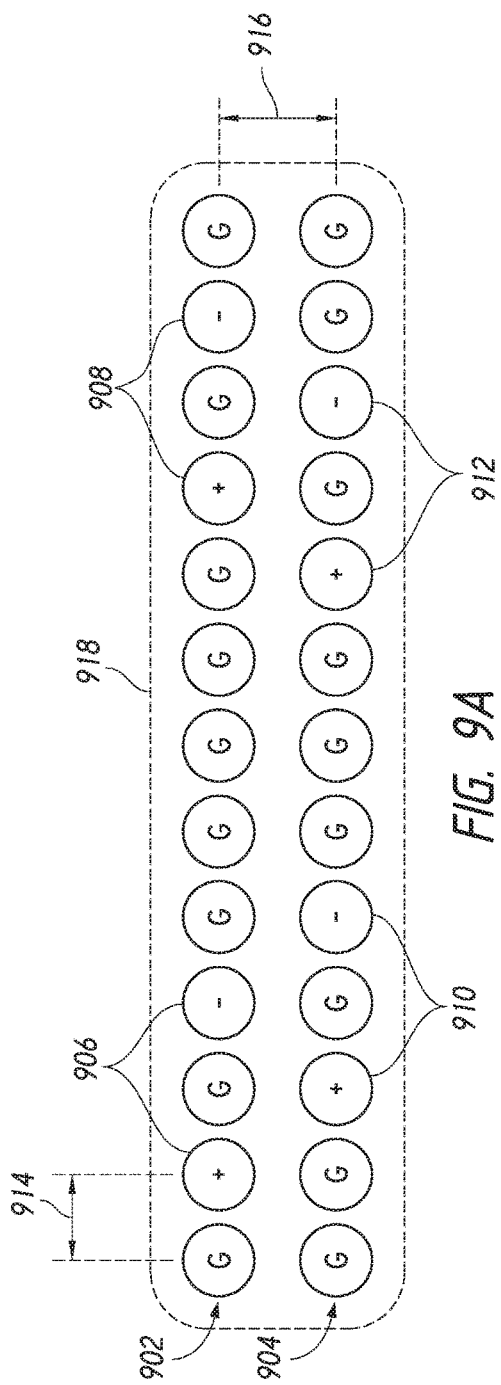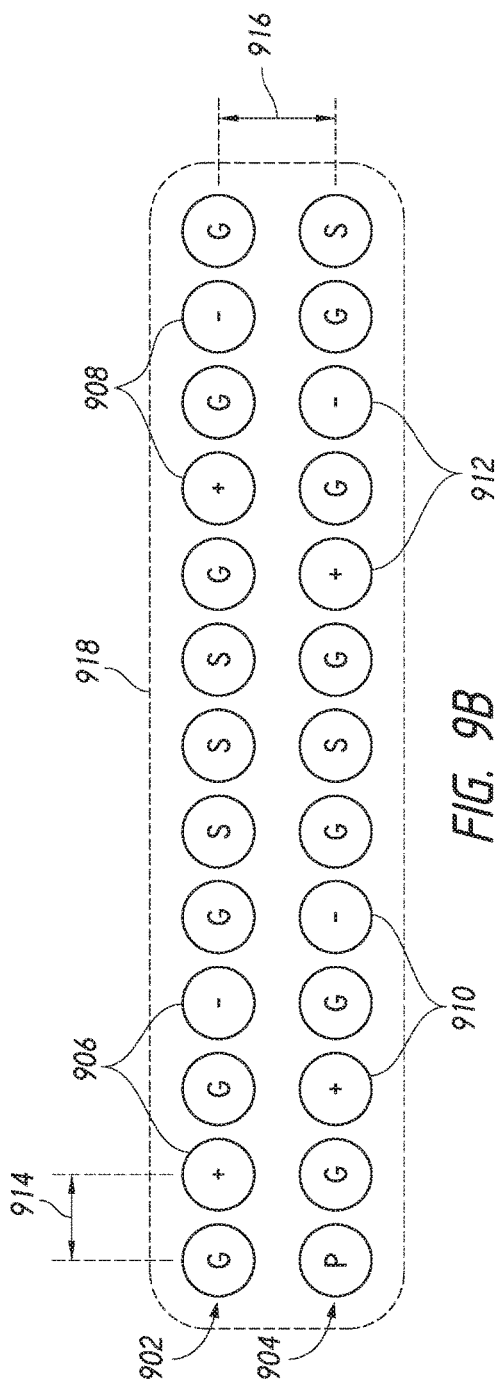

MODULAR MOTION CAMERA

REFERENCE TO RELATED APPLICATIONS

The present application claims priority benefit from U.S. Provisional Application No. 62/142,995, filed Apr. 3, 2015, entitled "MODULAR MOTION CAMERA," U.S. Provisional Application No. 62/146,162, filed Apr. 10, 2015, entitled "MODULAR MOTION CAMERA," U.S. Provisional Application No. 62/146,165, filed Apr. 10, 2015, entitled "MODULAR MOTION CAMERA," and U.S. Provisional Application No. 62/146,169, filed Apr. 10, 2015, entitled "INTEGRATED ANTENNA FOR DIGITAL CAMERA;" the disclosures of which are incorporated herein by reference in their entirety.

BACKGROUND

Digital cameras include a series of functional components such as lenses, optical filters, one or more electronic image sensor arrays, electronic circuits to capture, process and store images from the image sensor array, internal or external memory devices to store and transfer image files, power supplies and a display system to preview the captured images. These components are typically integrated and interdependent, from each of an optical, electronics and physical perspective. In some instances, external lenses and power supplies may be attached to and removed from the camera, but the remaining components are typically permanently integrated into a main framework or housing without any practical ability to be removed and replaced.

SUMMARY

In some embodiments, a digital video camera is disclosed that includes a camera body, an image sensor, and a port expander. The camera body includes a first surface, a second surface, and a plurality of third surfaces extending between the first surface and the second surface. The first surface includes an opening through which light enters the camera body. The image sensor is positioned in the camera body and configured to generate image data corresponding to the light contacting the image sensor. The port expander is releasably attachable to the second surface. The port expander includes: a plurality of electrical ports including a first electrical port; a camera body-proximal surface and a camera body-distal surface defining a thickness of the port expander therebetween, the camera body-proximal surface configured to engage the second surface when the port expander is attached to the camera body; a plurality of sidewalls extending between the camera-body proximal surface and the camera body-distal surface and including a first sidewall; and a connector housing supporting the plurality of electrical ports, the connector housing extending from the first sidewall beyond a first plane defined by the camera body-proximal surface so that a portion of the connector housing extends along at least one of the plurality of third surfaces when the port expander is attached to the camera body, the first electrical port having an axial length that extends through the first plane.

The digital video camera of the preceding paragraph can include one or more of the following features: The connector housing extends beyond the first plane by a distance at least as great as the thickness of the port expander. The connector housing extends beyond the first plane by a distance greater than the thickness of the port expander. The plurality of electrical ports comprises a video monitoring output. The camera-body proximal surface comprises at least one electrical connector configured to mate with at least one corresponding electrical connector of the second surface. The digital video camera further comprise a processor positioned in the camera body and configured to output video data via an electrical path comprising the at least one corresponding electrical connector of the second surface, the at least one electrical connector of the camera-body proximal surface, and the first electrical port. The camera-body proximal surface comprises at least one fastening element configured to engage with a corresponding fastening element provided on the second surface. The first electrical port is arranged to point away from the first surface when the port expander is attached to the camera body. The camera body-distal surface comprises an accessory interface configured for releasable attachment of an electronic device. The camera body-distal surface comprises an accessory interface configured for releasable attachment of a camera battery device, and the accessory interface comprises an electrical connector configured to receive electrical power from the camera battery device. The connector housing additionally extends from the first sidewall beyond a second plane defined by the camera-body distal surface. The the plurality of third surfaces comprise a top side, a bottom side, a left side, and a right side; the plurality of sidewalls comprise a top sidewall, a bottom sidewall, a left sidewall, and a right sidewall; and the connector housing extends along one of the left side or the right side. The second surface is provided on a rear portion of the camera body, the rear portion comprising a cooling grill configured to exchange air between an inside of the camera body and an outside of the camera body; and the cooling grill is positioned on the rear portion such that the port expander attaches to the camera body without covering the cooling grill. The cooling grill is arranged below the second surface. The second surface overhangs the cooling grill. The cooling grill comprises a first part and a second part, the first part defining a third plane and the second part defining a fourth plane perpendicular to the third plane. The cooling grill comprises an air exhaust grill.

In some embodiments, a digital video camera is disclosed that includes a camera body, a microphone, a first fan, and an image sensor. The camera body includes a plurality of walls and a mounting interface. The plurality of walls defining an interior portion of the camera body, the plurality of walls comprising a front wall and a rear wall spaced from one another by a length of the camera body. The mounting interface configured to releasably attach a lens mount to the camera body, the mounting interface surrounding a first opening in the front wall. The microphone positioned in a front side of the interior portion of the camera body and configured to detect sound. The first fan positioned in a rear side of the interior portion of the camera body, the first fan configured to direct air passing into the interior portion of the camera body to an outside of the camera body. The image sensor positioned in the camera body and configured to detect light entering the camera body through the first opening.

The digital video camera of the preceding paragraph can include one or more of the following features: The camera body comprises one or more second openings in one or more of the plurality of walls other than the front wall, the one or more second openings configured to pass the air into the interior portion of the camera body and to the outside of the camera body. The one or more of the plurality of walls other than the front wall comprises at least two different walls of the plurality of walls including a top wall. A portion of the microphone is in the front wall. The portion of the microphone is a perforated grill. The camera body comprises an accessory interface configured to releasably attach an accessory device to the rear wall, the accessory interface comprising an electrical connector configured to receive electrical power from the accessory device and transmit video data to the accessory device. The digital video camera further comprises a second fan positioned in the rear side of the interior portion of the camera body, the second fan configured to direct the air in a common direction as the first fan.

In some embodiments, a digital video camera is disclosed that includes a camera body, a fan, and a microphone. The camera body comprises a plurality of walls defining an interior portion of the camera body, an air intake port and an air exhaust port positioned on one or more of the plurality of walls, and a mounting interface configured to releasably attach a lens mount or a lens to a first side of the camera body. The fan is positioned closer to the first side than a second side of the camera body different from the first side, the fan configured direct air from the air intake port to the air exhaust port through the interior portion to transfer heat from an inside of the camera body to an outside of the camera body. The microphone is positioned closer to the second side than the first side, the microphone configured to detect sound.

The digital video camera of the preceding paragraph can include one or more of the following features: The first side is opposite the second side. The fan is positioned in the first side, and the microphone is positioned in the second side. The first side is a rear side, and the second side is a front side, and at least a portion of the microphone is positioned in a front wall of the camera body. One of the air intake port and the air exhaust port is positioned closer to a top side of the camera body than a bottom side of the camera body, and the other of the air intake port and the air exhaust port is positioned closer to the bottom side than the top side. The air intake port is at least partially positioned in a top wall of the plurality of walls, and the air exhaust port is at least partially positioned in a bottom wall of the plurality of walls. The camera body comprises an accessory interface configured to releasably attach an accessory device to a rear side of the camera body, the accessory interface comprising an electrical connector configured to receive electrical power from the accessory device and transmit video data to the accessory device. The air intake port is at least partially positioned on a first wall of the plurality of walls, and the air exhaust port is at least partially positioned on one or more walls of the plurality of walls other than the first wall. The fan is configured to direct the air away from the first wall and towards the one or more walls of the plurality of walls other than the first wall. The fan is oriented to direct the air along a cooling path that resides more in the first side than in the second side. The fan is positioned proximate the air intake port. The digital video camera further comprises an image sensor positioned in the camera body and configured to detect light entering the camera body through an opening in a wall of the plurality of walls. The fan is configured to direct the air parallel to an image plane defined by the image sensor. The interior portion comprises a first chamber and a second chamber, the first chamber separated at least partly from the second chamber by an interior wall of the camera body; the fan is configured to direct the air through the second chamber rather than the first chamber; and the image sensor and the microphone are positioned in the first chamber rather than the second chamber. The image sensor is cooled via a pipe extending from the first chamber to the second chamber through the interior wall.

In some embodiments, a digital video camera is disclosed that includes a camera body, a fan, an image sensor, and a microphone. The fan is supported by the camera body and configured to transfer heat from inside the camera body to outside the camera body. The image sensor is positioned in the camera body and configured to generate image data corresponding to light entering the camera body and contacting the image sensor. The microphone is supported by the camera body and positioned opposite the fan relative to the image sensor, the microphone configured to detect sound.

The digital video camera of the preceding paragraph can include one or more of the following features: The image sensor comprises a plurality of sensor pixels arranged in an image plane, and the microphone is positioned on one side of the image plane while the fan is positioned on the other side of the image plane. The microphone is positioned proximate a first wall of the camera body, and the fan is positioned proximate a second wall of the camera body different from the first wall. The first wall is adjacent to the second wall, and the fan is configured to direct air away from the second wall. The light enters the camera body through the first wall before contacting the image sensor. The camera body comprises an accessory interface positioned on a third wall of the camera body opposite the image sensor relative to the fan, the accessory interface configured to releasably attach an accessory device to the first wall and comprising an electrical connector configured to receive electrical power from the accessory device and transmit video data to the accessory device, the third wall different from the first wall and the second wall.

BRIEF DESCRIPTION OF THE DRAWINGS

FIG. 2G is a view of a top of the port extender module of FIG. 2A with a side cover of the port extender module removed.

FIG. 2H is a view of a side of the port extender module of FIG. 2A with a side cover of the port extender module removed.

FIG. 2I is perspective view of a back of an example port extender module of a modular camera system.

FIG. 4A is a view of a front of an example display module of a modular camera system.

FIGS. 9A and 9B show schematic diagrams of example port configurations for module connection interfaces of a modular camera system.

DETAILED DESCRIPTION

Various embodiments will be described hereinafter with reference to the accompanying drawings. These embodiments are illustrated and described by example only, and are not intended to be limiting.

System Overview

Digital modular camera systems are described herein. Although the modular camera systems may be referred to as a motion camera systems for illustrative purposes, it is to be understood that the principals of this disclosure are applicable to digital still cameras, digital video cameras, as well as digital still and motion cameras (DSMC). In addition, the description herein may include specific examples of physical electronics and modules, but additional or alternative modules, components, and accessories are contemplated in the modular camera systems of the present disclosure. These can include, for example, any or combinations of lenses, lens mounts, stabilization modules or features, neutral density filters and modules containing neutral density filters, brain modules with or without separate electronics modules, user interface modules, port extender modules, various system bus configurations, recording modules, various displays such as LCD displays, cooling units, electronic view finders, optical view finders, and handles. The modular camera systems may also be provided with or compatible with rails, rods, shoulder mounts, tripod mounts, helicopter mounts, matte boxes, follow focus controls, zoom controls, and other features and accessories.

The pre-calibrated, modular aspect of certain camera systems provided herein can enable a user to construct a modular camera in a variety of configurations. For example, a first brain module may have a first, smaller sensor size. When a larger sensor, recording area, recording speed and the like is desired, the user may uncouple various other functional modules described herein from the brain module with the first sensor size, and reassemble the modular system using a second brain module having a second, larger sensor size. The reassembled modules with the second brain module can be automatically calibrated for seamless functioning without the need for extra calibration or adjustment steps. This can allow the user to upgrade or change out the different components of the without the need to purchase an entirely new camera or camera system.

A modular camera system can include a sensor and electronics module (referred to herein as a brain module). The brain module can also be functionally engageable with one or more other modules including one or more power modules, port extender modules, recording modules, user interface modules, and the like. Additional examples of modules and features compatible with this disclosure are provided in U.S. Pat. No. 8,525,925, issued on Sep. 3, 2013, titled "MODULAR DIGITAL CAMERA," the entirety of which is hereby incorporated by reference.

Brain Module

Figure 1A:
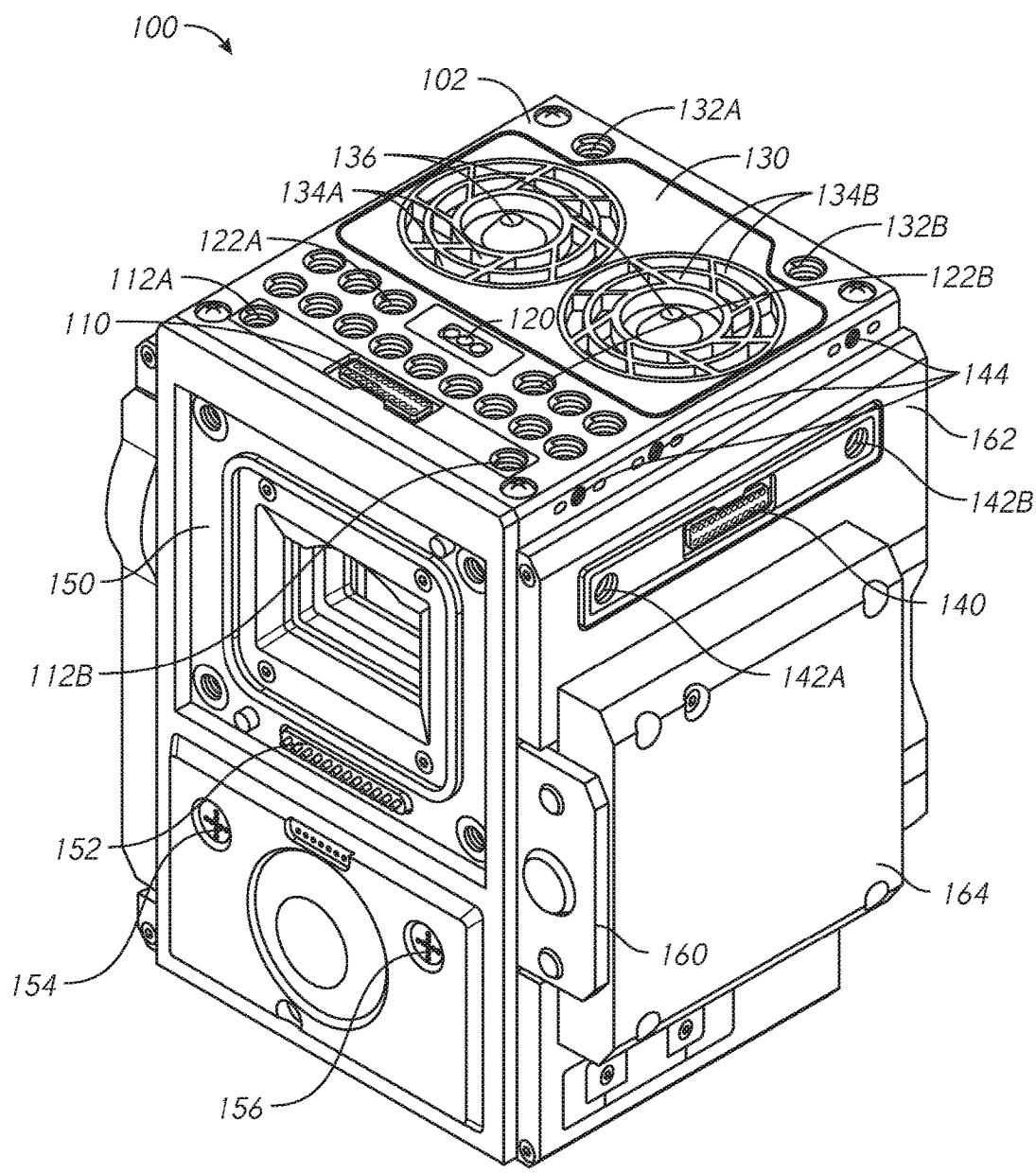
FIG. 1A is a perspective view of a front of an example brain module of a modular camera system.
Figure 1B:
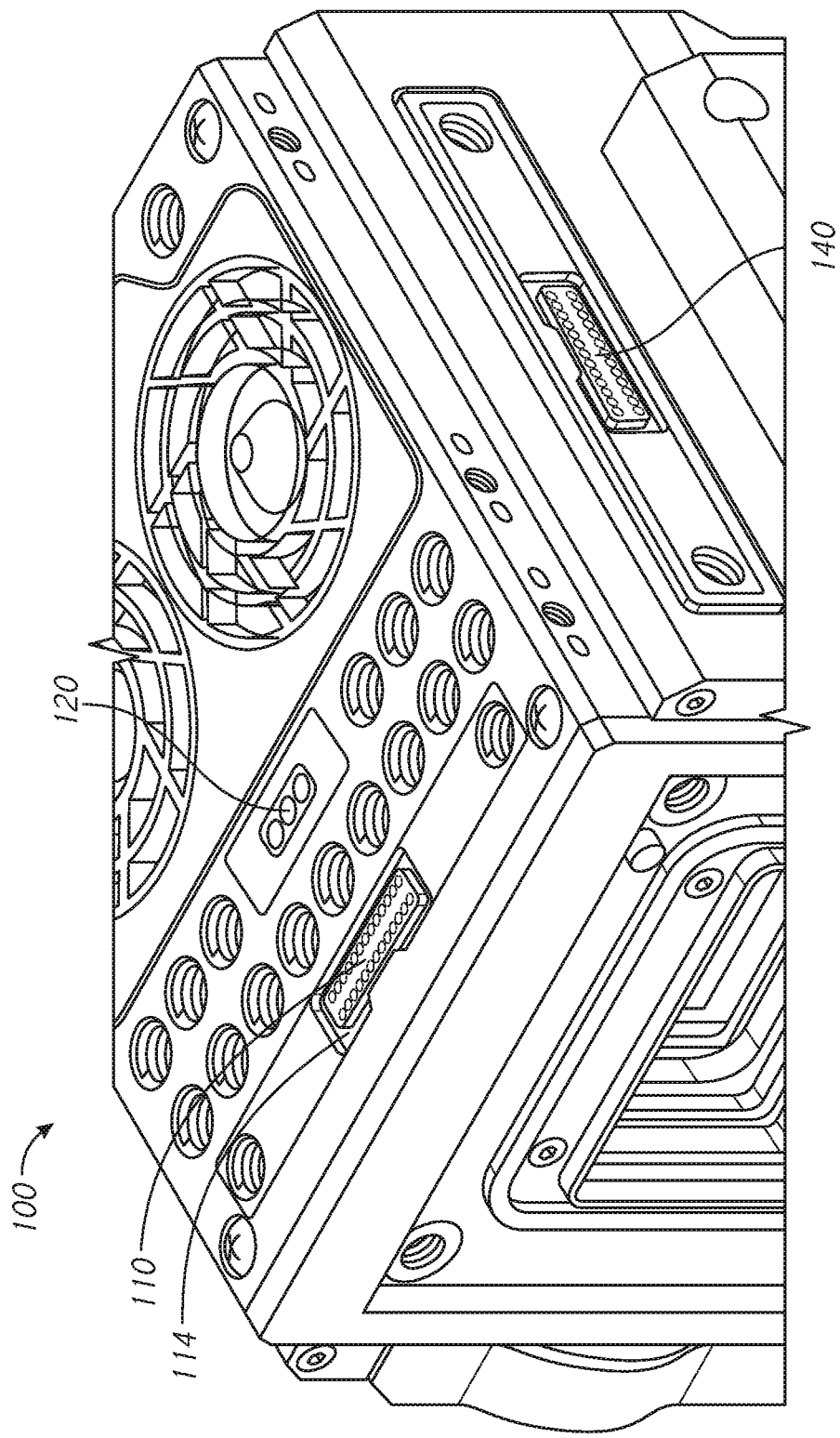
FIG. 1B is a magnified perspective view of the front of the brain module of FIG. 1A.
Figure 1C:
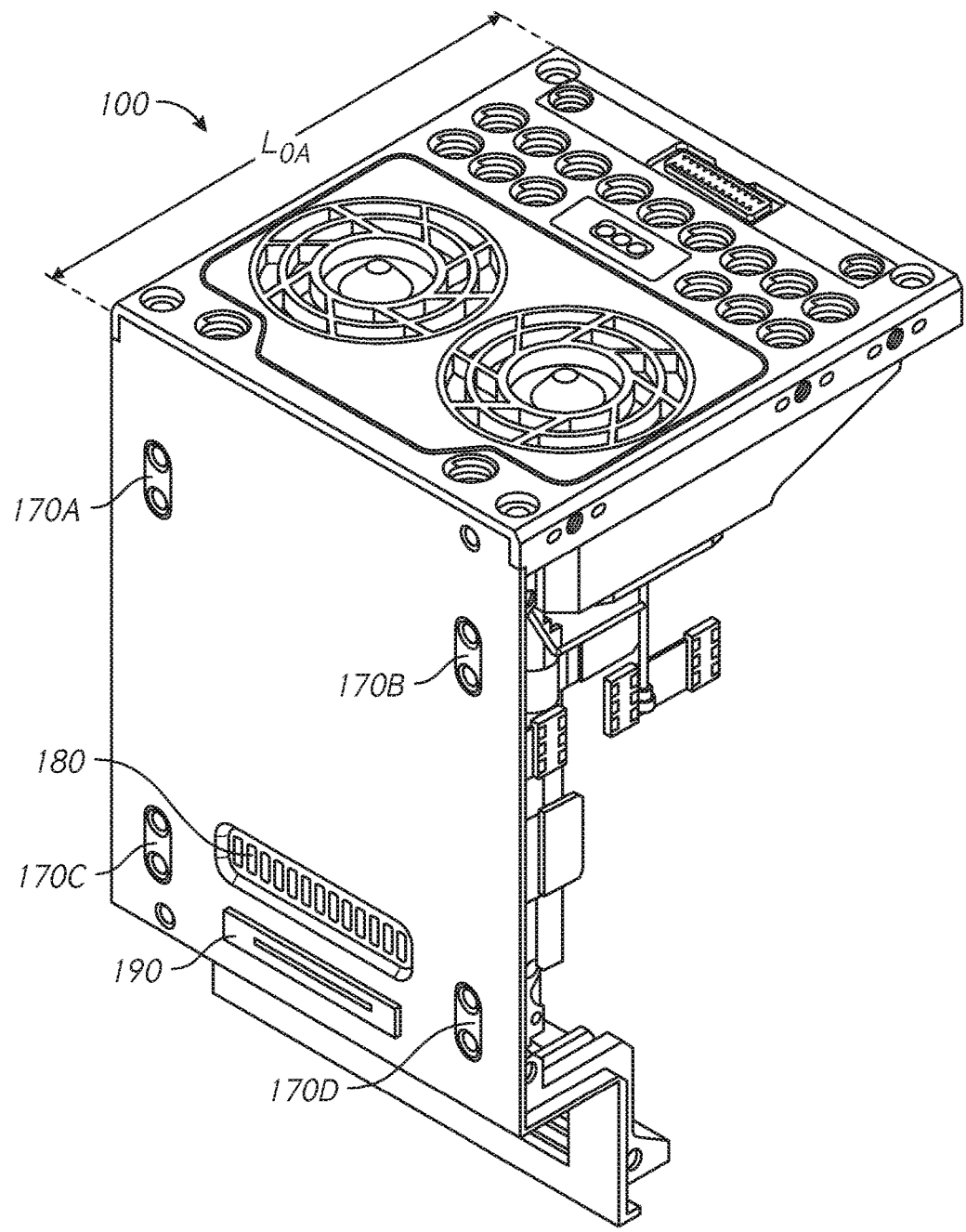
FIG. 1C is a perspective view of a back of the brain module of FIG. 1A.

FIG. 1A is a perspective view of a front of a brain module 100 of a modular camera system. The brain module 100 can include at least one image sensor (not shown) and at least one processor (not shown), as well as a housing 102 (sometimes referred to as a body) that contains and supports the components of the brain module 100. The housing 102 can be at least partially made of carbon fiber. Although the brain module 100 can have the particular dimensions and connection types as illustrated in FIGS. 1A-1C, the brain module 100 may have a variety of other physical dimensions, mechanical connection types, or electrical connection types in other implementations.

The image sensor can be contained within the housing 102 and include any of a variety of video sensing devices, including, for example, CCD, CMOS, vertically stacked CMOS devices such as the FOVEON® sensor, or a multi-sensor array using a prism to divide light between the sensors. The image sensor can generate image data corresponding to light incident on the image sensor. The processor can control operations of the components of the brain module 100, process the image data generated by the image sensor, and receive user inputs for influencing the control operations of the processor.

The housing 102 can include one or more top surface interfaces for mechanically or electrically coupling one or more modules to a top of the housing 102. One of the top surface mounting interfaces can include a first module connector 110 and mounting holes 112A, 112B for electrically and mechanically coupling a module, such as a display module (for instance, a liquid-crystal display (LCD) screen), to the top of the housing 102. Another of the top surface mounting interfaces can include a second module connector 120 and mounting holes 122A, 122B (as well as the other unlabeled mounting holes in the same row or neighboring row) for electrically and mechanically coupling a module, such as a handle module or outrigger module, to the top of the housing 102. Yet another of the top surface mounting interfaces can include mounting holes 132A, 132B for mechanically mounting a module to the top of the housing 102 proximate to a fan cover 130 on the top of the housing 102. The mounting holes 112A, 112B, 122A, 122B, 132A, 132B can, for instance, include threads to receive screws of modules to secure the modules to the housing 102 and then release the screws for removing the modules from the housing 102.

The housing 102 can include one or more side surface mounting interfaces for mechanically or electrically coupling one or more modules to a side of the housing 102. One of the side surface mounting interfaces can include a third module connector 140 and mounting holes 142A, 142B for electrically and mechanically coupling a module, such as a display module (for instance, a LCD display screen), to the side of the housing 102. In addition, another of the side surface mounting interfaces can include mounting holes 144 for mechanically coupling a module to the side of the housing 102.

FIG. 1B provides a view of certain interfaces of the housing 102, including the first, second, and third module connectors 110, 120, 140. Although specific structures for the first, second, and third module connectors 110, 120, 140 are illustrated in FIG. 1B, other connector structures can be used in other embodiments.

As shown in FIG. 1B, the first module connector 110 can include multiple electrical conductors (for instance, twenty-six electrical conductors as illustrated) and a conductor supporting member that surrounds and supports the multiple electrical conductors. The multiple electrical conductors can be positioned in one or more conductor rows (for instance, two rows as illustrated) within the conductor supporting member. The exposed surface of the first module connector 110 can be a flat surface (or substantially so) such that the exposed ends of the multiple electrical conductors and the exposed end of the conductor supporting member can be flush with or parallel to (or substantially so) each other, as well as flush with or parallel to (or substantially so) a surface of the top of the housing 102. The ends of the multiple electrical conductors can be exposed while the sides of the multiple electrical conductors may be covered by the conductor supporting member and not exposed. The multiple electrical conductors may be fixed in the conductor supporting member, so the ends of the multiple electrical conductors may not move when a module is mechanically coupled to the first module connector 110. The first module connector 110 can be at least partly surrounded by a channel 114 in the surface of the top of the housing 102 that can assist in alignment and improve the robustness of a connection of a module to the first module connector 110. In some embodiments, at least some of the multiple electrical conductors can be configured to carry differential signals; for example, data can be conveyed as a difference between signals carried by two different conductors.

In some embodiments, the housing 102 may not include a cover that covers or protects the first module connector 110 because the first module connector 110 can be a robust connector not susceptible to damage, wearing out, or collecting dirt or lint. The first module connector 110 can be a structure that does not include one or more of (i) small spaces or holes which tend to collect dirt or lint, (ii) projections which are susceptible to damage or breaking off, and (iii) moving parts which can lock up, deform, or come apart. The first module connector 110 can have a structure similar to or the same as a structure of the third module connector 140. As with the first module connector 110, in some embodiments, the housing 102 may not include a cover that covers or protects the third module connector 140 because the third module connector 140 can be a robust connector not susceptible to damage, wearing out, or collecting dirt or lint. The third module connector 140 can be a structure that does not include one or more of (i) small spaces or holes which tend to collect dirt or lint, (ii) projections which are susceptible to damage or breaking off, and (iii) moving parts which can lock up, deform, or come apart.

The second module connector 120 can include multiple electrical conductors (for instance, three electrical conductors as illustrated) and a conductor supporting member that surrounds and supports the multiple electrical conductors. The multiple electrical conductors can be positioned in one or more conductor rows (for instance, one row as illustrated) within the conductor supporting member. The exposed surface of the second module connector 120 can be a flat surface (or substantially so) such that the exposed ends of the multiple electrical conductors and the exposed end of the conductor supporting member can be flush with or parallel to (or substantially so) each other, as well as flush with or parallel to (or substantially so) the surface of the top of the housing 102. In some embodiments, the exposed surface of the second module connector 120 can be recessed relative to the top of the housing 102. The ends of the multiple electrical conductors can be exposed while the sides of the multiple electrical conductors may be covered by the conductor supporting member and not exposed. The multiple electrical conductors may be fixed in the conductor supporting member, so the ends of the multiple electrical conductors may not move when a module may be mechanically coupled to the second module connector 120. In some embodiments, the housing 102 may not include a cover that covers or protects the second module connector 120 because the second module connector 120 can be a robust connector not susceptible to damage, wearing out, or collecting dirt or lint. The second module connector 120 can be a structure that does not include one or more of (i) small spaces or holes which tend to collect dirt or lint, (ii) projections which are susceptible to damage or breaking off, and (iii) moving parts which can lock up, deform, or come apart.

One or more of the multiple electrical conductors of the first, second, and third module connectors 110, 120, 140 can be electrically coupled to the processor of the brain module 100, a power supply of the brain module 100, or an electrical ground of the brain module 100. The processor of the brain module 100 can thereby provide data or control instructions to the modules via the first, second, and third module connectors 110, 120, 140, as well as receive data and user inputs from the modules. The brain module 100 can further receive or supply power to the modules via the first, second, and third module connectors 110, 120, 140.

Referring again to FIG. 1A, the fan cover 130 on the top of the housing 102 can provide a cover for a fan duct area in which one or more fans (for instance, two fans) can be positioned to cool the inside of the brain module 100 during operation, such as to cool the image sensor, processor, and other electronic components within the housing 102.

The brain module 100 can include one or more intake fans or one or more exhaust fans. For example, one or more intake fans can be positioned proximate an input (sometimes referred to as an air intake port) of a cooling path of the brain module 100, and the one or more intake fans can oriented within the housing 102 to direct relatively cool ambient air from outside the housing 102 into the housing 102 through one or more intake openings 134A, 134B in an intake grill 136 of the fan cover 130. At least one of the openings 134A, 134B can be positioned above the one or more intake fans or otherwise be positioned relative to the one or more intake fans such that an airflow path of the one or more intake fans includes at least one of the intake openings 134A, 134B. For example, one or more exhaust fans can be positioned proximate an output (sometimes referred to as an air exhaust port) of the cooling path of the brain module 100, and oriented within the housing 102 to direct relatively warm air (for example, air heated by electronic components within the housing 102) out of the housing 102 via one or more exhaust openings, such as one or more exhaust openings 192 in an exhaust grill 191 of the back, bottom of the brain module 100 illustrated in FIG. 1D. At least one of the exhaust openings can be positioned behind the one or more exhaust fans or otherwise be positioned relative to the one or more exhaust fans such that an airflow path of the one or more exhaust fans includes at least one of the exhaust openings.

In some implementations, the brain module 100 may include one or more intake fans and not include one or more exhaust fans, or the brain module 100 may include one or more exhaust fans and not include one or more intake fans. For example, the brain module 100 can include two intake fans positioned directly beneath the fan cover 130 and may not include any exhaust fans. As another example, the brain module 100 can include two intake fans positioned directly beneath the fan cover 130 and two exhaust fans positioned directly behind the exhaust grill 191. In yet another example, the brain module 100 can include one or more intake or exhausts fans positioned near one or more sides of the housing 102 other than a side (for instance, a front of the housing 102) where an integrated microphone of the brain module 100 is positioned. Thus, fan noise generated by the one or more intake or exhausts fans can less significantly impact sound picked up by the integrated microphone.

As used herein, the term "side," in addition to having its ordinary meaning, can denote an area or portion of the housing 102 in or on one half or less of the housing 102. For example, the fan grill 130 and the fan housing 710 can be considered to be in a top side and a rear side of the housing 102. As another example, the first microphone 154 and the second microphone 156 can be considered to be in a bottom side and a front side of the housing 102. As yet another example, the image sensor 158 can be considered to be in the top side and the front side.

The fan duct area can extend from the one or more intake openings 134A, 134B to the one or more exhaust openings 192. The fan duct area can include one or more heat sinks or one or more heat pipe assemblies coupled to one or more components within the brain module 100 to assist with the removal of heat from the one or more components. Moreover, one or more sensors can be positioned within the fan duct area to measure the temperature of individual components within the brain module 100 or the ambient temperature at certain locations with the fan duct area. Temperature measurements taken by the one or more sensors can be used to influence or control the air flow in the fan duct area by adjusting, for instance, a speed of one or more fans in the fan duct area, directly/indirectly adjusting the operating activities of the one or more components, or activating another cooling component. Ambient temperature measurements can be used, in some instances, alone or in conjunction with one or more other temperature measurements because ambient temperature measurements may be less susceptible to transients than temperature measurements taken near one or more components within the brain module 100.

In some implementations, the fan duct area can include multiple, different air flow paths (sometimes referred to a multiple, separated chambers). The multiple air flow paths can be separated, for instance, at least in part using one or more walls that isolate or limit the flow of air or heat from one air flow path to one or more or all other air flow paths of the multiple air flow paths. In one example, at least one of the one or more walls can be a plastic low conductivity wall. The size of individual air flow paths of the multiple air flow paths can additionally differ from one another, and the speed or temperature of the air in the individual air flow paths of the multiple air flow paths can differ from one another. An individual air flow path of the multiple air flow paths can include one or more intake fans or one or more exhaust fans to move air within the individual air flow path and to vary or control the flow of air and temperature of the individual air flow path. One or more components within the brain module 100 (for example, circuit boards, integrated circuits, sensors, or the like) can be positioned within particular individual air flow paths of the multiple to enable better or individual control of the cooling of the one or more components within the brain module 100. In some embodiments, users of the brain module 100 may directly or indirectly set or control the level of activity of fans within the fan duct area rather than utilizing an automatic fan control provided by the brain module 100.

The fan duct area can desirably include the multiple, different air flow paths, in certain embodiments, because the one or more components can have different temperature tolerances or may generate different amounts of heat at different times. Individual components of the one or more components thus may benefit from different temperature management approaches. In one example, an image signal processor may be more sensitive to temperature variations than an input/output processor used to manage input or output communications for the brain module 100. Thus, in some embodiments, the image signal processor can be cooled using an air flow path different from the air flow path used to cool the input/output processor so that the temperature of the image signal processor may be allowed to vary less than the temperature of the input/output processor. Moreover, at a particular time, the image signal processor may be operating so as to generate more heat than an amount of heat the image signal processor generates on average, and the input/output processor can be operating so as to generate less heat than an amount of heat the input/output processor generates on average. As a result, the image signal processor may benefit from a greater air flow and cooling at the particular time while the input/output processor may not benefit from the greater air flow and cooling at the particular time. Advantageously, in certain embodiments, by controlling cooling of different components using different air flow paths, the activity of fans used to control the air flow in the paths can be reduced, enabling the brain module 100 to generate less fan noise while operating. Moreover, in some instances, one or more components or an associated heat sink or heat pipe assembly (sometimes referred to as a heat exchanger) can be cooled using the air flow from two or more of the multiple air flow paths.

In some embodiments, one or more components within the brain module 100 (or an associated heat sink or heat pipe assembly used to cool the one or more components) can be positioned farther down an air flow path within the fan duct area than one or more other components. A component having a higher temperature variation tolerance can, for instance, be placed farther down an air flow path than another component that has a lower temperature variation tolerance. As a result, the various components within the brain module 100 may maintain the various components within the acceptable temperature tolerances while using less fan activity than may be otherwise utilized in other configurations. The reduced fan activity can desirable reduce an amount of fan noise generated by the brain module 100 while operating. In one example implementation, the input/output processor of the brain module 100 can be placed farther down an air flow path than the heat pipe assembly used to cool the image sensor of the brain module 100.

The fan cover 130 can be composed entirely of plastic (or some other dielectric, non-conductive, or non-metallic material), or entirely of metal in some implementations. The fan cover 130 can have other compositions in other implementations.

An antenna (not shown) can also be integrated within the brain module 100. The antenna can be positioned within the fan duct area. For example, the antenna can be positioned within a fan support structure (for instance, within the fan cover 130 and a fan housing 710 described with respect to FIG. 7A) located in the fan duct area. The antenna may furthermore be positioned such that the antenna may not diminish air flow in the fan duct area. The antenna can be electrically coupled to one or more components of the brain module 100, such as the processor, to enable the one or more components of the brain module 100 to wirelessly communicate (for example, at a frequency range of about 2.4 GHz to about 2.5 GHz and within a local area network, such as by using a Wi-Fi™ compliant communications) with other devices (for example, smart phones, tablets, personal computers, or the like) in the vicinity of the brain module 100 or with modules coupled to brain module 100. The placement of the antenna within the fan duct area can advantageously, in certain embodiments, reduce the size of the brain module 100 form factor or conserve space within the brain module 100 because the fan duct area may utilize a set amount of space without the antenna and the antenna may be included in the fan duct area without increasing the set amount of space utilized by the fan duct area.

Inclusion of the antenna within the housing 102 may not only reduce the form factor but also prevent damage to the antenna that can occur when the antenna may be externally mounted or otherwise protrude from the housing 102, such as damage by snagging of the antenna, due to dropping or the camera, or the like. The antenna further may be partially or completely hidden when viewing the housing 102 such that the visual impact of the antenna on the appearance of the brain module 100 can be reduced or removed.

Moreover, including the antenna in the fan duct area can desirably, in particular embodiments, provide a location for the antenna that minimizes or reduces an amount of interference caused by other components of the brain module 100 on the wireless communications of the antenna. For instance, openings formed in the intake grill 136, such as the first and second openings 134A, 134B shown in the illustrated embodiment, may reduce electrical interference as compared to a configuration where the antenna is contained within the housing 102 without such openings being positioned proximate the antenna. Moreover, as discussed, the fan cover 130 or a portion thereof can be made of plastic or other non-conductive material, which can reduce electrical interference. In some embodiments, for example, at least the grill portion of the fan cover 130 is made of plastic, rubber, or some other non-conductive, non-metallic material. In various implementations, at least a portion of the fan cover 130 positioned above the antenna may be made of such a material.

The housing 102 can include a lens mount module interface 150 and a lens connector 152 on a front of the housing 102. The lens mount module interface 150 can include multiple mounting holes, as well as other mounting or alignment structures, and be used to mount a lens or lens mount module to the brain module 100, for instance, as described with respect to FIG. 6A. One or more of multiple electrical conductors of the lens connector 152 can be electrically coupled to the processor of the brain module 100, a power supply of the brain module 100, or an electrical ground of the brain module 100. The processor of the brain module 100 can thereby provide or receive data or control instructions via the lens connector 152. The brain module 100 can further receive or supply power via the lens connector 152. Light can enter the brain module 100 via the lens mount module interface 150, and the light can be received by the image sensor 158 of the brain module 100 (see e.g., FIG. 7D), which can generate image data corresponding to the received light. The image sensor can have a size that is substantially the same size as the hole in the front of the housing 102 through which the light is received by the image sensor 158. The image sensor 158 can be positioned behind and at substantially a common height level (e.g., in a top side of the housing 102 and at around ¼ or ⅓ of the way down the housing 102 from the top of the housing 102) as the hole in the front of the housing 102 that the lens mount module interface 150 surrounds and through which the light enters the housing 102.

The housing 102 can include a first microphone 154 and a second microphone 156 in the front of the housing 102. The first microphone 154 and the second microphone 156 can be configured to detect sounds for recordation and storage. The first microphone 154 and the second microphone 156 can each include a microphone cover (sometimes referred to as a microphone grill or perforated grill) and an acoustic sensor that generates an electric signal responsive to detected sounds. The first microphone 154 and the second microphone 156 can together be used as integrated dual channel digital stereo microphones and to, for example, record uncompressed, 24-bit 48 kHz audio data. The first microphone 154 and the second microphone 156 can thus be positioned at a height level below the image sensor 158, and the image sensor 158 can, in turn, be positioned at a height level below the fan cover 130 and the fan housing 710.

The front of the housing 102 can include user inputs 160 that enable a user to control or influence operations (for example, start/stop recording or set user) of one or more components of the brain module 100. Although the user inputs 160 are illustrated as buttons, one or more other types of input components (for example, dials, switches, keypads, and the like) can be used to receive an input from a user of the brain module 100. The user inputs 160 in the illustrated embodiment form part of the side panel 162 of the housing 102. In particular, the side panel 162 includes a protruding portion 164, and the user inputs 160 can be positioned on a first side of the protruding portion 164, perpendicular to a side surface of the protruding portion 164. Although not visible in FIG. 1A, at least one memory card slot can be provided on a second side of the protruding portion 164 opposite the first side. The memory card slot can releasably retain any type of appropriate recording medium, including, without limitation a solid state disk ("SSD"), a compact flash ("CF") memory card, or the like. The memory device retained within the memory card can record video image data generated by the brain module 100, including compressed raw video data, or other video data, at any of the resolutions and frame rates recited herein. In some embodiments, the side panel 162 can be removable from the brain module 100 or upgradeable. For instance, in some implementations, the illustrated side panel 162 may be compatible with a first type of memory device, and can be swapped out for a different side panel that may be compatible with a second type of memory device.

The brain module 100 may deliver any of a variety of desired performance characteristics. For example, light received by the image sensor may be converted into raw digital image data at a rate of at least about 23 frames per second (fps), wherein the raw data is compressed and recorded at a rate of at least about 23 (fps) into the recording module 120. In various embodiments, frame rates of from about 1 fps to about 250 fps or more can be achieved. For example, the frame rate may depend on the resolution setting. In some embodiments, the brain module 100 is configured for frame rates of from between about 1 fps and about 100 fps in a "5 k" resolution mode, from about 1 and about 125 fps in a "4 k" resolution mode, from about 1 and about 125 fps in a quad HD mode, from about 1 and about 160 fps in a "3 k" resolution mode, and from about 1 and about 250 fps in a "2 k" resolution mode. Possible frame rates include, e.g., frame rates of greater than 12, as well as frame rates of 20, 23.976, 24, 30, 60, and 120 frames per second, or other frame rates between these frame rates or greater. The brain module 100 can further perform many types of compression processes on the image data from the image sensor.

The brain module 100 can output video at "2 k" (e.g., 16:9 (2048×1152 pixels), 2:1 (2048×1024 pixels), etc.), "3 k" (e.g., 16:9 (3072×1728 pixels), 2:1 (3072×1536 pixels), etc.), "4 k" (e.g., 4096×2540 pixels, 16:9 (4096×2304 pixels), 2:1 (4096×2048), etc.), "4.5 k" horizontal resolution, Quad HD (e.g., 3840×2160 pixels), "5 k" (e.g., 5120×2700) horizontal resolution, "6 k" (e.g., 6144×3160), "8 k" (e.g., 7680×4320), or greater resolutions. In some embodiments, the brain module 100 can be configured to record or output compressed raw image data (or other image data) having a horizontal resolution of between at least any of the above-recited resolutions. In further embodiments, the resolution is between at least one of the aforementioned values (or some value between the aforementioned values) and about 6.5 k, 7 k, 8 k, 9 k, or 10 k, or some value therebetween). As used herein, in the terms expressed in the format of xk (such as 2 k and 4 k noted above), the "x" quantity refers to the approximate horizontal resolution. As such, "4 k" resolution corresponds to about 4000 or more horizontal pixels and "2 k" corresponds to about 2000 or more pixels. Moreover, the brain module 100 according to various implementations can output or record digital motion video image data at any of the above-recited resolutions at any of the frame rates recited in the previous paragraph or otherwise herein. Some examples of compressed raw data compression systems and methods compatible with the embodiments described herein are provided in U.S. Patent Application Publication No. 2014/0226036, titled "VIDEO CAMERA," which is incorporated by reference in its entirety herein.

The image sensor can range from as small as about 0.5" (8 mm), ⅔", S35 (cine), 35 mm full frame still and 645, but it can be at least about 1.0 inches, 6 cm×17 cm or larger. In one series of brain modules, sensors are contemplated having sizes of at least about 10.1×5.35 mm; 24.4×13.7 mm; 30×15 mm; 36×24 mm; 56×42 mm and 186×56 mm. Additionally, the image sensor can be configured to provide variable resolution by selectively outputting only a predetermined portion of the sensor. The image sensor can, for example, include a Bayer pattern filter. As such, the image sensor, by way of its chipset (not shown) outputs data representing magnitudes of red, green, or blue light detected by individual photocells of the image sensor.

FIG. 1C provides a perspective view of a back of the housing 102. The back of the housing 102 can be opposite the front of the housing 102, and the side of the housing 102 marked as cut away in FIG. 1C can be opposite the side of the housing 102 shown in FIG. 1A that includes the third module connector 140. The back of the housing 102 can include one or more back surface mounting interfaces for mechanically or electrically coupling one or more modules to the back of the housing 102. One of the back surface mounting interfaces can include holes and notches 170A-D usable to releasably mechanically mount one or more modules, such as a port extender module or power module, to the back of the housing 102. Another of the back surface mounting interfaces can include a fourth module connector 180 for electrically and mechanically coupling a module to the back of the housing 102. Yet another of the back surface mounting interfaces can include a fifth module connector 190 for electrically and mechanically coupling a module to the back of the housing 102.

The fourth module connector 180 can include multiple electrical conductors (for instance, thirteen electrical conductors as illustrated) and a conductor supporting member that surrounds and supports the multiple electrical conductors. The multiple electrical conductors can be positioned in one or more conductor rows (for instance, one row as illustrated) within the conductor supporting member. The exposed surface of the fourth module connector 180 can be a flat surface (or substantially so) such that the exposed ends of the multiple electrical conductors and the exposed end of the conductor supporting member can be flush with or parallel to (or substantially so) each other, as well as flush with or parallel to (or substantially so) the surface of the top of the housing 102. In some embodiments, the exposed surface of the fourth module connector 180 can be recessed relative to the top of the housing 102. The ends of the multiple electrical conductors can be exposed while the sides of the multiple electrical conductors may be covered by the conductor supporting member and not exposed. The multiple electrical conductors may be fixed in the conductor supporting member, so the ends of the multiple electrical conductors may not move when a module may be mechanically coupled to the fourth module connector 180. In some embodiments, the housing 102 may not include a cover that covers or protects the fourth module connector 180 because the fourth module connector 180 can be a robust connector not susceptible to damage, wearing out, or collecting dirt of lint. The fourth module connector 180 can be a structure that does not include one or more of (i) small spaces or holes which tend to collect dirt or lint, (ii) projections which are susceptible to damage or breaking off, and (iii) moving parts which can lock up, deform, or come apart.

The fifth module connector 190 can include multiple electrical conductors and a conductor supporting member that surrounds and supports the multiple electrical conductors. The multiple electrical conductors can be positioned in one or more conductor rows within the conductor supporting member. The fifth module connector 190 can be a Searay™ input/output connector in some embodiments. In other embodiments, fifth module connector 190 can be another type of connector.

One or more of the multiple electrical conductors of the fourth and fifth module connectors 180, 190 can be electrically coupled to the processor of the brain module 100, a power supply of the brain module 100, or an electrical ground of the brain module 100. The processor of the brain module 100 can thereby provide or receive data or control instructions via the fourth and fifth module connectors 180, 190. The brain module 100 can further receive or supply power to the modules via the fourth and fifth module connectors 180, 190. In some embodiments, the fourth module connector 180 can be configured to transmit power and not transmit data between the brain module 100 and a module, and the fifth module connector 190 can be configured to transmit power and data between the brain module 100 and a module. Moreover, in some embodiments, when the back of the housing 102 is coupled to certain modules, such as a power module, the fifth module connector 190 may remain unused and may not communicate with the certain modules because the certain module may not have a complementary module connector that couples to the fifth module connector 190.

Figure 1D:
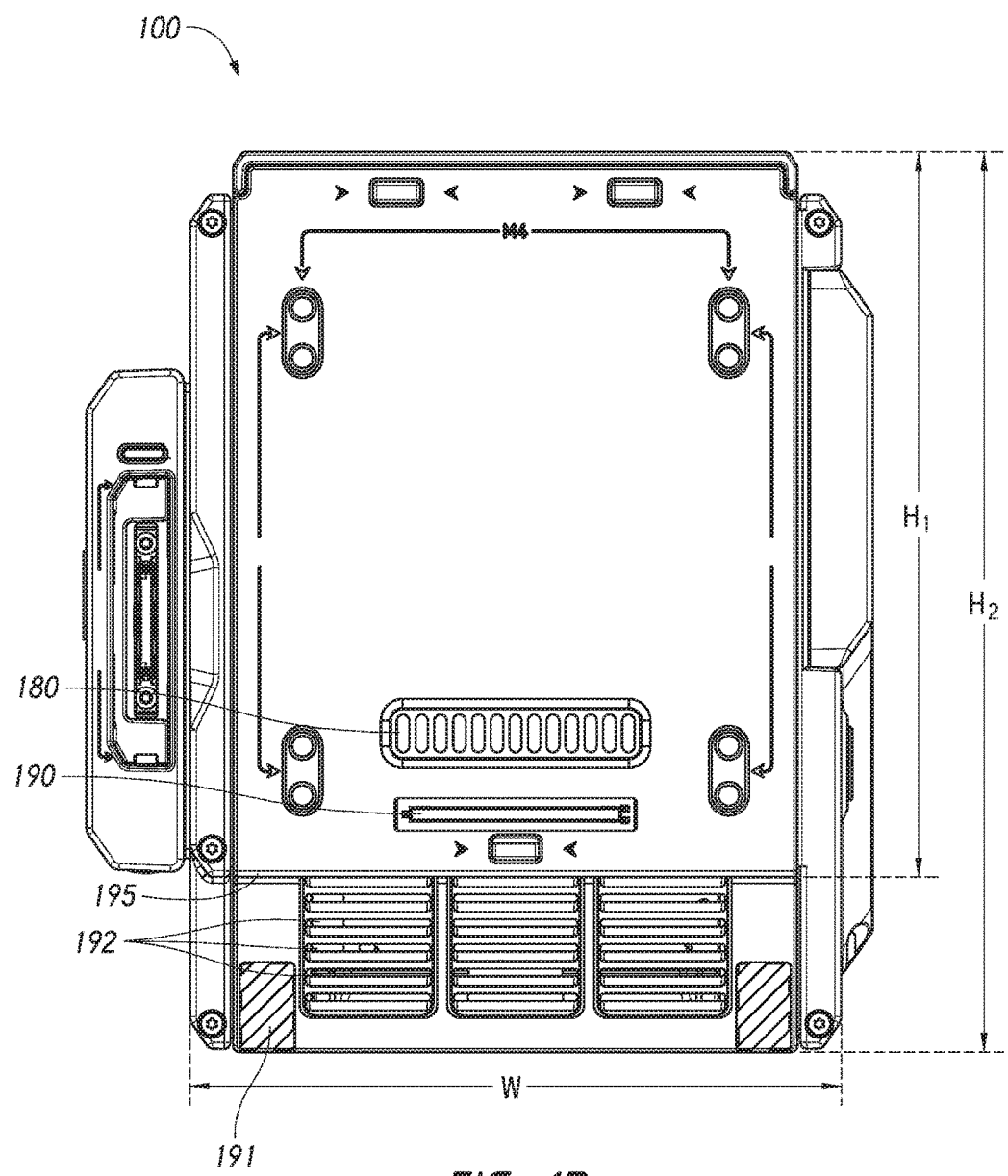
FIG. 1D is a view of a back of the brain module of FIG. 1A.

FIG. 1D is a view of the back of the housing 102. The bottom of the housing 102 can extend a width of W. As illustrated in illustrated in FIG. 1D, the width of the brain module 100 can further extend an additional width or inset an additional width at positions above the bottom of the housing 102, such as from edges of side covers of the housing 102 or from other positions along the sides of the housing 102. The housing 102 can have a height of $H_1$ from the top of the housing 102 to a ledge 195 on the back of the housing 102, and the housing 102 can have a height of $H_2$ from the top of the housing 102 to the bottom of the housing 102. The portion of the housing 102 underneath and below the ledge 195 and below the ledge can include the exhaust grill 191 with the one or more exhaust openings 192.

In some embodiments, the length of W can be within a range about 30 mm to about 200 mm, about 50 mm to about 150 mm, about 70 mm to about 130 mm, about 80 mm to 110 mm, or about 85 mm to about 95 mm. In one embodiment, the length of W can be about 90 mm. In some embodiments, the length of $H_1$ can be within a range about 30 mm to about 200 mm, about 50 mm to about 160 mm, about 80 mm to about 140 mm, about 100 mm to 130 mm, or about 110 mm to about 120 mm. In one embodiment, the length of $H_1$ can be about 116 mm. In some embodiments, the length of $H_2$ can be within a range about 40 mm to about 250 mm, about 60 mm to about 210 mm, about 80 mm to about 180 mm, about 120 mm to 160 mm, or about 140 mm to about 150 mm. In one embodiment, the length of $H_2$ can be about 144 mm.

Figure 1E:
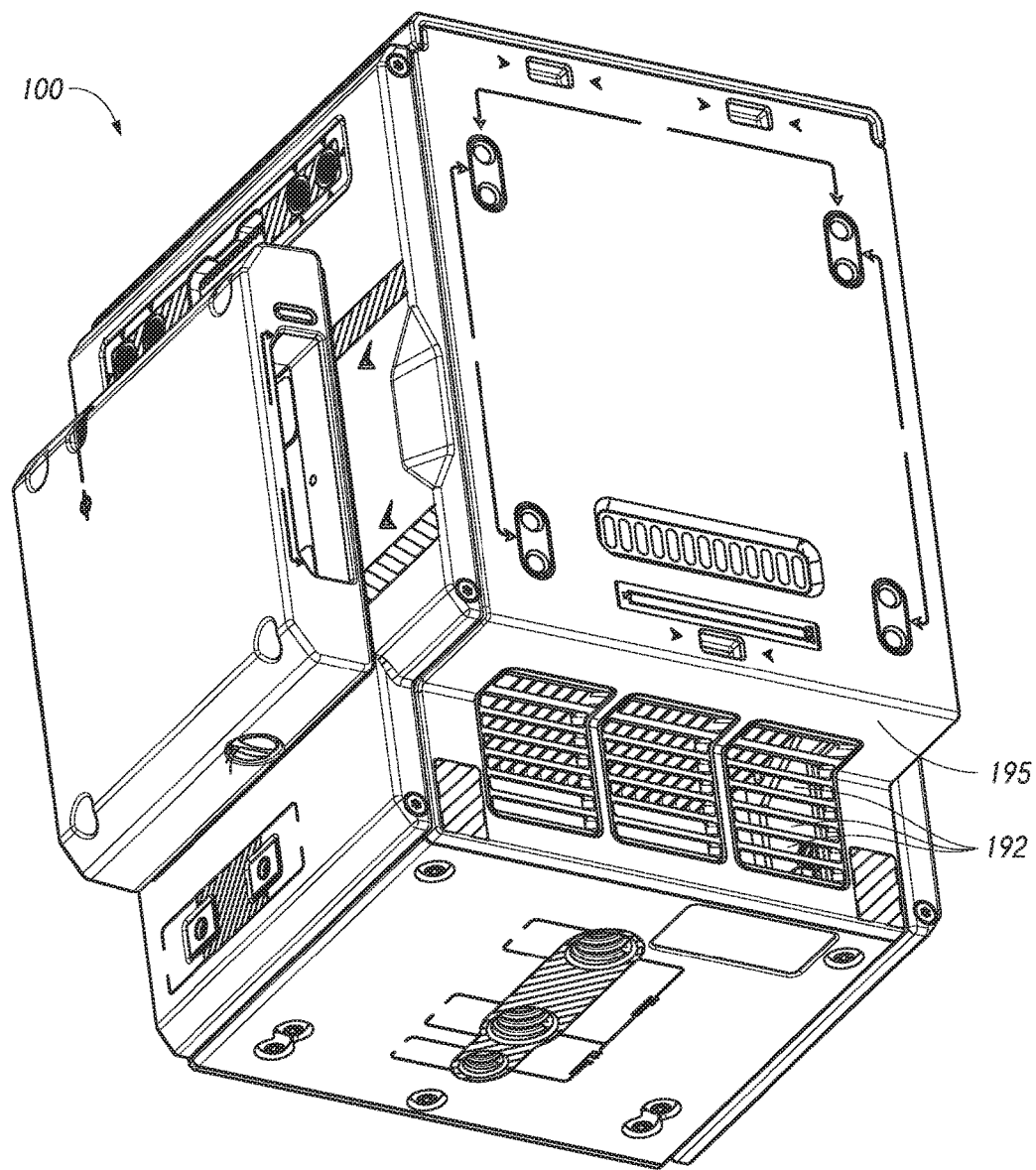
FIG. 1E is a magnified perspective view of a back bottom corner of the brain module of FIG. 1A.

FIG. 1E illustrates an example structure for a back, bottom of the housing 102. As can be seen in FIG. 1E, the one or more exhaust openings 192 can extend near a bottom of the back of the housing 102 and extend along and underneath the ledge 195.

Figure 1F:
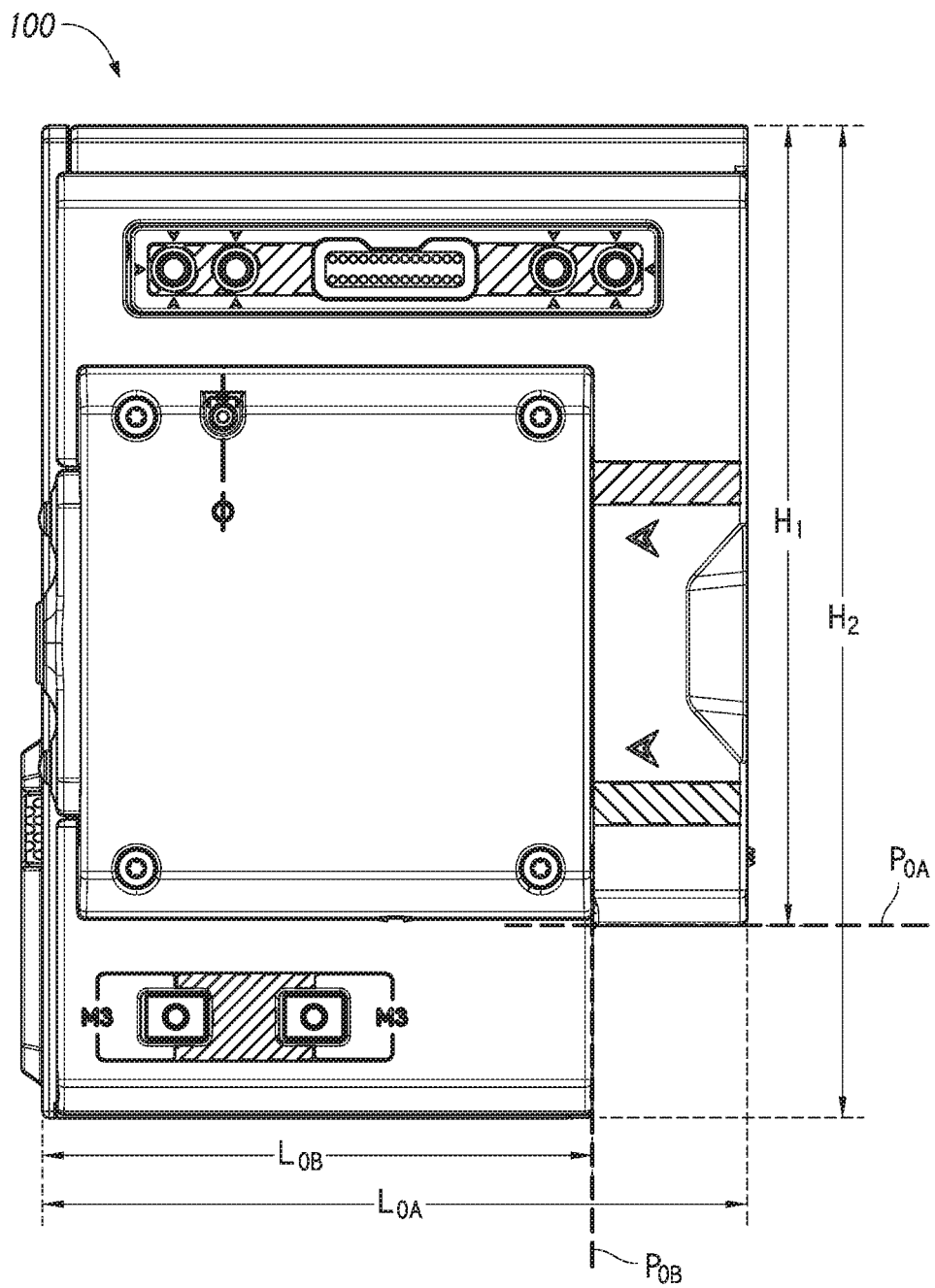
FIG. 1F is a view of a right side of the brain module of FIG. 1A.

FIG. 1F is a view of a right side of the housing 102. The housing 102 can have the height of $H_1$ from the top of the housing 102 to the ledge 195 on the back of the housing 102. The back of the housing 102 can be inset at the ledge 195 and define a plane $P_{OA}$. The plane $P_{OA}$ can, for example, be perpendicular to the back of the housing 102 or may instead intersect the back of the housing 102 at another angle such as 15°, 30°, 45°, 60°, 75°, 105°, 120°, 145°, 160°, or 175°, or some angle therebetween. The housing 102 can have a length of $L_{OB}$ from the front of the housing 102 to end of the ledge 195 and have a length of $L_{OA}$ from the front of the housing 102 to the back of the housing 102. The bottom of the housing 102 can be inset at the end of the ledge 195 and define a plane $P_{OB}$. The plane $P_{OB}$ can, for example, be perpendicular to the bottom of the housing 102 or may instead intersect the bottom of the housing 102 at another angle such as 15°, 30°, 45°, 60°, 75°, 105°, 120°, 145°, 160°, or 175°, or some angle therebetween.

In some embodiments, the length of $L_{OB}$ can be within a range about 20 mm to about 200 mm, about 35 mm to about 150 mm, about 50 mm to about 120 mm, about 60 mm to 100 mm, or about 70 mm to about 90 mm. In one embodiment, the length of $H_1$ can be about 78 mm. In some embodiments, the length of $L_{OA}$ can be within a range about 30 mm to about 200 mm, about 50 mm to about 160 mm, about 70 mm to about 140 mm, about 80 mm to about 120 mm, or about 90 mm to about 110 mm. In one embodiment, the length of $H_1$ can be about 100 mm.

Figure 1G:
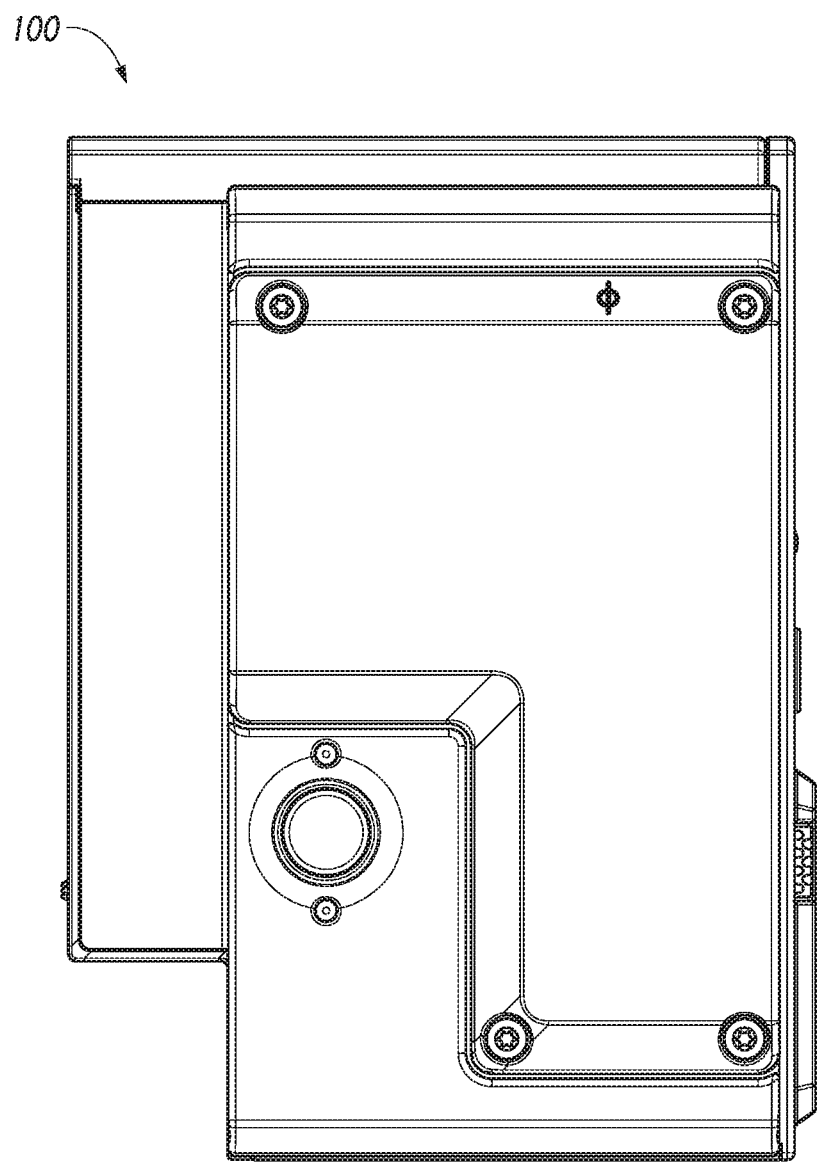
FIG. 1G is a view of a left side of the brain module of FIG. 1A.
Figure 1H:
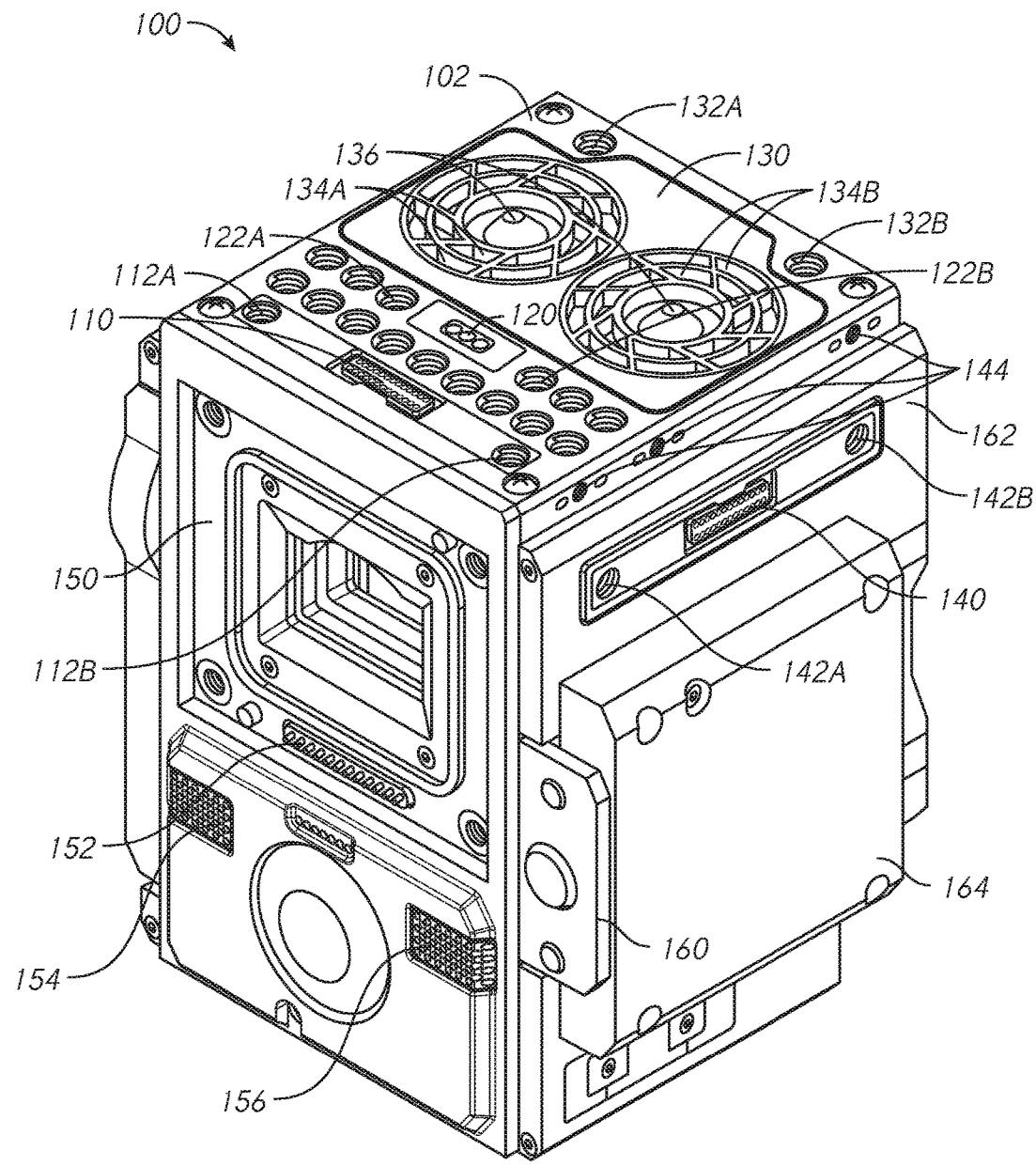
FIG. 1H is a perspective view of a front of another example brain module of a modular camera system.

FIG. 1G is a view of a left side of the brain module of FIG. 1A. FIG. 1H is a perspective view of the front of the brain module 100 where the microphone covers of the first microphone 154 and the second microphone 156 are illustrated as having alternative structures.

Figure 7A:
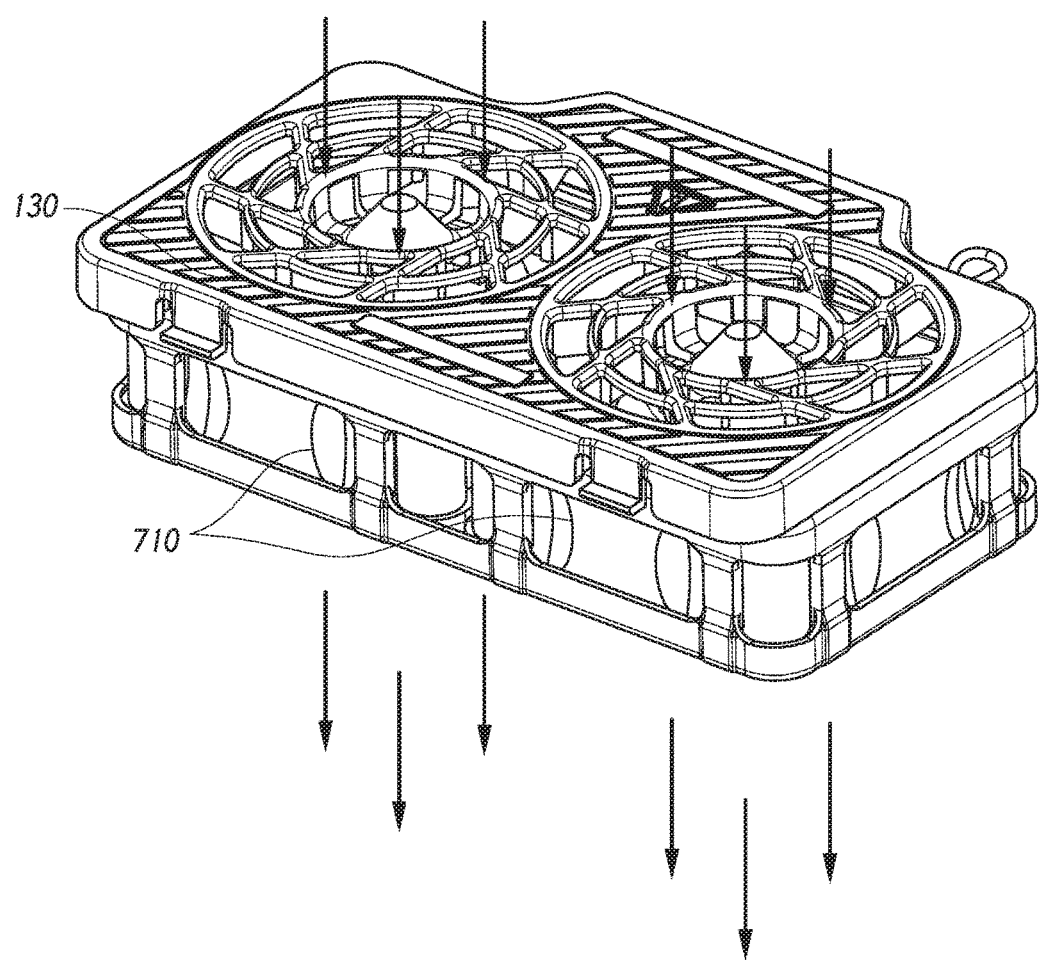
FIG. 7A is a perspective view of an example fan housing of the brain module of FIG. 1A.

FIG. 7A shows an example fan support structure of the brain module 100 of FIG. 1A that includes the fan cover 130 and the fan housing 710. The fan support structure can position fans in the fan housing 710 to direct air from a top of the fan housing 710 through one or more intake openings to a bottom of the fan housing 710 through one or more exhaust openings. The fan housing 710 can include circuitry and other components (not shown) within the fan housing 710 for driving one or more fan blades of the fans (not shown) within the fan housing 710, thereby moving the air through the fan housing 710. Although the illustrated structure includes two fans, the fan housing 710 can instead include one fan or can include three or more fans. The fan housing 710 can be positioned, for example, at one or more different locations along the fan duct area of the brain module 100 so as to influence or control the air flow in the fan duct area. Moreover, although the fan cover 130 and the fan housing 710 are labeled as separate components, the fan cover 130 and the fan housing 710 may be considered one structure so that the fan cover 130 can also refer to the fan housing 710 and the fan housing 710 can also refer to the fan cover 130.

Figure 7B:
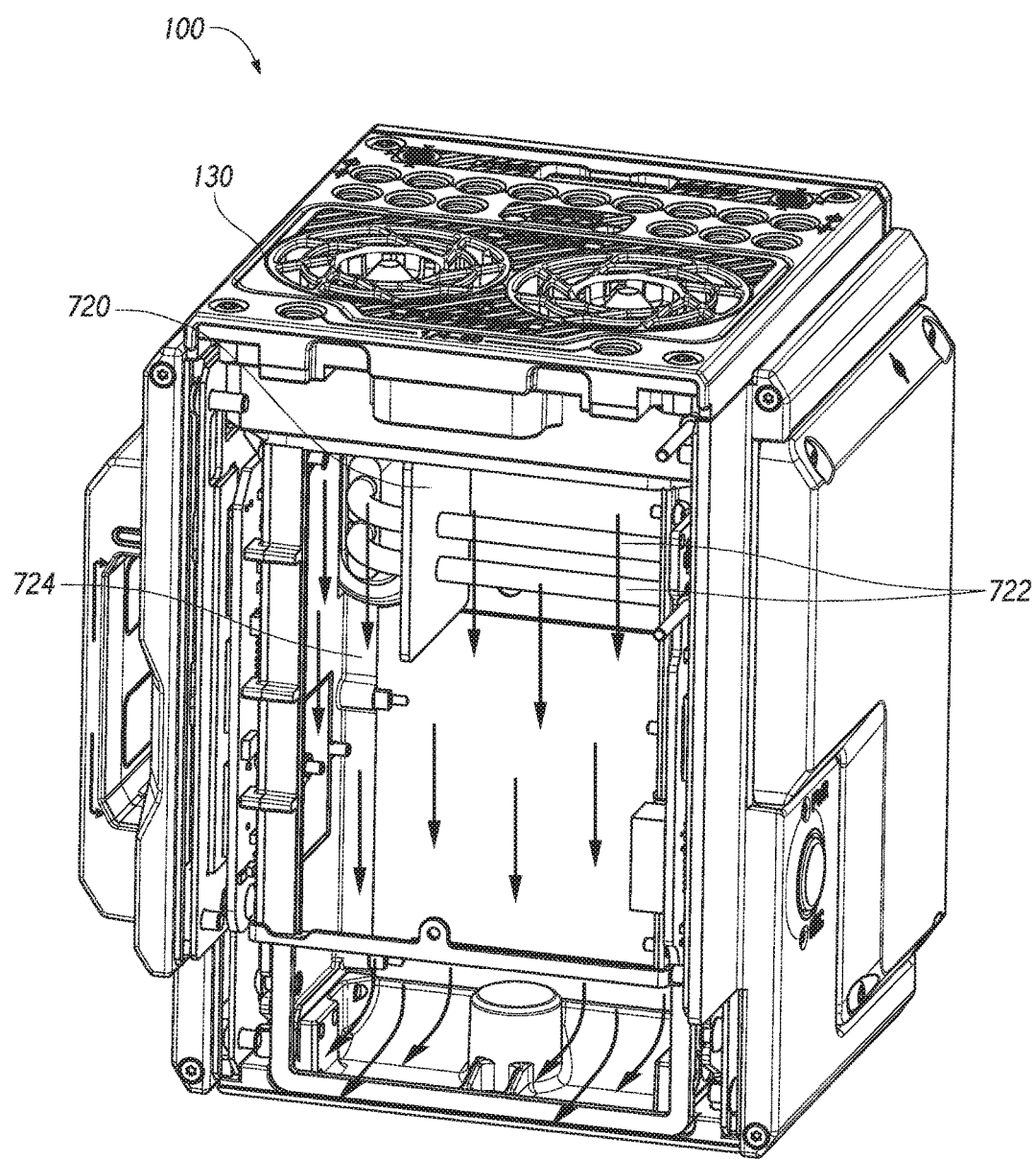
FIG. 7B is a perspective view of a back of the brain module of FIG. 1A depicting air flow within a chamber inside the brain module.

FIG. 7B depicts the back of the housing 102 with the back of the housing 102 removed, and an example air flow path through the fan duct area for cooling one or more components of the brain module 100. The fan duct area can extend from the top, back of the housing 102 to the bottom, back of the housing 102. The direction of the air flow in the fan duct area is illustrated by arrows. One or more components, one or more heat sinks associated with the one or more components, or one or more heat pipe assemblies associated with the one or more components, can be placed within or along the fan duct area to facilitate cooling of the one or more components.

As can be seen in FIG. 7B, air can initially enter the brain module 100 through the fan cover 130 in the top of the housing 102, proceed through a back chamber of the housing 102 separated from a front chamber of the housing by a first interior wall 724 (for example, a plastic low conductivity wall), and eventually exit the housing 102 through the bottom, back of the housing 102. In other implementations, one or more intake or exhaust fans can additionally or alternatively be placed in the back chamber at other positions. The one or more intake or exhaust fans can be positioned to direct air at the same angle as the one or more fans of the fan housing 710 or a different angle from the one or more fans of the fan housing 710. The different angle can an angle ranging from about 0° to 90°, such as 10°, 45°, 90°, so as to assist with directing air and heat out of the brain module 100. When the different angle may be 90°, the one or more intake or exhaust fans can be positioned orthogonal to the one or more fans of the fan housing 710.

The fan duct area can further be separated into two or more chambers as described herein, which can be partially or fully separated by a second interior wall 720 (for example, a plastic low conductivity wall). As illustrated in FIG. 7B, two chambers in the fan duct area may have different sizes from one another. A heat pipe assembly 722 for cooling one or more components within the brain module 100 can be positioned partly within the back chamber. For instance, the heat pipe assembly 722 can be coupled to (1) an image signal processor board and (2) a slug plate coupled to an image sensor. The image sensor can be positioned at a common height with the heat pipe assembly 722, and thus the image sensor can be positioned at a height level below the fan cover 130 and fan housing 710. The heat pipe assembly 722 can, for example, provide gas or liquid cooling for the brain module 100.

Figure 7C:
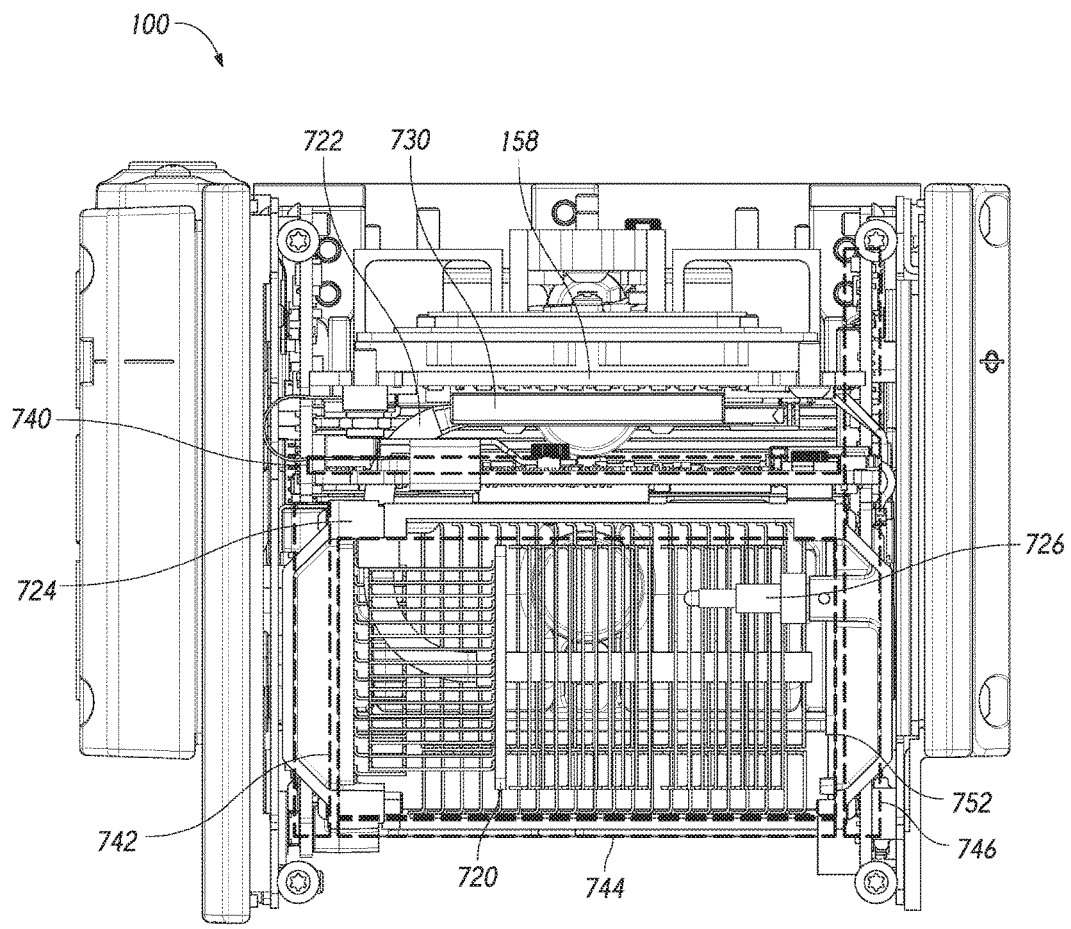
FIG. 7C is a view of a top of the brain module of FIG. 1A depicting electrical and heat transfer components inside the brain module.

FIG. 7C a top view of the fan duct area within the housing 102, as well as other components of the brain module 100. The fan duct area can be in the back chamber and separated from the front chamber at least partly by the first interior wall 724 as described herein. An image sensor 158 and image signal processing electronics 740 can be positioned in the front chamber and thermally coupled to a slug place 730 that is coupled to the heat pipe assembly 722. The heat pipe assembly 722 can extend through the first interior wall 724 and into the back chamber to facilitate transfer of heat from the image sensor 158 or image signal processing electronics 740 in the front chamber to the back chamber to be expelled in the back chamber via air flow in the fan duct area.

One or more heat sinks 752 or other heat dissipation structures 726 and can be positioned at least partly or fully in the back chamber to facilitate heat transfer away from the electronics of the brain module 100, such as the image sensor 158, the image signal processing electronics 740 (such as for receiving and processing image data received from the image sensor), a field-programmable gate array (FPGA) electronics 742, input/output electronics 744 (such as for processing input or output data for the brain module 100), and power control electronics 746, and outside of the housing 102. The heat pipe assembly 722 may be positioned and constructed so that the heat pipe assembly 722 is cooled by air in a top portion of the back chamber while other electronics are cooled by air in a portion of the back chamber below the top portion. Moreover, in certain implementations, at least some of the electronics of the brain module 100 may not generate a significant amount of heat, and thus the at least some of the electronics may be separated from the cooling path of the back chamber and not receive significant cooling effect from the air flow in the back chamber.

One or more of the image signal processing electronics 740, the field-programmable gate array (FPGA) electronics 742, the input/output electronics 744, and the power control electronics 746 can together or individually form a processor of the brain module 100 or may individually include multiple different processors of the brain module. In addition, one or more of the image signal processing electronics 740, the field-programmable gate array (FPGA) electronics 742, the input/output electronics 744, and the power control electronics 746 can include memory for storing image data or instructions for controlling operation of the brain module 100

Figure 7D:
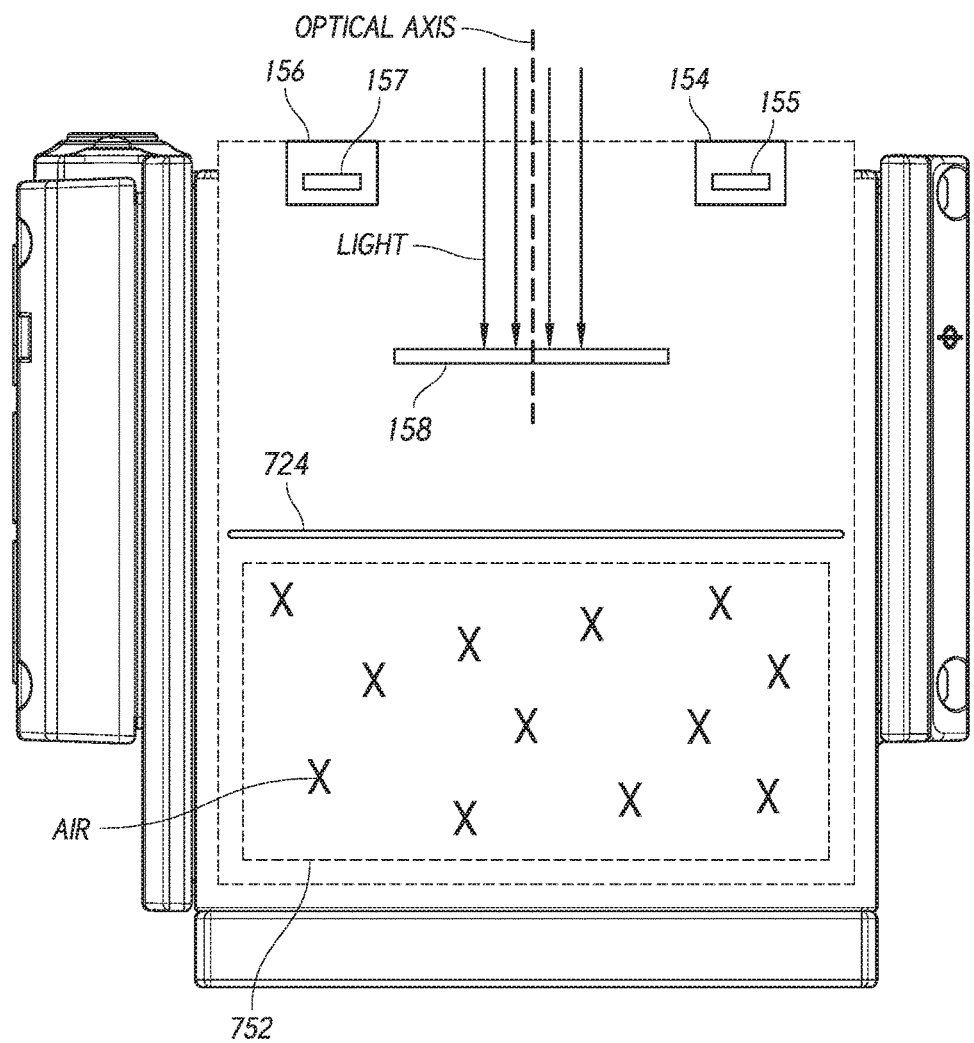
FIG. 7D is another view of a top of the brain module of FIG. 1A depicting components of the brain module.

FIG. 7D illustrates another view of the top of the brain module 100 depicting components of the brain module 100. The front of the brain module 100 includes the first microphone 154 with its acoustic sensor 155 and the second microphone 156 with its acoustic sensor 157. The front of the brain module 100 additionally includes the image sensor 158, which is shown with light entering the brain module 100 and striking the image sensor 158 along the optical axis. The flow of air in the back of the brain module 100 is shown to be toward the bottom of the brain module 100 at least partly through the one or more heat sinks 752. The flow of air in the back of the brain module can be generated by the fans in the fan housing 710 and separated from the image sensor at least partly by the first interior wall 724.

As illustrated by FIGS. 7B and 7D, the first microphone 154 and the second microphone 156 can be positioned closer to a front side of an interior portion of the housing 102 than a rear side of the interior portion, and the fans of the fan housing 710 can be positioned closer to the rear side than to the front side. Moreover, the first microphone 154 and the second microphone 156 can be positioned in the front side, and the fans of the fan housing 710 can be positioned in the rear side. The front side can be opposite the rear side. In addition, at least part of one or both of the first microphone 154 and the second microphone 156 can be positioned in a front wall of the housing 102. The air intake port of the housing 102 can be closer to a top side of the housing 102 than a bottom side of the housing 102, and the air exhaust port of the housing 102 can be closer to the bottom side than the top side. The air intake port can be at least partially positioned in a top wall of the housing 102, and the air exhaust port can be at least partially positioned in a bottom wall or a side wall of the housing 102. The fans of the fan housing 710 can direct air away from the top wall and towards the bottom wall. The cooling path of air generated by the fans of the fan housing 710 can reside more on the rear side than on the front side. The fans of the fan housing 710 can be positioned proximate the air intake port and can direct air in a direction parallel to a direction of an image plane defined by sensor pixels of the image sensor 158.

In some embodiments, various components internal to the brain module 100 can be removable. Such components can include, for example, filters (e.g., an optical low pass filter (OLPF), cable connectors, and the like). In one embodiment, the image sensor can be removable from the brain module 100 and replaced with a different image sensor.

The various mechanical interlocking features described herein can provide robust, reliable connection during use. For example, a relatively heavy load is placed on the mechanical connections between the various modules, such as in configurations including two or more modules. Additionally, the mechanical connections will naturally undergo various stresses as users handle the camera. The interfaces described herein each provide a variety of complementary interlocking mechanisms which may be selected and spatially arranged for synergistic operation. As a result, a robust connection can be maintained under such conditions without failure of the connections, significant mechanical play between the modules, or other undesirable effects. Moreover, the mechanical interlocking allows for straightforward connection and disconnection of the various modules from one of another. This provides efficient and straightforward arrangement of the camera system into the desired modular configuration.

Port Extender Module

Figure 2A:
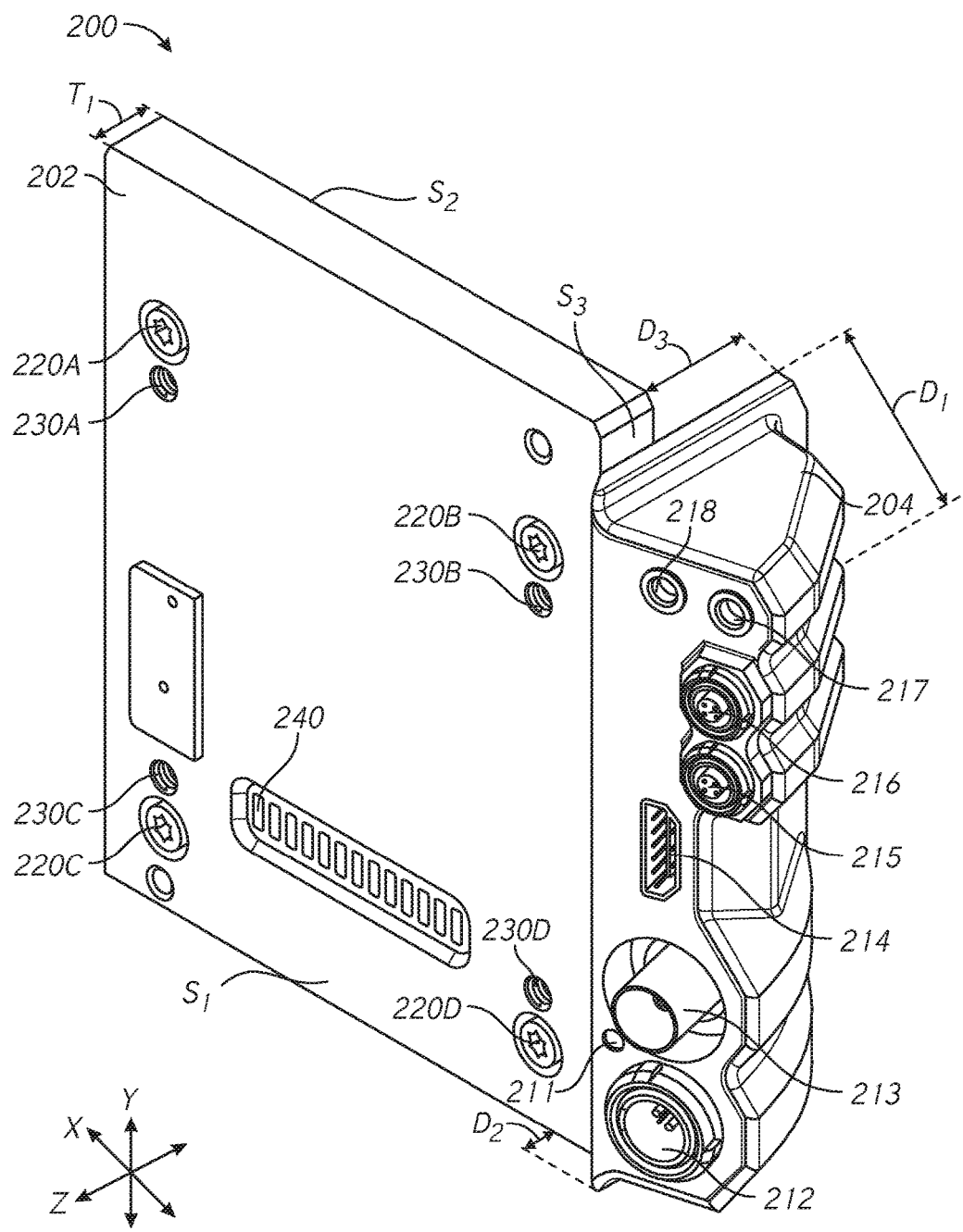
FIG. 2A is perspective view of a back of an example port extender module of a modular camera system.

FIG. 2A is perspective view of a back of a port extender module 200 of a modular camera system. The port extender module 200 (sometimes referred to as a port expander or input/output module) can be electrically and mechanically coupled to the back of a camera body, such as the housing 102 of the brain module 100 of FIGS. 1A-1D, and thereby provide the camera body with different or additional input or output capabilities.

The port extender module 200 can have a side portion 204 comprising a connector housing, and that extends a length of $D_1$ in a width direction (along the x-axis) beyond an edge $S_3$ of a main portion 202 of the port extender module 200, and includes one or more input or output connectors 212-218. In some embodiments, the length of $D_1$ can be within a range about 10 mm to about 100 mm, about 15 mm to about 60 mm, about 20 mm to about 40 mm, about 25 mm to about 35 mm, or about 29 mm to about 31 mm. In one embodiment, the length of $D_1$ can be about 30 mm or about 30.9 mm.

The one or more input or output connectors 212-218 can include a variety of input or output connectors including, for example, an audio output connector, an audio input connector, a video output connector, a video input connector, a synchronization signal input connector, a synchronization signal output connector, a control signal input connector, a control signal output connector, a dual link HD-SDI video monitoring connector, or other connectors useful in the film production environment. Moreover, in some implementations, the one or more input or output connectors 212-218 of the port extender module 200 can be customized to production requirements or user preferences. The one or more input or output connectors 212-218 can be positioned in the side portion 204 so that the one or more input or output connectors 212-218 receive coupled connectors at the back of the port extender module 200 or at a slight angle from the back of the port extender module 200 as illustrated in FIG. 2A. At least one of the one or more input or output connectors 212-218 may be positioned in the port extender module 200 in a location other than on the side portion 204 in some embodiments. The port extender module 200 can include an indicator 211, such as a light emitting diode (LED), which can, for instance, denote when the port extender module 200 is powered or operating. According to some embodiments, the port extender module 200 can be configured to provide some or all of the capability of the input or output capability of the broadcast modules and input/output modules described in U.S. Patent Application Publication No. 2015/0288942, titled "BROADCAST MODULE FOR A DIGITAL CAMERA," filed on Apr. 2, 2015, and which is incorporated by reference herein.

In one embodiment, the one or more input or output connectors 212-218 can include the following:
  DC-IN power input (1B LEMO 6-pin socket)
  SDI video output such as an HD-SDI or 3G-SDI output (75 ohm Bayonet Neill-Concelman connector [BNC])
  HDMI video output (Type A socket)
  Synchronization input (Genlock IN/Timecode IN/Sync IN) (00B LEMO 4-pin socket)
  CTL (Tally OUT/RS-232 Rx and Tx) (00B LEMO 4-pin socket)
  Stereo Analog Microphone input (3.5 mm jack)
  Stereo Headphone output (3.5 mm jack)

In another embodiment, the one or more input or output connectors can include the following:
  DC-IN power input (1B LEMO 6-pin socket)
  HDMI video output (Type A socket)
  USB Power output (Type A socket)
  Synchronization input (Genlock IN/Timecode IN/Sync IN) (00B LEMO 4-pin socket)
  CTL (Tally OUT/RS-232 Rx and Tx) (00B LEMO 4-pin socket)

In yet another embodiment, the one or more input or output connectors can include the following:
  DC-IN power input (1B LEMO 6-pin socket)
  HDMI video output (Type A socket)
  USB Power output (Type A socket)
  Video output such as an HD-SDI or 3G-SDI video output (75 ohm BNC)
  Genlock input (75 ohm BNC)
  Gigabit Ethernet input/output (9-pin 0B LEMO)
  CTL (Tally OUT/RS-232 Rx and Tx) (00B LEMO 4-pin socket)
  Stereo Headphone output (3.5 mm jack)
  Timecode input/output (5 pin 0B LEMO)
  2× Stereo Audio inputs (3-pin, full size XLR female)
  Aux Power output (4-pin 0B LEMO)
  Aux Power output (2-pin 0B LEMO)

The side portion 204 can extend a length of $D_2$ beyond a camera housing-distal surface $S_1$ of the main portion 202 in a thickness direction (along the z-axis) and extend a length of $D_3$ beyond a camera housing-proximal surface $S_2$ of the main portion 202 of the port extender module 200 in the thickness direction (along the z-axis). The lengths of $D_2$ and $D_3$ of the side portion can enable the side portion to house connectors that may have a size or length greater than the thickness $T_1$ of the main portion 202 and may not fit within a portion of the port extender module 200 having the thickness $T_1$ of the main portion 202. One or more of the multiple input or output connectors 212-218 can, moreover, extend beyond the camera housing-proximal surface $S_2$ in the thickness direction or extend beyond the camera housing-distal surface $S_1$ in the thickness direction. Placement of one or more of the multiple input or output connectors 212-218 within the side portion can advantageously, in certain embodiments, leave space for coupling of a module, such as a power module, to the back of the port extender module 200.

In some embodiments, the length of $D_2$ can be within a range about 1 mm to about 30 mm, about 3 mm to about 20 mm, about 5 mm to about 15 mm, about 7 mm to 13 mm, or about 9 mm to about 11 mm. In one embodiment, the length of $D_2$ can be about 10 mm or about 9.7 mm. In some embodiments, the length of $D_3$ can be within a range about 5 mm to about 50 mm, about 10 mm to about 40 mm, about 15 mm to about 30 mm, about 20 mm to 25 mm, or about 21 mm to about 23 mm. In one embodiment, the length of $D_3$ can be about 22 mm or about 22.1 mm. In some embodiments, the length of $T_1$ can be within a range about 1 mm to about 30 mm, about 3 mm to about 20 mm, about 5 mm to about 15 mm, about 7 mm to 13 mm, or about 9 mm to about 11 mm. In one embodiment, the length of $T_1$ can be about 10 mm.

The port extender module 200 can include fasteners 220A-D that extend through the main portion 202 of the port extender module 200 and releasably mount the port extender module 200 to the back of the housing 102 of the brain module 100 or another module. The fasteners 220A-D can be screws in some implementations, although other attachment mechanisms are possible, including friction fit, magnetic, and the like.

The port extender module 200 can include one or more back surface mounting interfaces for mechanically or electrically coupling one or more modules to the back of the port extender module 200. One of the back surface mounting interfaces can include holes 230A-D usable to releasably mechanically mount one or more modules, such as a power module, to the back of the port extender module 200. Another of the back surface mounting interfaces can include a sixth module connector 240 for electrically and mechanically coupling a module to the back of the port extender module 200. The sixth module connector 240 may have the same or substantially the same structure as the fourth module connector 180.

The sixth module connector 240 can include multiple electrical conductors (for instance, thirteen electrical conductors as illustrated) and a conductor supporting member that surrounds and supports the multiple electrical conductors. The multiple electrical conductors can be positioned in one or more conductor rows (for instance, one row as illustrated) within the conductor supporting member. The exposed surface of the sixth module connector 240 can be a flat surface (or substantially so) such that the exposed ends of the multiple electrical conductors and the exposed end of the conductor supporting member can be flush with or parallel to (or substantially so) each other, as well as flush with or parallel to (or substantially so) the camera housing-distal surface $S_1$. In some embodiments, the exposed surface of the sixth module connector 240 can be recessed relative to the camera housing-distal surface $S_1$. The ends of the multiple electrical conductors can be exposed while the sides of the multiple electrical conductors may be covered by the conductor supporting member and not exposed. The multiple electrical conductors may be fixed in the conductor supporting member, so the ends of the multiple electrical conductors may not move when a module may be mechanically coupled to the sixth module connector 240.

One or more of the multiple electrical conductors of the sixth module connector 240 can be electrically coupled to (i) a signal generator, power supply, or electrical ground of a module coupled to the back of the port extender module 200, (ii) a signal provider, power supply, or electrical ground of the port extender module 200, or (iii) the processor, power supply, or electrical ground of the brain module 100. The one or more of the multiple electrical conductors of the sixth module connector 240 can thereby transmit or receive power or data to/from the brain module 100 or a module coupled to the back of the port extender module 200. In some embodiments, the sixth module connector 240 can be configured to communicate power and not communicate data.

Figure 2B:
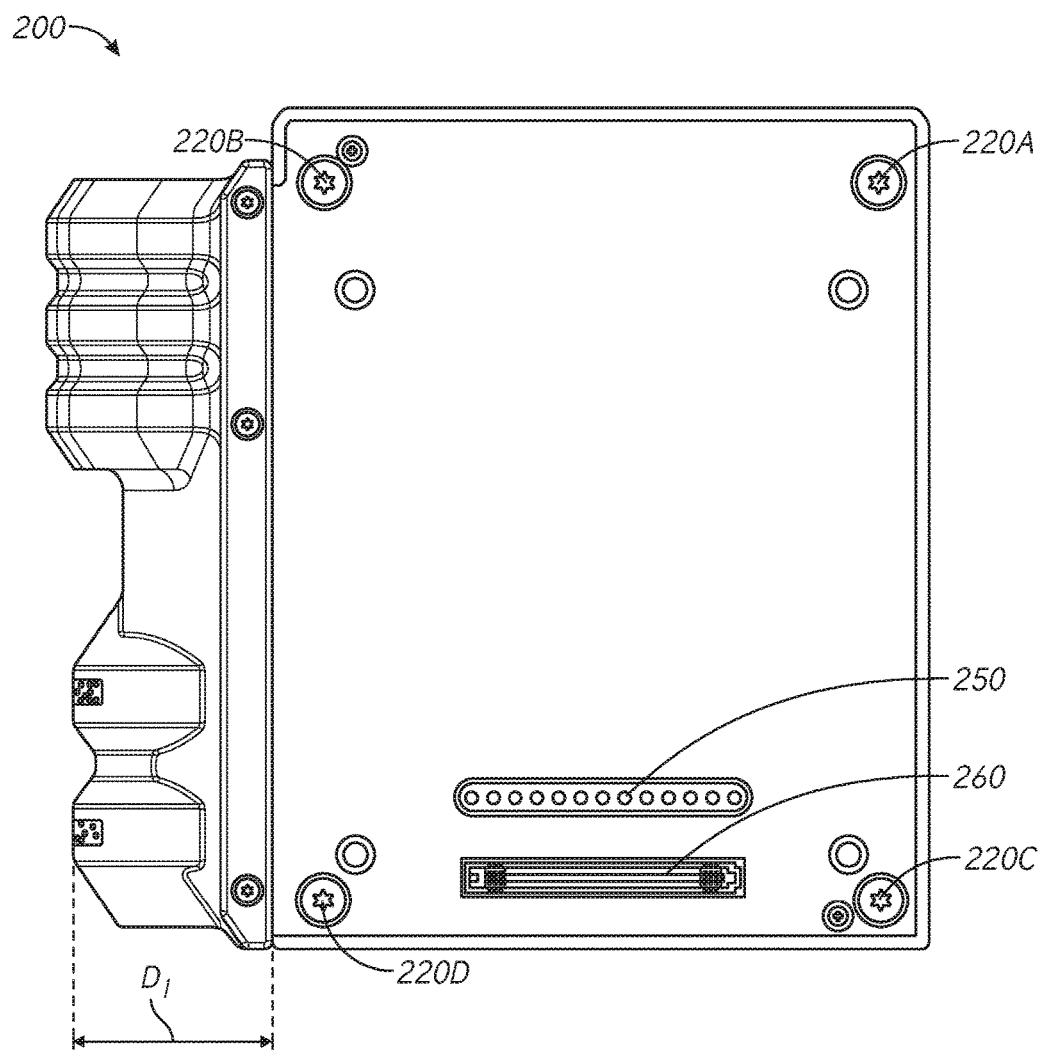
FIG. 2B is a view of a front of the port extender module of FIG. 2A.

FIG. 2B is a view of a front of the port extender module 200. The front of the port extender module 200 can be the camera housing-proximal surface $S_2$ of the port extender module 200 that electrically and mechanically engages with the back of the housing 102 of the brain module 100 or another module. The back of the port extender module 200 can be opposite from the front of the port extender module 200. Ends of the fasteners 220A-D illustrated in FIG. 2B can be opposite the ends of the fasteners 220A-D shown in FIG. 2A. The front of the port extender module 200 can additionally include projections to assist in aligning and securing the front of the port extender module 200 with the back of the housing 102 of the brain module 100 or another module.

The back of the port extender module 200 can include one or more front surface mounting interfaces for mechanically or electrically coupling to the back of the housing 102 of the brain module 100 or the back of another module. One of the back surface mounting interfaces can include the fasteners 220A-D. Another of the front surface mounting interfaces can include a seventh module connector 250 for electrically and mechanically coupling the port extender module 200 to the fourth module connector 180 of the brain module 100 or another module. Yet another of the front surface mounting interfaces can include an eighth module connector 260 for electrically and mechanically coupling to the fifth module connector 190 of the brain module 100 or another module.

The seventh module connector 250 can include multiple electrical conductors (for instance, thirteen electrical conductors as illustrated) and a conductor supporting member that surrounds and supports the multiple electrical conductors. The multiple electrical conductors can be positioned in one or more conductor rows (for instance, one row as illustrated) within the conductor supporting member. The exposed surface of the conductor supporting member can be recessed relative to a surface of the front of the main portion 202 of the multiple electrical conductors, and the multiple electrical conductors can extend beyond the camera housing-proximal surface $S_2$. The multiple electrical conductors can be, for example, spring-loaded electrical connectors (sometimes referred to as POGO™ connectors). The impedance of each of one or more of the multiple electrical conductors may not, in some implementations, vary as the spring of the spring-loaded connector stretches or compresses. The multiple electrical conductors can move toward the back and front of the port extender module 200 as the seventh module connector 250 is positioned next to and coupled to the fourth module connector 180 of the brain module 100 or another module.

Advantageously, in certain embodiments, by using spring-loaded electrical connectors as the multiple electrical conductors of the seventh module connector 250 and fixed connectors as the multiple electrical conductors of the fourth module connector 180, wear in the coupling interface between the port extender module 200 and the brain module 100 can primarily occur at the port extender module 200 rather than the brain module 100. This can be desirable, for instance, because the port extender module 200 may be less expensive to replace or easier to repair than the brain module 100. Further, this coupling interface can permit some flexibility in the position of the contacts of the multiple electrical conductors, preventing crushing of the conductors and enabling sufficient conductor alignment for high speed communication and high current transfer (for example, around 2 Amps per conductor in some implementations).

The eighth module connector 260 can include multiple electrical conductors and a conductor supporting member that surrounds and supports the multiple electrical conductors. The multiple electrical conductors can be positioned in one or more conductor rows within the conductor supporting member. The eighth module connector 260 can be a Searay™ port extender connector in some embodiments. In other embodiments, fifth module connector 190 can be a different type of connector.

One or more of the multiple electrical conductors of the seventh and eighth module connectors 250, 260 can be electrically coupled to (i) a signal generator, power supply, or electrical ground of a module coupled to the back of the port extender module 200, (ii) a signal provider, power supply, or electrical ground of the port extender module 200, or (iii) the processor, power supply, or electrical ground of the brain module 100. The one or more of the multiple electrical conductors of the seventh and eighth module connectors 250, 260 can thereby transmit or receive power or data to/from the brain module 100 or a module coupled to the back of the port extender module 200. In some embodiments, the seventh module connector 250 can be configured to communicate power and not communicate data.

Figure 2C:
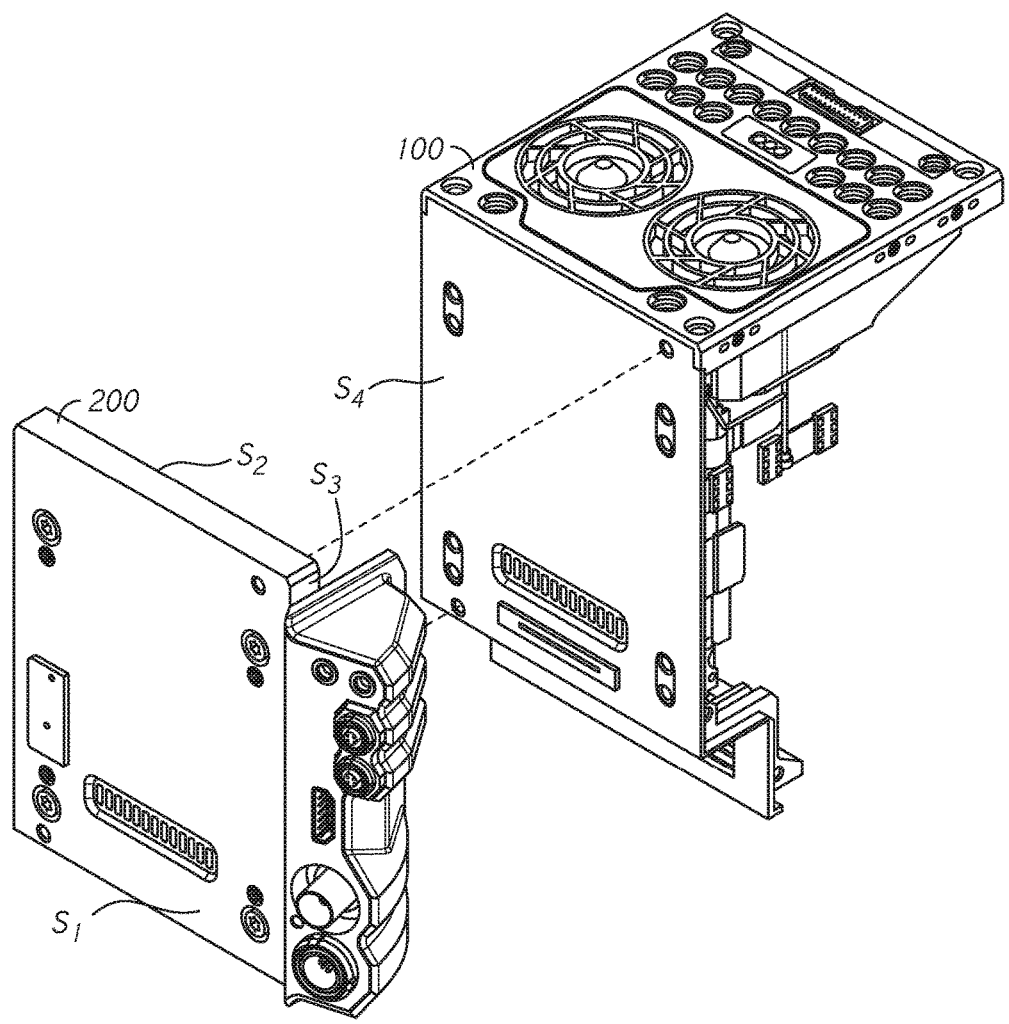
FIG. 2C is a perspective view of the port extender module of FIG. 2A aligned for coupling with a brain module, such as the brain module of FIG. 1C.
Figure 2D:
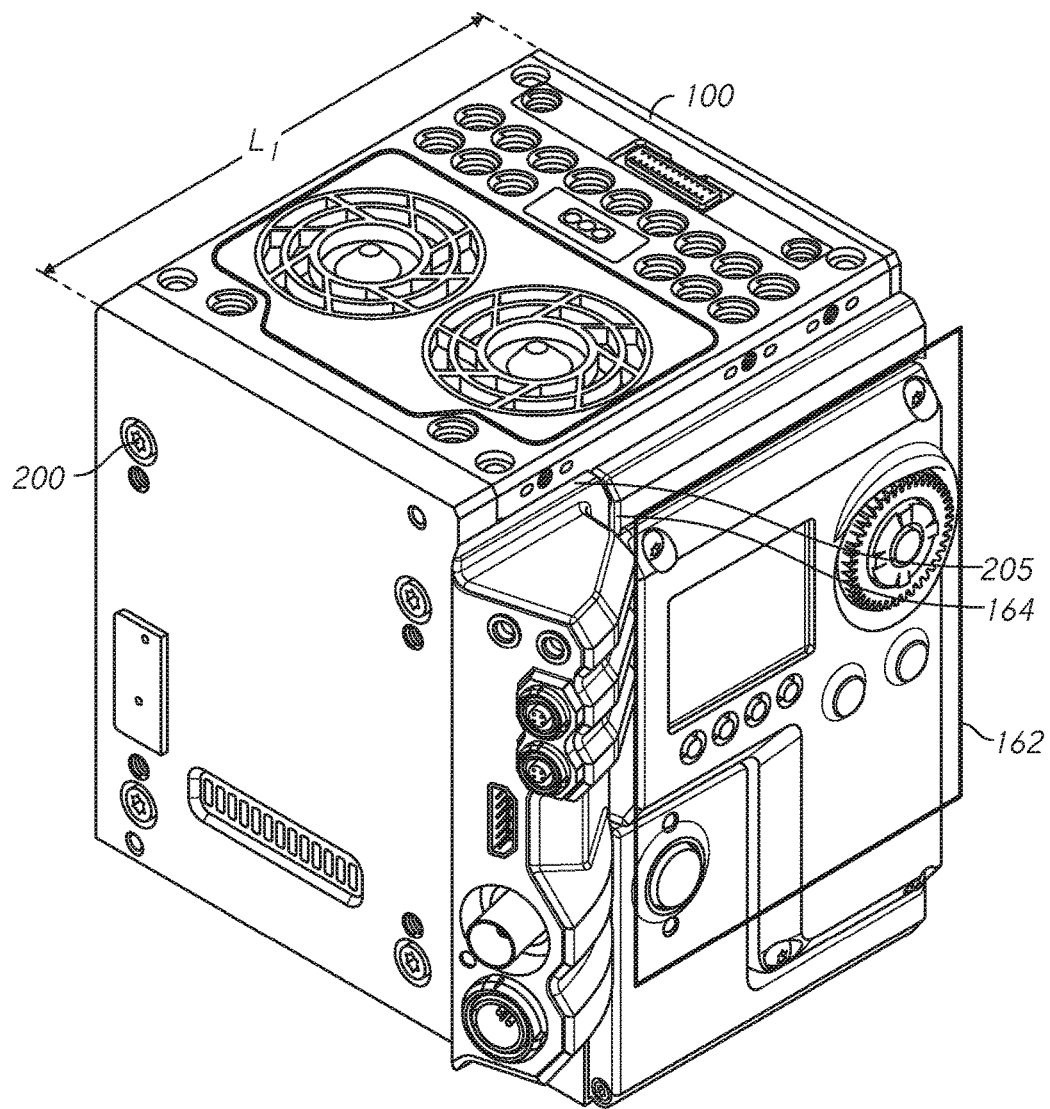
FIG. 2D is a perspective view of the port extender module of FIG. 2A when coupled to a brain module, such as the brain module of FIG. 1C.

FIG. 2C illustrates the port extender module 200 aligned for coupling with a back surface $S_4$ of the back of the brain module 100. Once the port extender module 200 has been moved sufficiently close to the brain module 100, the port extender module 200 can electrically and mechanically couple as described herein. FIG. 2D illustrates the port extender module 200 once coupled to the brain module 100. As can be seen, an extension part of the side portion 204 of the port extender module 200 extending the length of $D_3$, which is shown in FIG. 2A, allows the port extender module 200 to wrap around the side of the housing 102 of the brain module 100 when the port extender module 200 and the brain module 100 are coupled.

As shown in FIG. 2D, a back edge 205 of the side portion 204 of the input-output module 200 can be flush up against the front edge 164 of a user interface panel 162 of the brain module 100. In this manner, the port extender module 200 can utilize available real estate on the side of the brain module 100 and maintain a compact form factor for the assembled camera, despite a relative bulkiness of the side portion 204. In particular, the wrap-around configuration can minimize an amount that the overall length $L_1$ of the assembled camera upon coupling of the port extender module 200 to the brain module 100. In particular, the overall length $L_1$ may be greater than a thickness of the brain module 100 by a length equal to the thickness $T_1$ of the main portion 202 of the port extender module 200 plus the length of $D_2$ shown in FIG. 2A. In some embodiments, the length of $L_1$ can be within a range about 50 mm to about 250 mm, about 75 mm to about 200 mm, about 90 mm to about 150 mm, about 110 mm to 120 mm, or about 113 mm to about 115 mm. In one embodiment, the length of $D_1$ can be about 114 mm.

In addition, FIG. 2D shows the user interface 162 on the side of the housing of the brain module 100 that is not shown in FIGS. 1C and 2C. The user interface 162 can include any of a variety of user interface features, such as a viewing screen for viewing sampled images or controls for operating the brain module 100 or another module. The screen may be a touch screen, with integrated controls, or separate controls such as knobs, keypads, and the like. The controls can provide a variety of functions including, for example, toggling the camera between motion and still modes, entering a record mode, operating one or more of the displays or other components of the brain module 100 or the modular camera system, powering the camera on and off, and the like. The user interface 162 can switch the camera into a DSLR mode, for example. In some embodiments, the user interface 162 can be removable or upgradable, such as where one user interface having a first set of controls, displays, or other features can be swapped out for a different user interface having a second, different set of controls, displays, or other features from the one user interface.

Figure 2E:
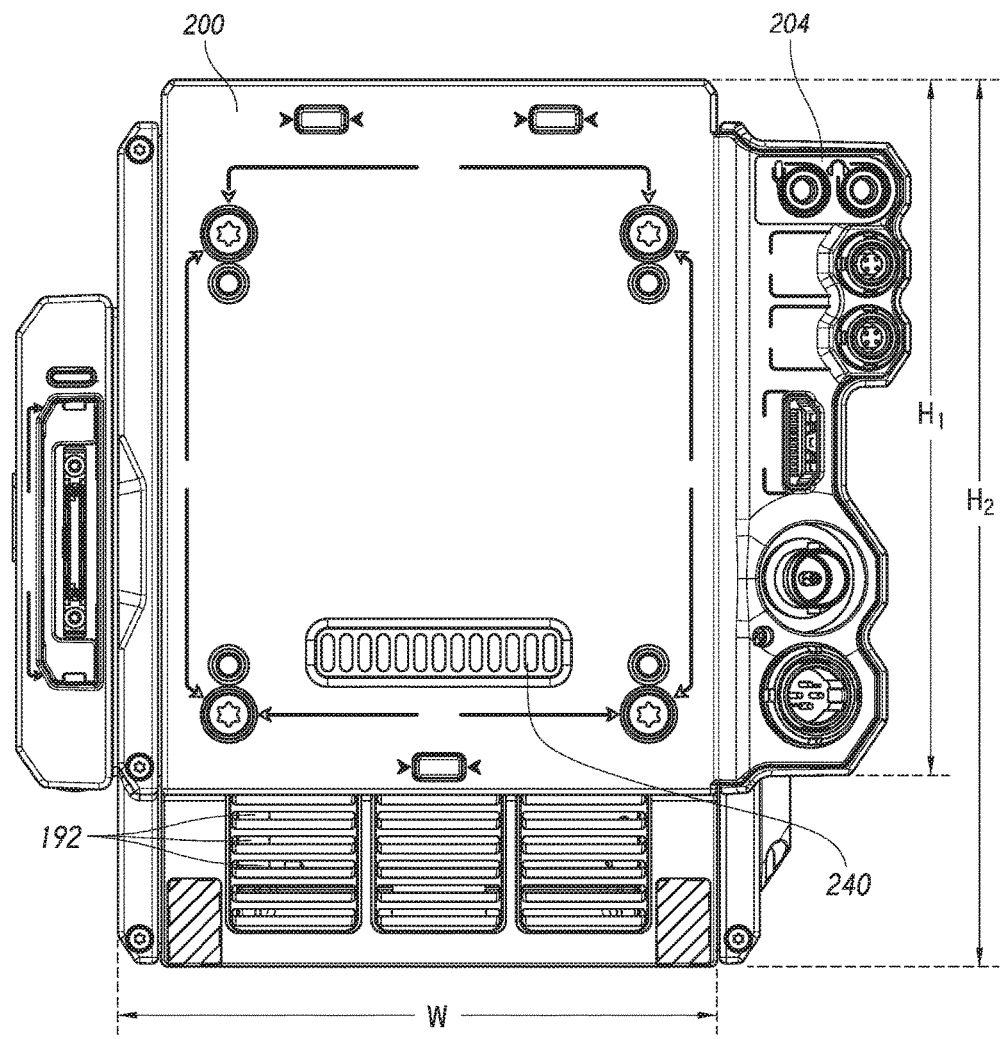
FIG. 2E is a view of a back of the port extender module of FIG. 2A when coupled to a brain module, such as the brain module of FIG. 1D.

FIG. 2E illustrates the back of the port extender module 200 when coupled to the brain module 100. As can be seen from FIG. 2E, the port extender module 200 can have a length $H_1$ such that a bottom of the port extender module 200 may not extend below the ledge 195 of the brain module 100 and block the one or more openings 192. As a result, the port extender module 200 can be successfully coupled to the brain module 100, and the brain module 100 can nonetheless communicate air through the one or more openings 192 to cool the components within the brain module 100.

Figure 2F:
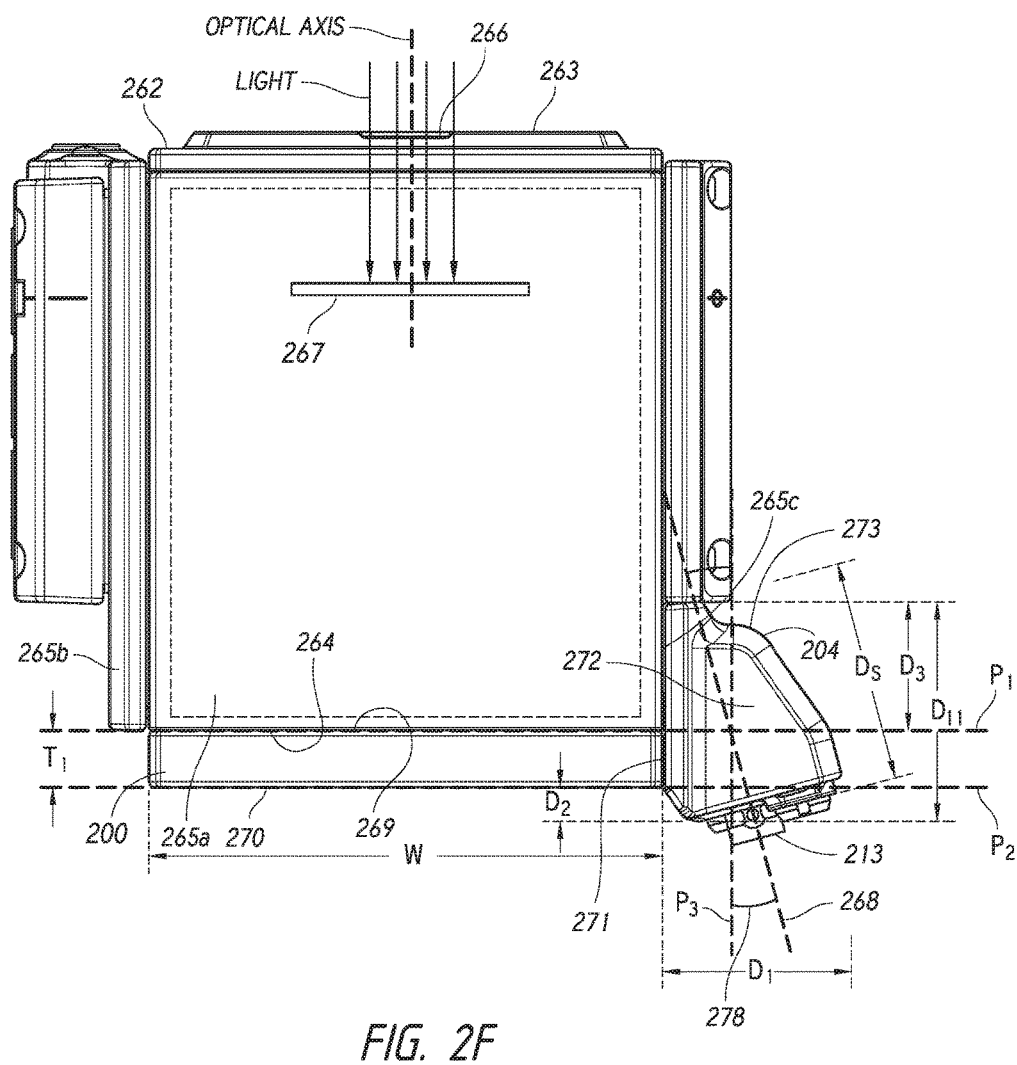
FIG. 2F is a view of a top of the port extender module of FIG. 2A when coupled to a brain module, such as the brain module of FIG. 1A.
Figure 21:
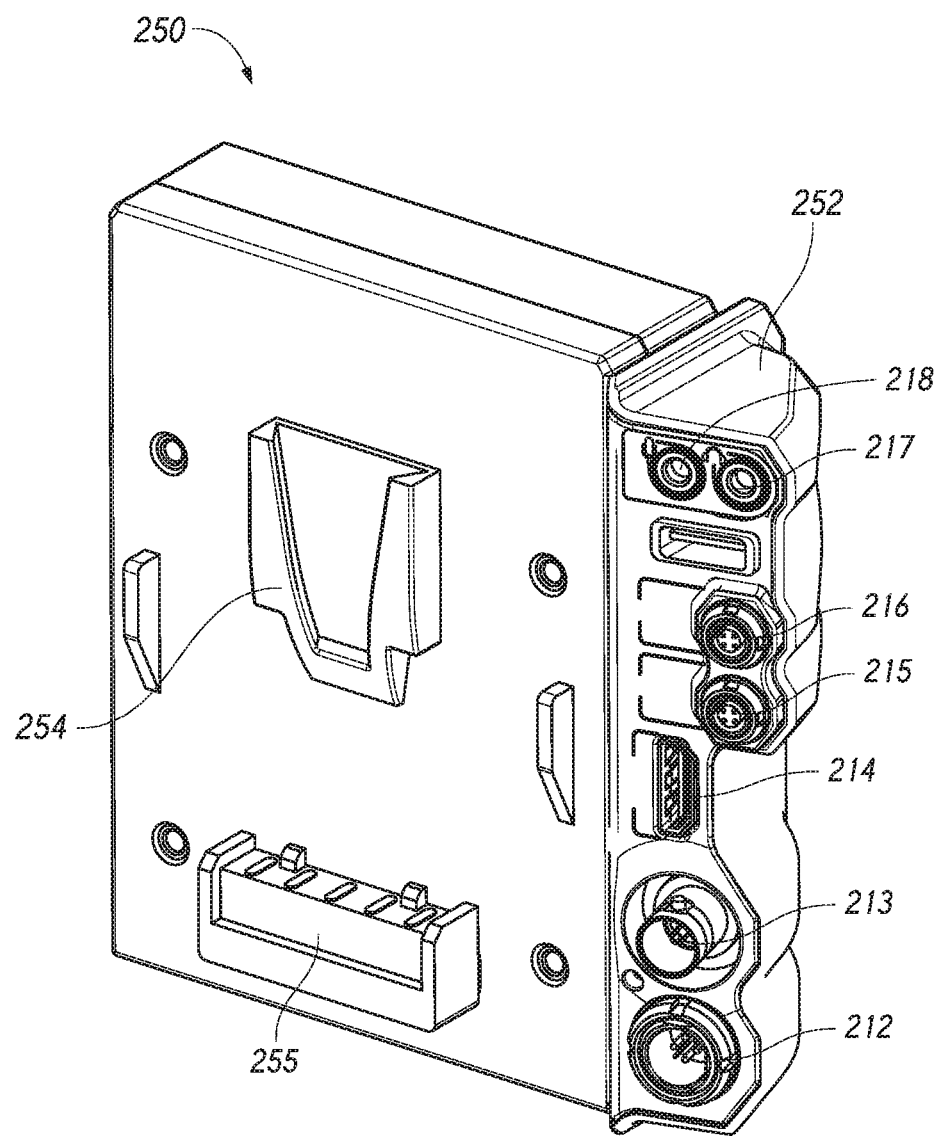

FIG. 2F is a top schematic view of a digital video camera. The camera includes a camera body 262 and a port expander or port extender module 200 coupled to the camera body 262. The camera body 262 can be the brain module 100, for example.

The camera body 262 includes a first surface 263, a second surface 264, and multiple third surfaces 265 (which in the illustrated embodiment include a bottom side surface [not shown], top side surface 265a, left side surface 265b, and right side surface 265c) extending between the first surface 263 and the second surface 264. The first surface 263 includes an opening 266 through which light enters the camera body 262. An image sensor 267 is positioned in the camera body 262 and is configured to generate image data corresponding to the light contacting pixels of the image sensor 267.

The port expander 200 can be releasably attachable to the second surface 264, and include a plurality of electrical ports including a first electrical port 213. The port expander 200 has a camera body-proximal surface 269 and a camera body-distal surface 270 defining a thickness $T_1$ of the port expander therebetween. The camera body-proximal surface 269 is configured to engage the second surface 264 when the port expander 200 is attached to the camera body 262.

The port expander 200 includes a plurality of sidewalls extending between the camera-body proximal surface 269 and the camera body-distal surface 270 and including a first sidewall 271. The plurality of sidewalls in the illustrated embodiment includes a top, bottom, left, and right sidewalls.

The port expander 200 includes a side portion 204, which can have a connector housing 272 supporting the plurality of electrical ports. The connector housing 272 extends from the first sidewall 271 beyond a first plane $P_1$ defined by the camera body-proximal surface 269 so that a forward portion 273 of the connector housing 272 extends along at least one of the plurality of third surfaces of the camera body 262 (the right side surface 265c in the illustrated embodiment) when the port expander 200 is attached to the camera body 262. The first electrical port 213 or one or more of the other electrical ports 212-218 can have an axial length that extends through the first plane $P_1$ (FIG. 2H). Similarly, the connector housing 272 has a length $D_s$ in a direction along an axial length of the first electrical connector 213, which extends through the first plane $P_1$. The connector housing 272 can extend beyond the first plane $P_1$ by a distance at least as great as the thickness $T_1$ of the port expander 200. For example, in the illustrated embodiment, the connector housing 272 extends beyond the first plane $P_1$ by the distance $D_3$, which is greater than the thickness $T_1$ of the port expander 200. Such an arrangement makes use of available area on and in the proximity of the side surface 265c of the camera body 262 for accommodating the connector housing 272, and can allow for a relatively thin port expander 200, such as in the illustrated embodiment, thereby maintaining a compact form factor for the camera 261. The camera body-distal surface 270 defines a second plane $P_2$.

The camera-body proximal surface 269 can include at least one electrical connector (e.g., connectors 250, 260 shown in FIG. 2B) configured to mate with at least one corresponding electrical connector (e.g., connectors 180, 190 shown in FIG. 1D) of the second surface 264.

A processor (not shown) can be positioned in the camera body 262 and configured to output video data via an electrical path extending between the at least one corresponding electrical connector of the second surface 264, the at least one electrical connector of the camera-body proximal surface 269, and the first electrical port 213. For instance, the sensor 267 can generate raw image data, which is processed (e.g., compressed into compressed raw mosaiced video image data or alternatively into compressed developed video image data) by the processor (and in some cases by one or more other components within the camera body 262). The processor outputs video data to the connector on the second surface 264 of the camera body 262 (e.g., one of the connectors 180, 190 shown in FIG. 1D). The corresponding connector on the port expander 200 (e.g., one of the connectors 250, 260 shown in FIG. 2B) receives the video data, which is communicated through the port expander 200, e.g., via internal wiring, to the first electrical port 213, which can be a video monitoring output port, for example.

The camera-body proximal surface 269 comprises at least one fastening element (e.g., the fasteners 220A-220D shown in FIG. 2B) configured to engage with a corresponding fastening element provided on the second surface 264 (e.g., the holes 170A-170D shown in FIG. 1C).

As shown in FIG. 2F, the first electrical port 213 can in some embodiments be arranged to point rearwardly with respect to the camera 261. Such an arrangement can allow for a degree of alignment of cables attached to the port expander 200 with the length or shooting direction of the camera 261. This can serve to reduce the chances of the cables catching during shooting, as compared to configurations where the cables point sideways out of the camera 261. The electrical port 213 in some embodiments points exactly backward, parallel to a third plane $P_3$ that is parallel to side surface 265c of the camera body 262 or that is parallel to the optical axis of the camera 266. In other embodiments, including the illustrated embodiment, the first electrical port 213 points generally but not exactly rearwardly, at an angle from the third plane $P_3$. For instance, the first electrical port 213 of the illustrated embodiment is arranged such that its elongate axis 268 forms an angle 278 of approximately 15° with the third plane $P_3$. In certain embodiments, the angle 278 can be less than less than 30° or less than 20°, or less than approximately either of these values. In further embodiments, angle 278 is less than 70°, less than 60°, less than 50°, less than 45°, or less than 40°, or less than approximately any of these values, or is between any of the foregoing values.

The camera body-distal surface 270 of the port expander 200 can include an accessory interface (see e.g., FIG. 3A) configured for releasable attachment of an electronic device. For instance, as is described further with respect to FIG. 3A, the accessory interface can be configured for releasable attachment of a camera battery device, and the accessory interface can include an electrical connector configured to receive electrical power from the camera battery device.

As shown, the connector housing 272 can additionally extend from the first sidewall 271 beyond a second plane $P_2$ defined by the camera-body distal surface 270. The illustrated port expander 200 has an overall length $D_{11}$ along the length of the camera 262, which extends through both the first plane $P_1$ and the second plane $P_2$, and has a length $D_S$ along the elongate axis 268 of the first connector 213 that also extends through both first plane $P_1$ and the second plane $P_2$, thereby making use of the space on and around the side of the camera 261 for positioning the connector housing 272, while maintaining a relatively thin port expander 200.

The second surface 264 in the illustrated embodiment is provided on a rear portion of the camera body 262 which, as shown and described with respect to FIG. 1D can include the exhaust grill 191 configured to exchange air between an inside of the camera body 262 and an outside of the camera body 262. For instance, the exhaust grill 191 can be positioned on the rear portion such that the port expander 200 attaches to the camera body 262 without covering the exhaust grill 191 (e.g., below the second surface 264, such that the second surface 264 overhangs the exhaust grill 191). For instance, the port expander 200 can be positioned out of a flow path of air exiting the camera body 262 via the exhaust grill 191, so as not to impede air flow.

FIGS. 2G and 2H are top and side views respectively of the port extender module 200 with a cover of the side portion 204 removed, exposing the internals of the connectors 212-218. As shown, the connectors 212-218 each include connection/interface portions 212a-218a, body portions 212b-218b, and wiring portions 212c-218c. Moreover, as can be seen, one or more of the body portions 212b-218b can extend through the first plane $P_1$, and thus a portion of each of one or more of the body portions 212b-218b can be both on one side of the first plane $P_1$ and on the other side of the first plane $P_1$.

FIG. 2I is perspective view of a back of a different port extender module 250 of a modular camera system. In particular, the port extender module 250 includes the same connectors 212-218 as the port extender module 200, but includes a different type of accessory interface having a v-mount 254 and an electrical connector 255, which can be configured to mechanically support and electrically connect to a battery device, for instance.

Power Module

Figure 3A:
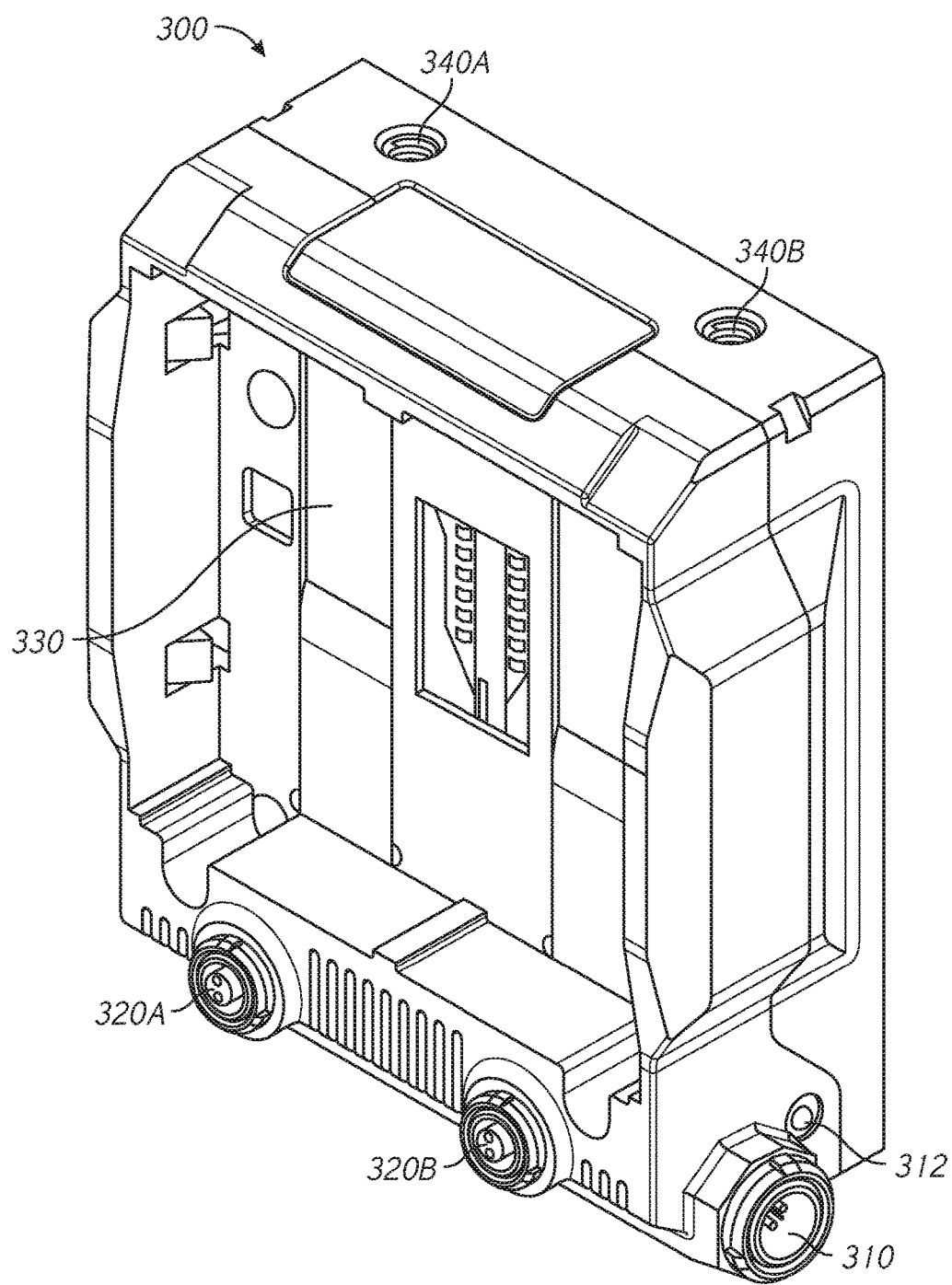
FIG. 3A is a perspective view of a back of an example power module of a modular camera system.

FIG. 3A is perspective view of a back of a power module 300 of a modular camera system. The power module 300 can be electrically and mechanically coupled to the back of the housing 102 of the brain module 100 or another module and thereby provide the brain module 100 or one or more other modules with their exclusive power supply or an additional power supply.

The power module 300 may include a variety of power supplies, such as batteries, fuel cells, solar, line input such as from a transformer or studio power, or other source or combinations thereof. Conventional rechargeable batteries, for example, can be used in some implementations. The power module 300 can include one, two, or three, or more separate power sources, such as batteries. The individual power sources may be releasable from the power module 300 in some embodiments. For instance, the power module 300 can include a quad battery back including four separate batteries.

The power module 300 can include a direct current (DC) input connector 310 for receiving power for powering or charging the power module 300. The DC input connector 310 can be positioned on a side of the power module 300 next to an indicator 312, such as an LED light, that may denote when the power module 300 may be supplied with power or operating. The power module 300 can include two auxiliary input connectors 320A, 320B and a battery storage section 330 for mounting a battery with the power module 300. In addition, the power module 300 can include holes 340A, 340B usable to releasably mechanically mount one or more modules to a top of the power module 300.

Figure 3B:
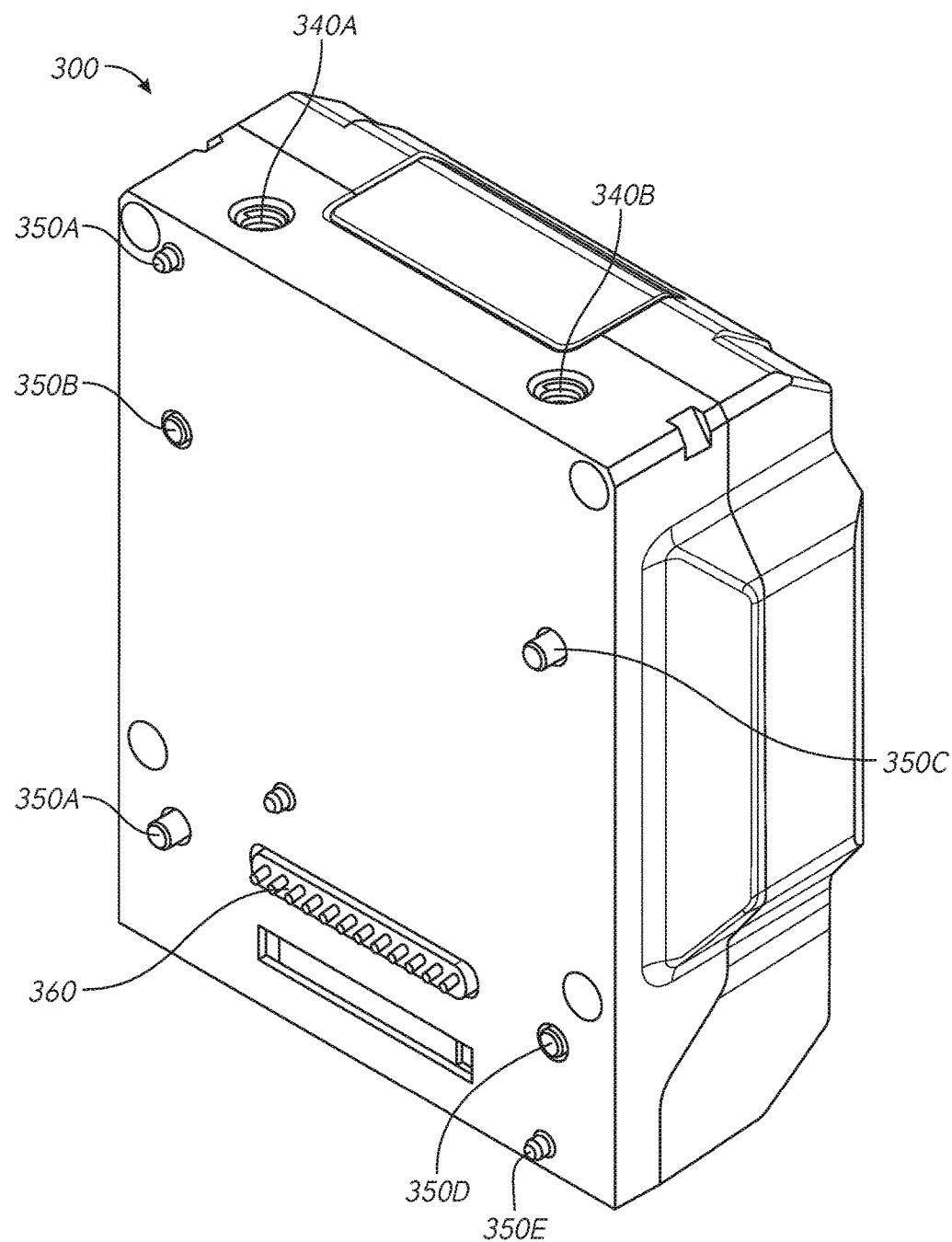
FIG. 3B is a perspective view of a front of the power module of FIG. 3A.

Referring to FIG. 3B, the front of the power module 300 can include one or more front surface mounting interfaces for mechanically or electrically coupling to the back of the housing 102 or the back of another module. One of the front surface mounting interfaces can include the projections 350A-F to assist in aligning and securing the front of the power module 300 with the back of the housing 102 or another module. Another of the front surface mounting interfaces can include a ninth module connector 360 for electrically and mechanically coupling the power module 300 to the fourth module connector 180 of the brain module 100 or another module, such as the sixth module connector 240 of the port extender module 200. The ninth module connector 360 may have the same or substantially the same structure as the seventh module connector 250.

Figure 3C:
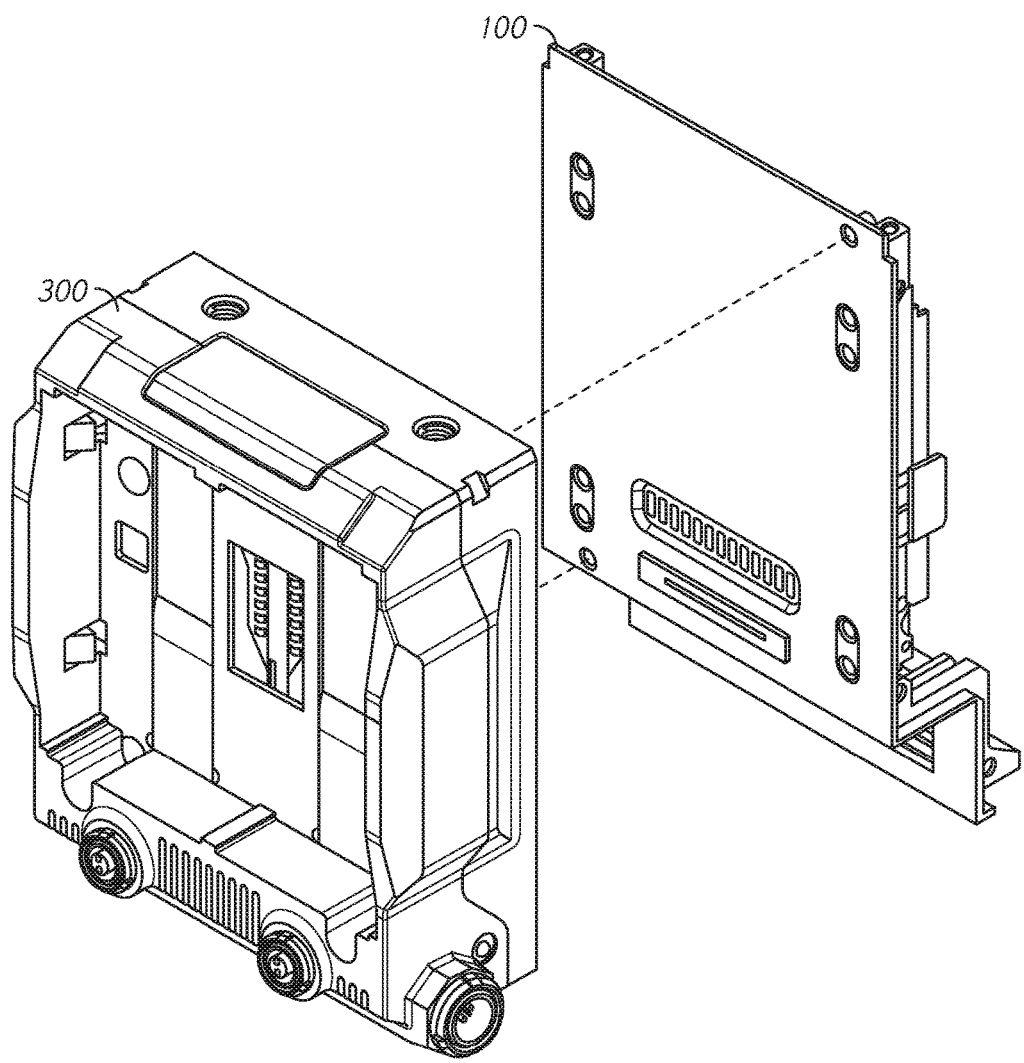
FIG. 3C is a perspective view of the power module of FIG. 3A aligned for coupling with the brain module of FIG. 1C.
Figure 3D:
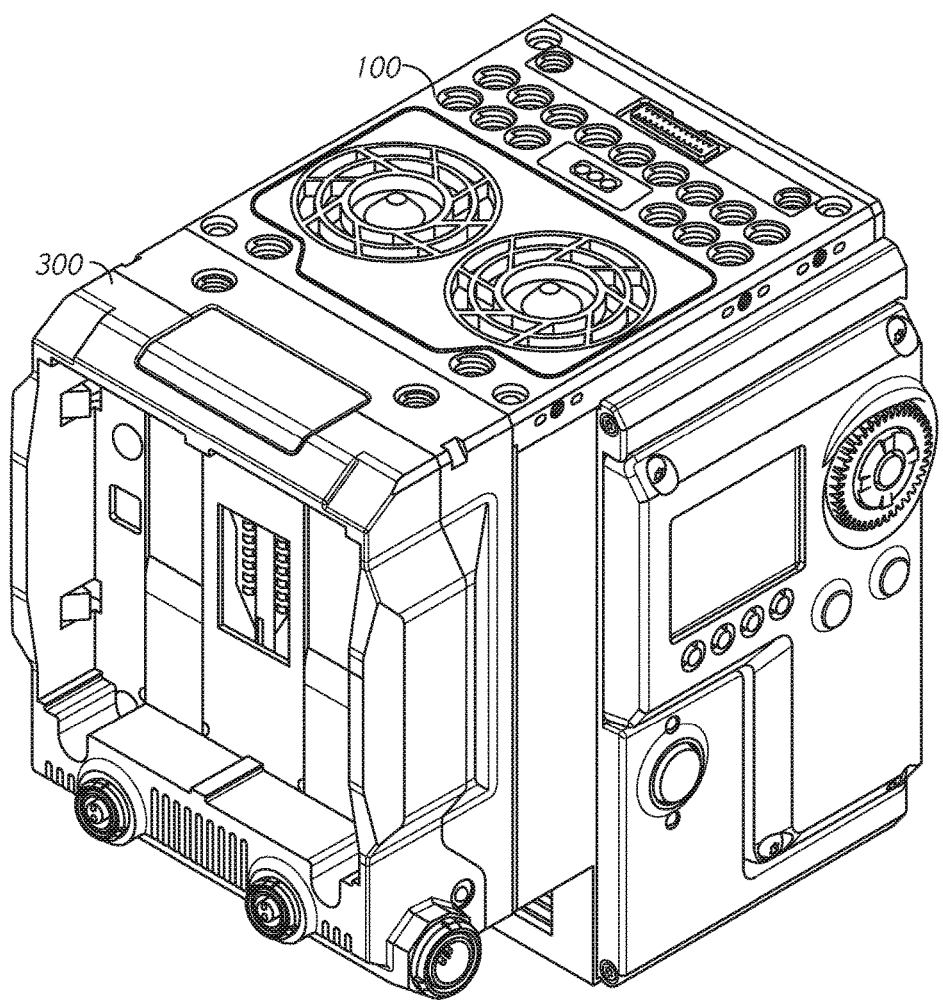
FIG. 3D is a perspective view of the power module of FIG. 3A when coupled to the brain module of FIG. 1C.

FIG. 3C illustrates the power module 300 aligned for coupling with the brain module 100. Once the power module 300 has been moved sufficiently close to the brain module 100, the power module 300 can electrically and mechanically couple as described herein. FIG. 3D illustrates the power module 300 once coupled directly to the brain module 100.

Figure 3E:
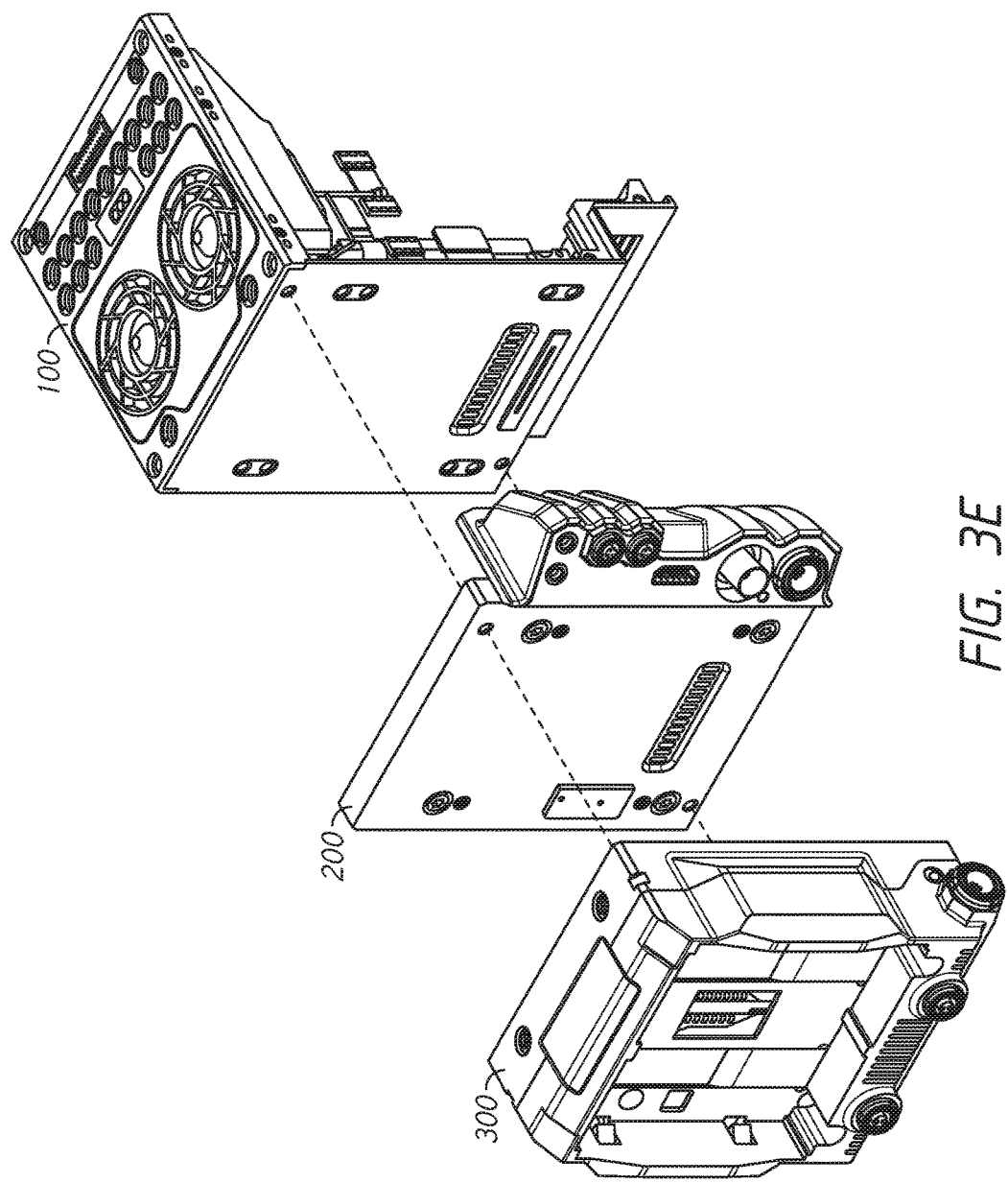
FIG. 3E is a perspective view of the power module of FIG. 3A aligned for coupling with the port extender module of FIG. 2A and the brain module of FIG. 1C.
Figure 3F:
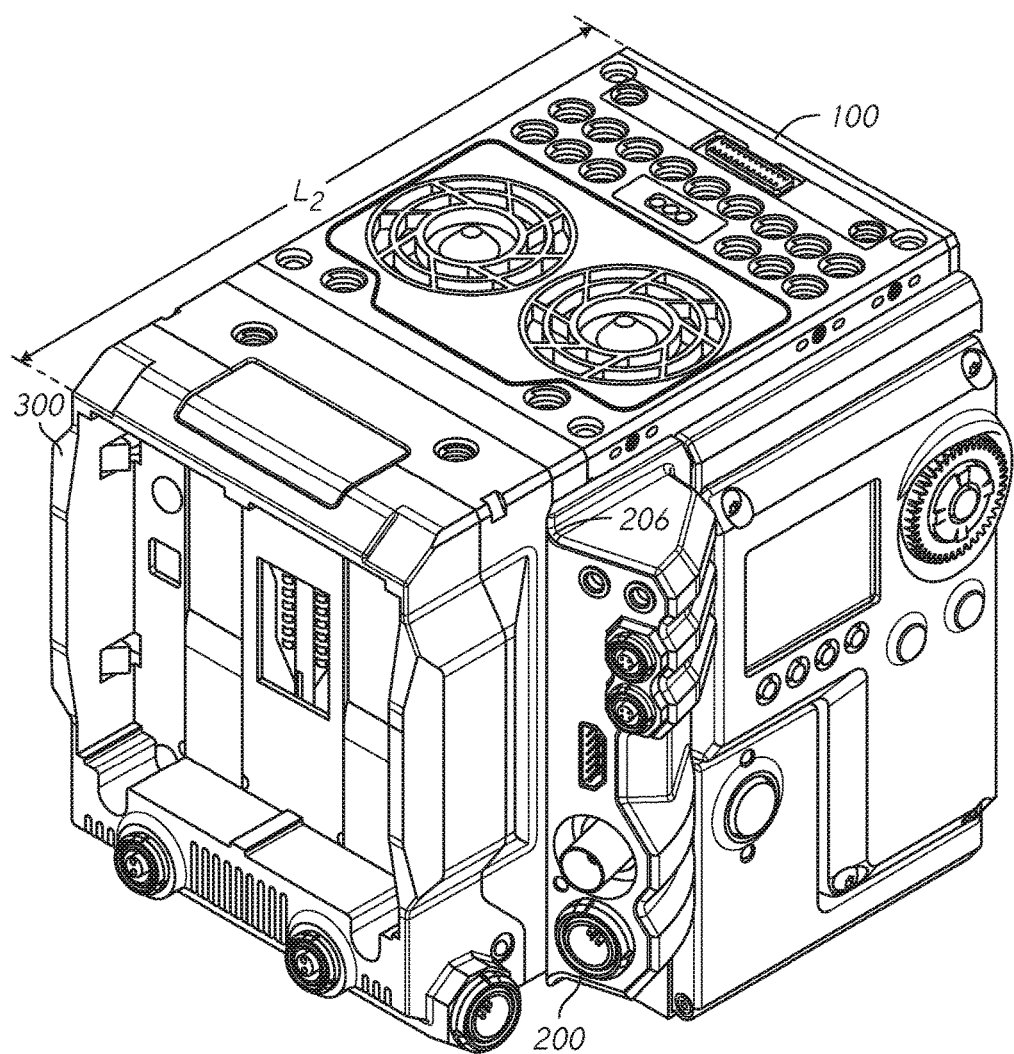
FIG. 3F is a perspective view of the power module of FIG. 3A when coupled to the port extender module of FIG. 2A and the brain module of FIG. 1C.

FIG. 3E illustrates the power module 300 aligned for coupling with the port extender module 200 and the brain module 100. Once the power module 300 has been moved sufficiently close to the port extender module 200 and the brain module 100, the power module 300 can electrically and mechanically couple. FIG. 3F illustrates the power module 300 once coupled directly to the port extender module 200, which in turn is coupled directly to the brain module 100. As shown in FIG. 3F, the front edge 206 of the side portion 204 of the input-output module 200 along the length of $D_2$, which is shown in FIG. 2A, can extend onto a surface of a side of the power module 300. In this manner, when the assembled camera includes the brain module 100, port extender module 200, and power module 300, inclusion of the port extender module 200 may add to the overall length $L_2$ of the assembled camera by the thickness T of the main portion 202 of the port extender module 200. In some embodiments, the length of $L_2$ can be within a range about 50 mm to about 300 mm, about 75 mm to about 250 mm, about 100 mm to about 200 mm, about 150 mm to 170 mm, or about 155 mm to about 160 mm. In one embodiment, the length of $L_2$ can be about 159 mm or about 158.8 mm.

FIG. 3G illustrates the back of the power module 300 when coupled to the port extender module 200 of FIG. 2A and the brain module 100 of FIG. 1A. As can be seen from FIG. 3G, the power module 300 can have a length $H_1$ such that a bottom of the power module 300 may not extend below the ledge 195 of the brain module 100 and block the one or more exhaust openings 192. As a result, the power module 300 can be successfully coupled to the brain module 100, and the brain module 100 can nonetheless direct air out of the one or more exhaust openings 192 to cool the components within the brain module 100.

Display Module

FIG. 4A is view of a front portion of a display module 400 of a modular camera system. The display module 400 can be electrically and mechanically coupled to the top or side of the housing 102 of the brain module 100 or another module and thereby provide the brain module 100 or another module with a display screen for displaying images, such as motion video captured by the brain module 100. The display module 400 can support and display video data for multiple different frame rates and resolutions, including 100 to 250 fps and "4 k" or "5 k" resolution mode. The images provided on the display module 400 can, in some instances, be used to assist in aiming the brain module 100.

The display module 400 can include a display screen, such as a 2.8, 4, 5, 7 or 9 inch LCD panel, light-emitting diode (LED) panel, or plasma display panel (PDP). The display module 400 can have other screen dimensions or include other display technologies in some implementations. The display screen of the display module 400 can rotate around at least two different axis, including the x-axis and y-axis provided in FIG. 4A. The display screen can accordingly at least tilt up and down and rotate side-to-side.

Figure 4B:
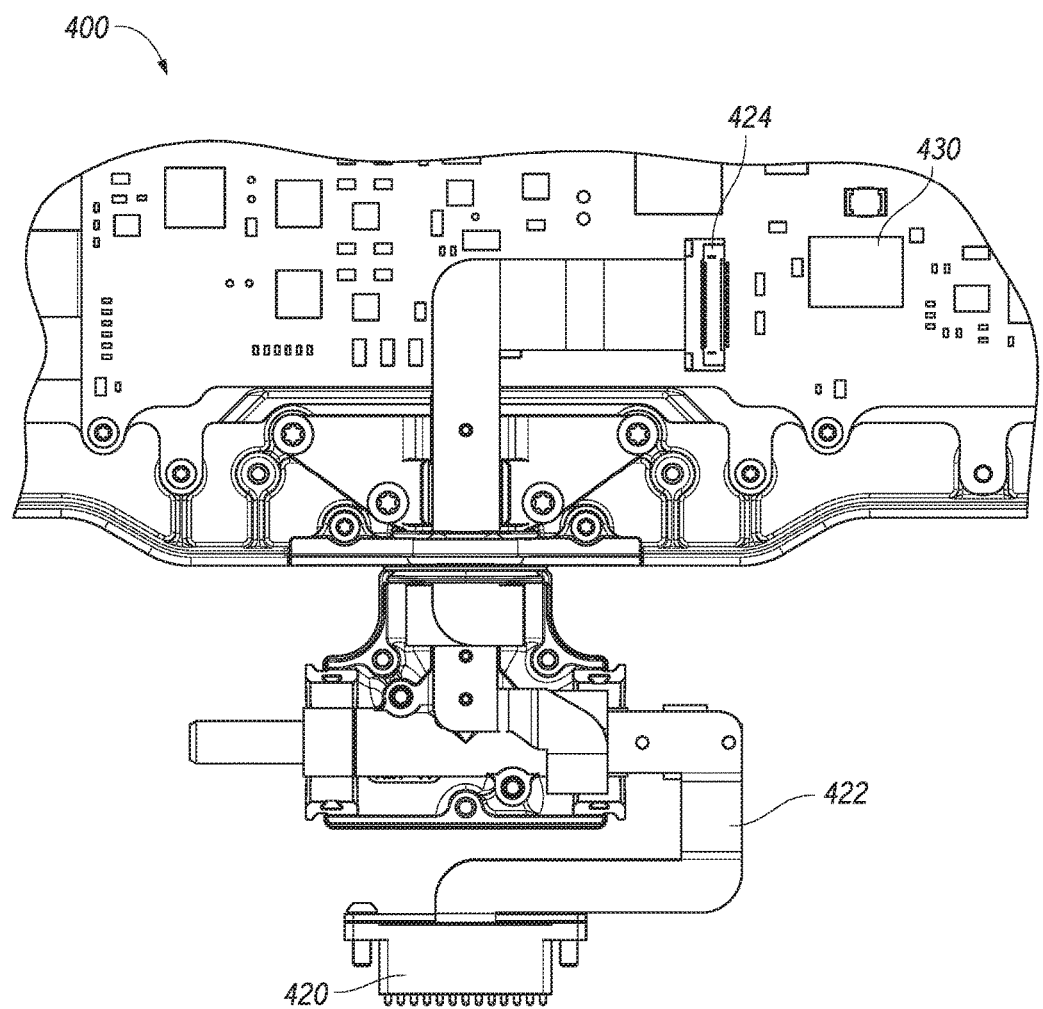
FIG. 4B is a view of a back of the display module of FIG. 4A depicting electrical components of the display module.
Figure 6A:
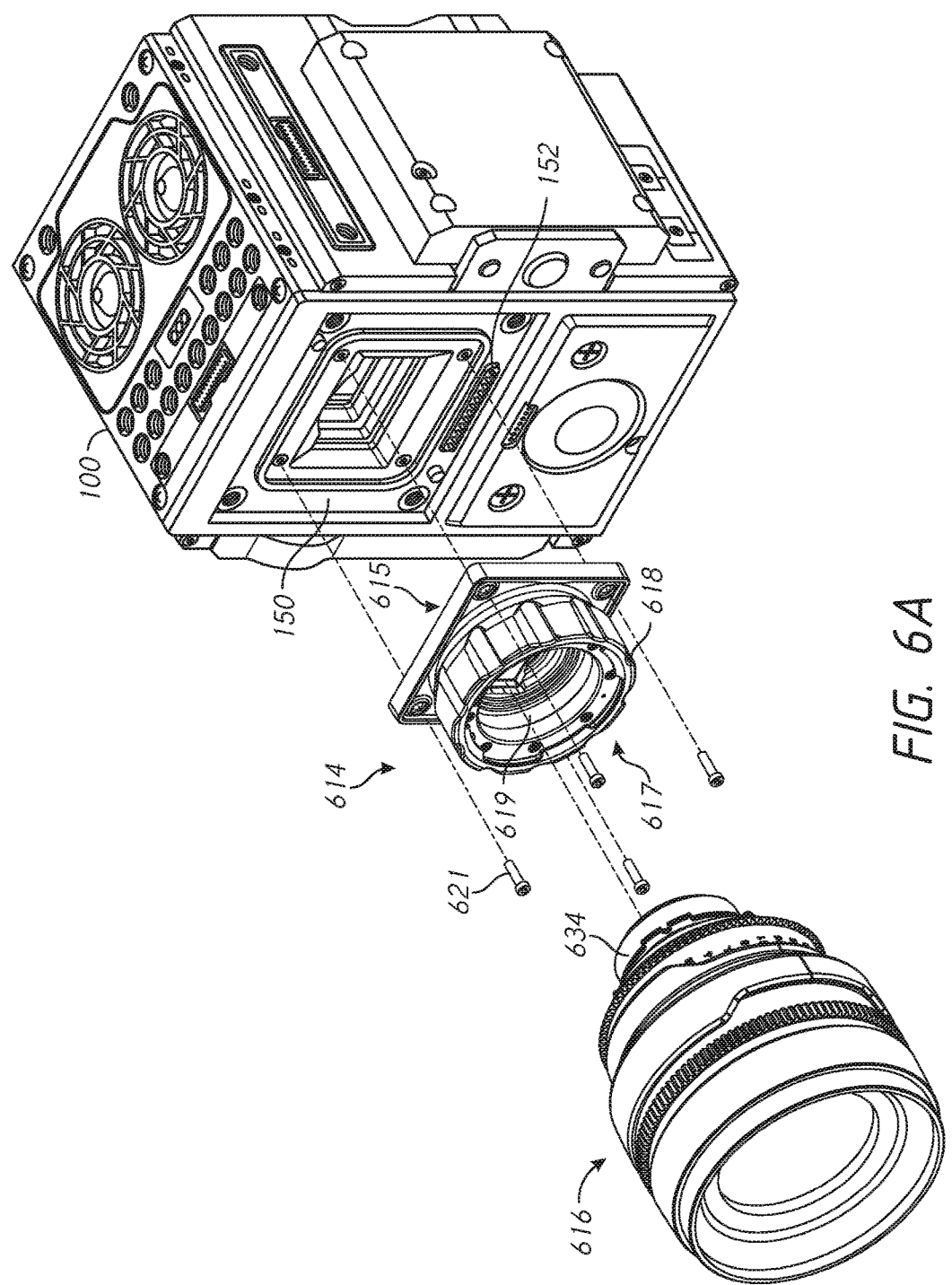
FIG. 6A is a perspective view of a front of an example lens and lens mount module aligned for coupling with the brain module of FIG. 1A.
Figure 6B:
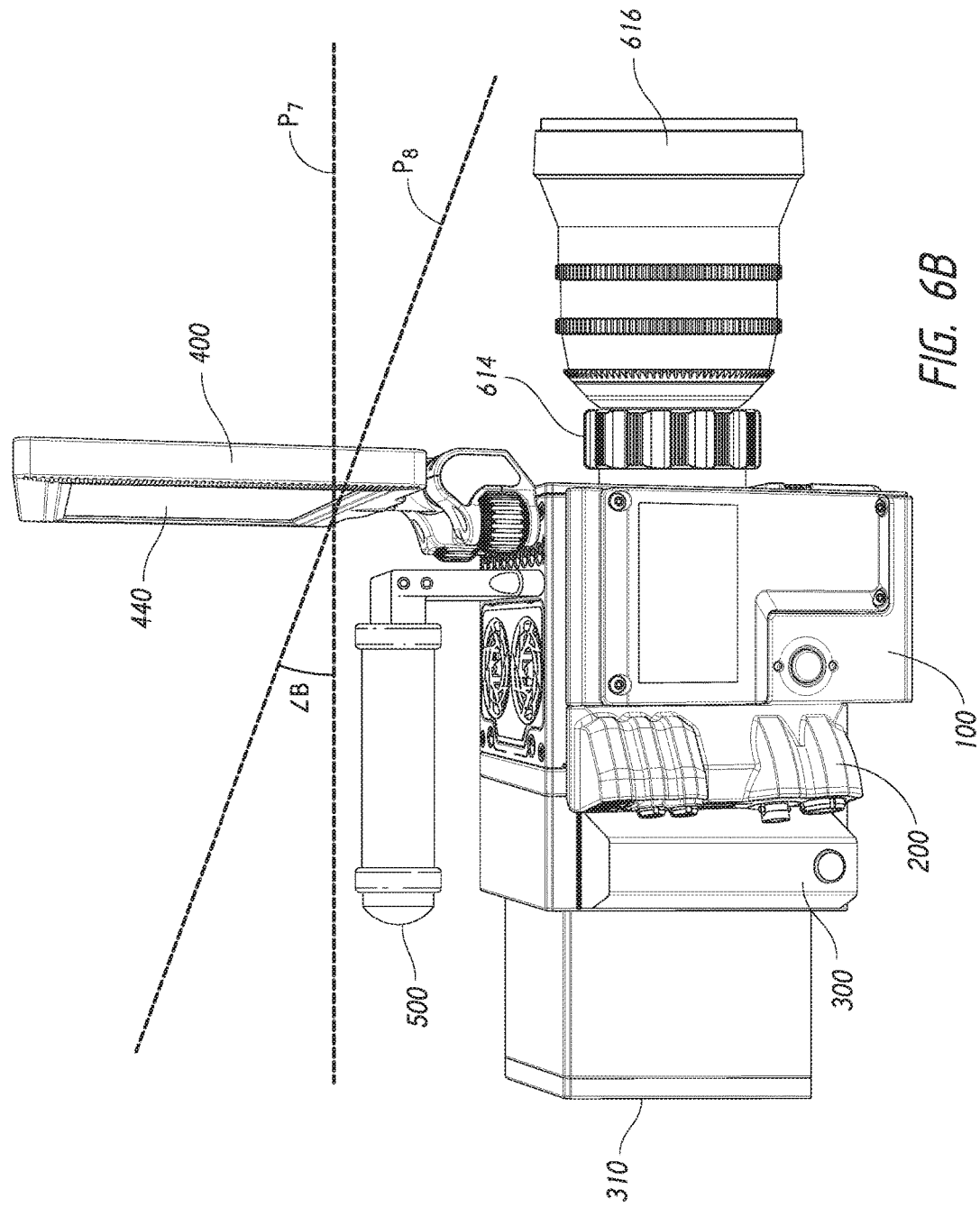
FIG. 6B is a view of a side of the brain module of FIG. 1A coupled to the port extender module of FIG. 2A, the power module of FIG. 3A, the display module of FIG. 4A, the handle module of FIG. 5A, and the lens and lens mount module of FIG. 6A.

As illustrated in FIGS. 4A and 6B, the display screen 440 (sometimes referred to as a viewing screen) of the display module 400 can be mounted to a supporting structure at a bottom of the display screen 440 rather than a left or right side of the display screen 440. As a result, the display screen can be robustly coupled to the supporting structure, and the display module 400 can stably support the weight of the brain module 100 if the display screen may be used as a handle for the brain module 100—although such use of the display module 400 may not be recommended or desirable. Furthermore, because the display screen can be mounted from the bottom rather than the left or right side of the display screen, the electrical coupling distance from the brain module 100 to the display screen (for example, to the circuitry within the display screen) can be reduced, enabling a higher rate of data or power transfer between the display module 400 and the brain module 100. An electrical coupling path 422 through the supporting structure are illustrated in FIG. 4B.

The display module 400 can include one or more interfaces for mechanically or electrically coupling to the housing 102 or another module. One of the interfaces of the display module 400 can be fasteners 410A, 410B. The fasteners 410A, 410B can, for instance, be used to mechanically secure the display module 400 to the top of the housing 102. Projections 412A, 412B of the fasteners 410A, 410B can inserted and secured in the mounting holes 112A, 112B by twisting ridges of the fasteners 410A, 410B so that the projections 412A, 412B are positioned in the mounting holes 112A, 112B. Another of the interfaces of the display module 400 can include a tenth module connector 420 for electrically and mechanically coupling the display module 400 to the first module connector 110 of the brain module 100 or another module. For example, an electrical coupling path can span from the tenth module connector 420, through one or more electrical wires 422, to a display electronics connector 424, and finally to display control electronics 430. The tenth module connector 420 can be structured complementary to the first module connector 110 to facilitate electrical and mechanical coupling with the first module connector 110. The tenth module connector 420 can extend a length of $D_4$ beyond a surface of a bottom of the display module 400, and the projections 412A, 412B can extend a length of $D_5$ beyond the surface of the bottom of the display module 400 where $D_5$ may be greater than $D_4$. Similarly, the fasteners 410A, 410B and the tenth module connector 420 can be respectively coupled to the mounting holes 142A, 142B and the third module connector 140. In some instances, one display module 400 can be coupled to the mounting holes 112A, 112B and the first module connector 110, and another display module 400 can at the same time be coupled to the mounting holes 142A, 142B and the third module connector 140.

In some embodiments, the length of $D_4$ can be within a range about 0.5 mm to about 6 mm, about 1 mm to about 4 mm, about 1.5 mm to about 3.5 mm, about 2 mm to 3 mm, or about 2.4 mm to about 2.6 mm. In one embodiment, the length of $D_4$ can be about 2.5 mm. In some embodiments, the length of $D_5$ can be within a range about 0.5 mm to about 9 mm, about 1 mm to about 7 mm, about 2 mm to about 6 mm, about 3 mm to 5 mm, or about 3.5 mm to about 4.5 mm. In one embodiment, the length of $D_5$ can be about 4 mm.

In some embodiments, the tenth module connector 420 can include multiple electrical conductors (for instance, twenty-six electrical conductors), an outer projection ring, and a conductor supporting member that surrounds and supports the multiple electrical conductors. The multiple electrical conductors can be positioned in one or more conductor rows (for instance, two rows) within the conductor supporting member. The multiple electrical conductors can be positioned to extend parallel to a surface of the display screen rather than perpendicular to the surface of the display screen. The exposed surface of the conductor supporting member can be recessed relative to an end of the outer projection ring and ends of multiple electrical conductors. The multiple electrical conductors can be, for example, spring-loaded electrical connectors. The impedance of each of one or more of the multiple electrical conductors may not, in some implementations, vary as the spring of the spring-loaded connector stretches or compresses. The multiple electrical conductors can move toward and away from the display screen 440 as the tenth module connector 420 is positioned next to, for instance, the first module connector 110 of the brain module 100 or another module. The outer projection ring can be designed to fit, for example, within the channel 114 in the surface of the top of the housing 102 and assist with aligning and securing the display module 400 when mounted to the brain module 100. Moreover, the electrical conductors can extend in the same direction as the projections 412A, 412B.

Advantageously, in certain embodiments, by using spring-loaded electrical connectors as the multiple electrical conductors of the tenth module connector 420 and fixed connectors as the multiple electrical conductors of the first and third module connectors 110, 140, wear in the coupling interface between the display module 400 and the brain module 100 can primarily occur at the display module 400 rather than the brain module 100. This can be desirable, for instance, because the display module 400 may be less expensive to replace or easier to repair than the brain module 100.

Moreover, this connection interface can avoid the use of a cable to connect the display module 400 and the brain module 100. A cable can (i) be particularly susceptible to damage and wear, (ii) represent an additional component in a modular camera system that already includes multiple components, (iii) hang off from a modular camera system such that, for instance, forces on the cable place stresses on the coupling interfaces of the display module 400 or the brain module 100, or (iv) provide an unpredictable electrical coupling distance that may diminish a rate of data or power transfer used between the display module 400 and the brain module 100. In some implementations, a cable like an extension cable may nonetheless be used to couple the display module 400 and the brain module 100.

Figure 4C:
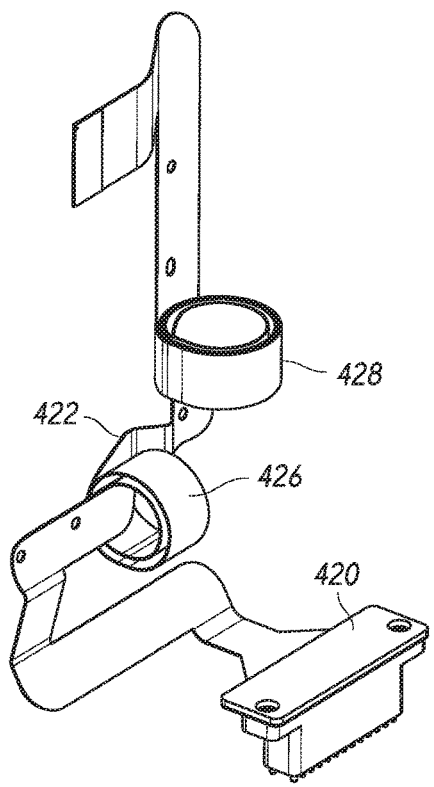
FIG. 4C is a perspective view of electrical components of the display module of FIG. 4A.
Figure 4D:
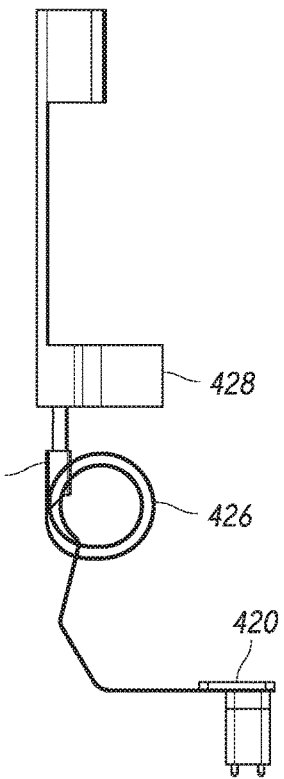
FIG. 4D is a side view of the electrical components of FIG. 4C.
Figure 4E:
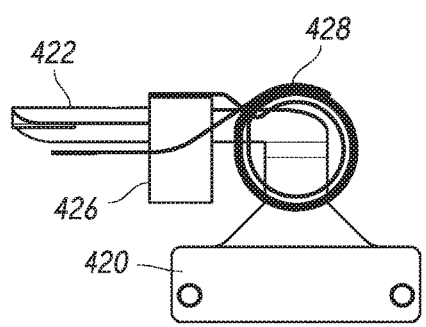
FIG. 4E is a top view of the electrical components of FIG. 4C.

FIGS. 4C-4E depict the electrical coupling path through the one or more electrical wires 422 in detail. As can be seen, the one or more electrical wires 422 can include a first spiral configuration 426 and a second spiral configuration 428 that may provide the display module with two axis of rotation while permitting the wiring for the display module 400 to be internal to the housing of the display module 400.

Figure 4F:
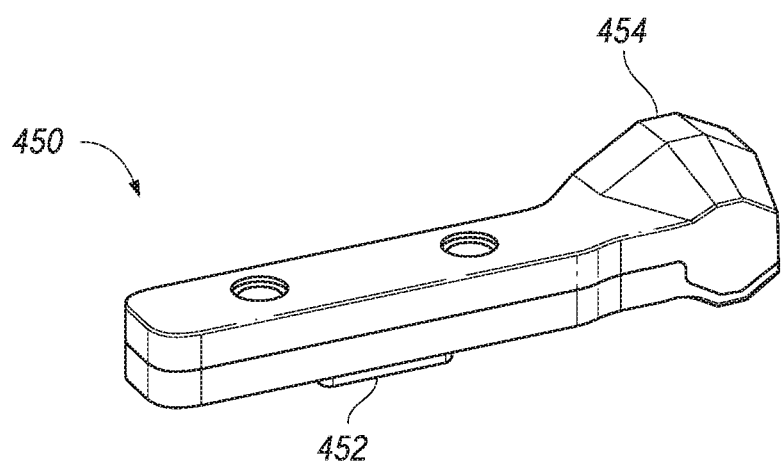
FIG. 4F is a perspective view of an example male adapter usable with the display module of FIG. 4A.
Figure 4G:
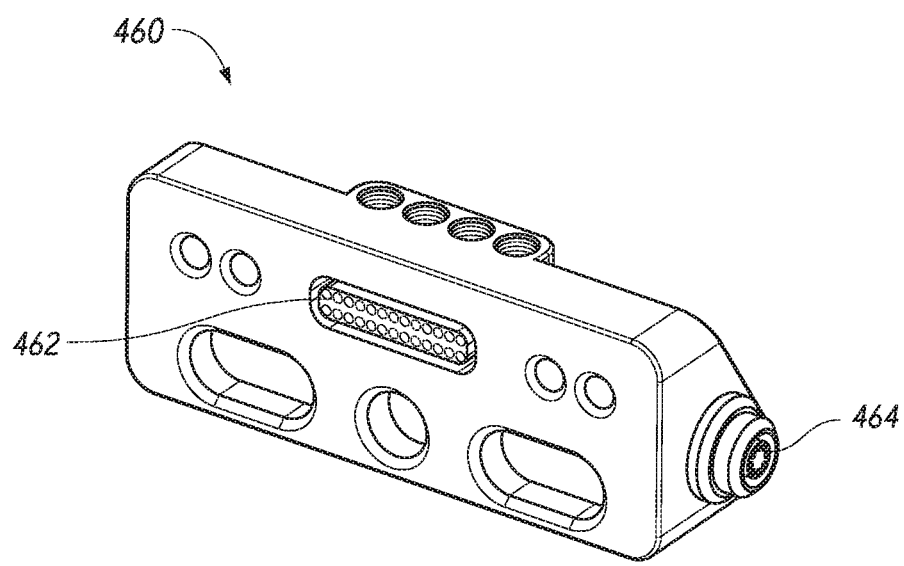
FIG. 4G is a perspective view of an example female adapter usable with the display module of FIG. 4A.

One or more adapters can additionally be used to address connection interface compatibilities between a display module and the brain module 100 in some embodiments. For instance, a first adapter 450 illustrated in FIG. 4F may comprise a plastic housing having a first connector portion 452 that is similar to the connector 420 of the display module 400 including spring-loaded pins and configured to mate with the module connectors 110, 140 of the brain module 100. The first adapter 450 can further include a second connector portion 454 implementing a different interface type. For instance, the second connector portion 454 can be provided on another or an opposite face of the housing of the first adapter 450 than the first connector 452. The first adapter 450 can further include wiring, circuitry, or any other appropriate electronics configured to (1) physically route the signals received by the first connector portion 452 onto pins of the second connector portion 454, or (2) process the signals as appropriate for delivery to the second connector portion 454, for example, to comply with a standard or specification associated with the second connector 454. FIG. 4G illustrates a second adapter 460 that includes opposite interfaces relative to the first adapter 450. A third connector portion 462 of the second adapter 460 is a female connector corresponding to the male connector of the first connector portion 452, and a fourth connector portion 464 of the second adapter 460 is a male connector corresponding to the female connector of the first connector portion 454.

As one example, an output connecter of an adapter can be an HDMI-compliant (e.g., HDMI Type A or HDMI Type D) connector, allowing connection to HDMI cables. As another example, an output connector of an adapter can be a LEMO connector (e.g., 4 pin or 6 pin LEMO connector), allowing connection to LEMO cables.

In addition, this coupling interface can enable quicker and easier coupling and decoupling relative to some other coupling interfaces as the display module 400 can be directly mounted to the brain module 100. The ease and reliability of coupling can be facilitated, in some embodiments, by the use of thumb screws as the fasteners 410A, 410B. The thumb screws can (i) enable quick and easy coupling of the display module 400 to the brain module 100 without use of a mechanical tool, such as a wrench, screw driver, or the like, (ii) be used for multiple coupling cycles without wearing out, and (iii) provide a strong and stable mount relative to some other coupling interfaces such as a v-mount interface. Further, the thumb screws can be positioned on the outside ends of the supporting structure of the display module 400 as illustrated so that a user may have easy access to the ribs of the thumb screws for securing and releasing the display module 400.

Figure 4H:
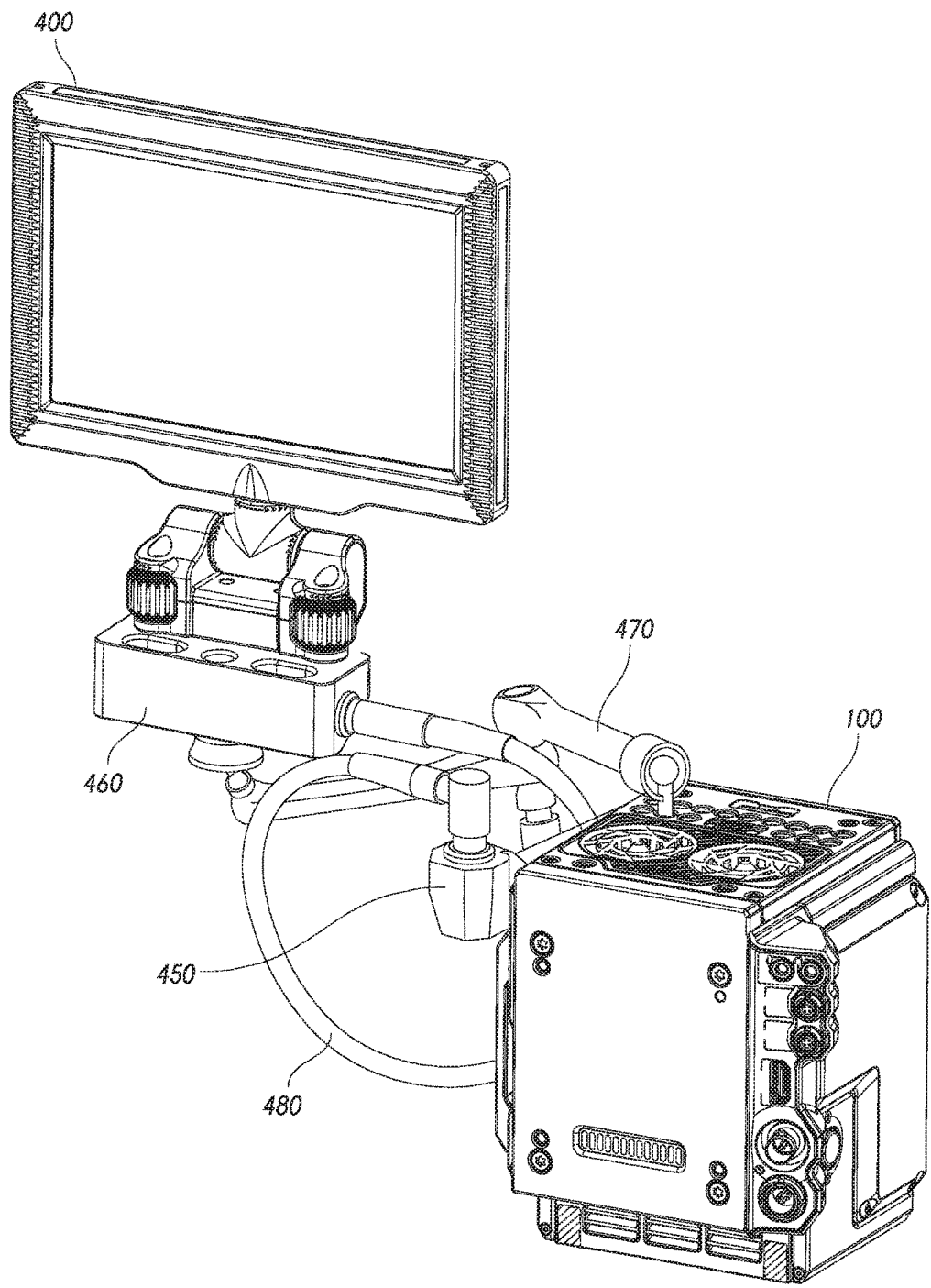
FIG. 4H is a perspective view of the brain module of FIG. 1C coupled to the display module of FIG. 4A using the male adapter of FIG. 4F and the female adapter of FIG. 4G.

FIG. 4H is a perspective view of the brain module 100 electrically coupled to the display module 400 using the first adapter 450 and the second adapter 460. The first adapter 450 and the second adapter 460 are electrically coupled via a cable 480, and the weight of the display module 400 can be supported by the brain module 100 via a support arm 470.

Handle Module

Figure 5A:
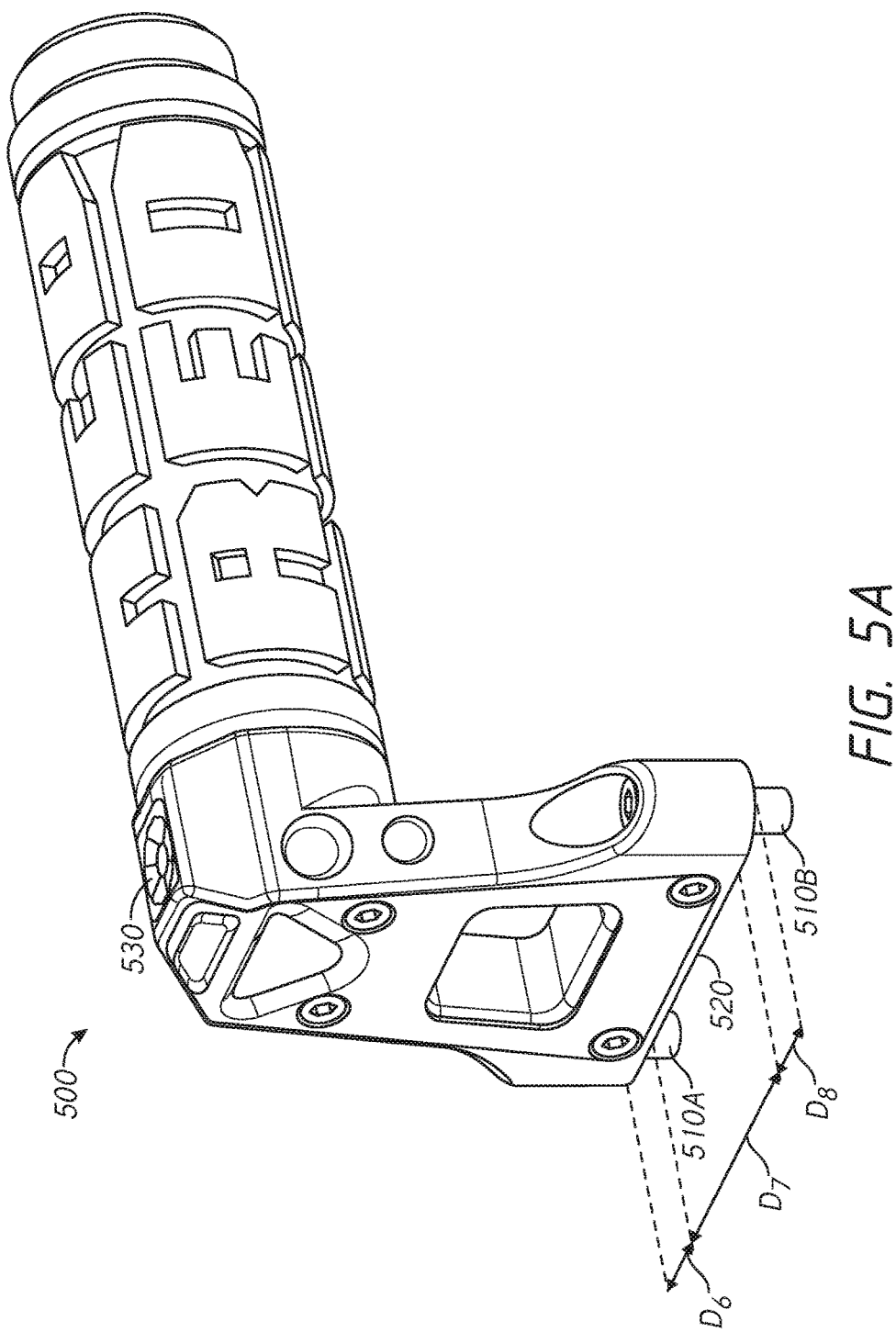
FIG. 5A is a perspective view of a front of an example handle module of a modular camera system.

FIG. 5A depicts a handle module 500. The handle module 500 can be electrically and mechanically coupled to the top of the housing 102 of the brain module 100 or another module and thereby provide the brain module 100 or another module with a handle for carrying the brain module 100 or another module, as well as a user interface for interacting with the brain module 100 or another module.

The handle module 500 can include one or more interfaces for mechanically or electrically coupling to the housing 102 or another module. One of the interfaces of the handle module 500 can be fasteners 510A, 510B. The fasteners 510A, 510B can, for instance, be used to mechanically secure the handle module 500 to the top of the housing 102. Projections of the fasteners 510A, 510B can inserted and secured in the mounting holes 122A, 122B by twisting the fasteners 510A, 510B so that the projections are positioned in the mounting holes 122A, 122B. Another of the interfaces of the handle module 500 can include an eleventh module connector 520 for electrically and mechanically coupling the handle module 500 to the second module connector 120 of the brain module 100 or another module. The eleventh module connector 520 can be structured complementary to the second module connector 120 to facilitate electrical and mechanical coupling with the second module connector 120.

The handle module 500 can be usable in combination with the display module 400 when operating the brain module 100. For example, the handle module 500 can be coupled to the mounting holes 122A, 122B and the second module connector 120, and display modules like the display module 400 can at the same time be coupled to one or both of (i) the mounting holes 112A, 112B and the first module connector 110 and (ii) the mounting holes 142A, 142B and the third module connector 140. As a result, when the handle module 500 is used in combination with the display module 400, the handle module 500 can be positioned proximate to the display module 400 so that users can be prevented from or less likely to carry the brain module 100 using the display module 400 than the handle module 500. This can reduce stresses on the components of the display module 400 as well as the components of the brain module 100. Furthermore, the handle module 500 can, and in the illustrated embodiment is, structured in shape or size to prevent obstructing some or all of the view of the display screen of the display module 400 when both the handle module 500 and the display module 400 may be coupled to the top of the housing 102.

Figure 5B:
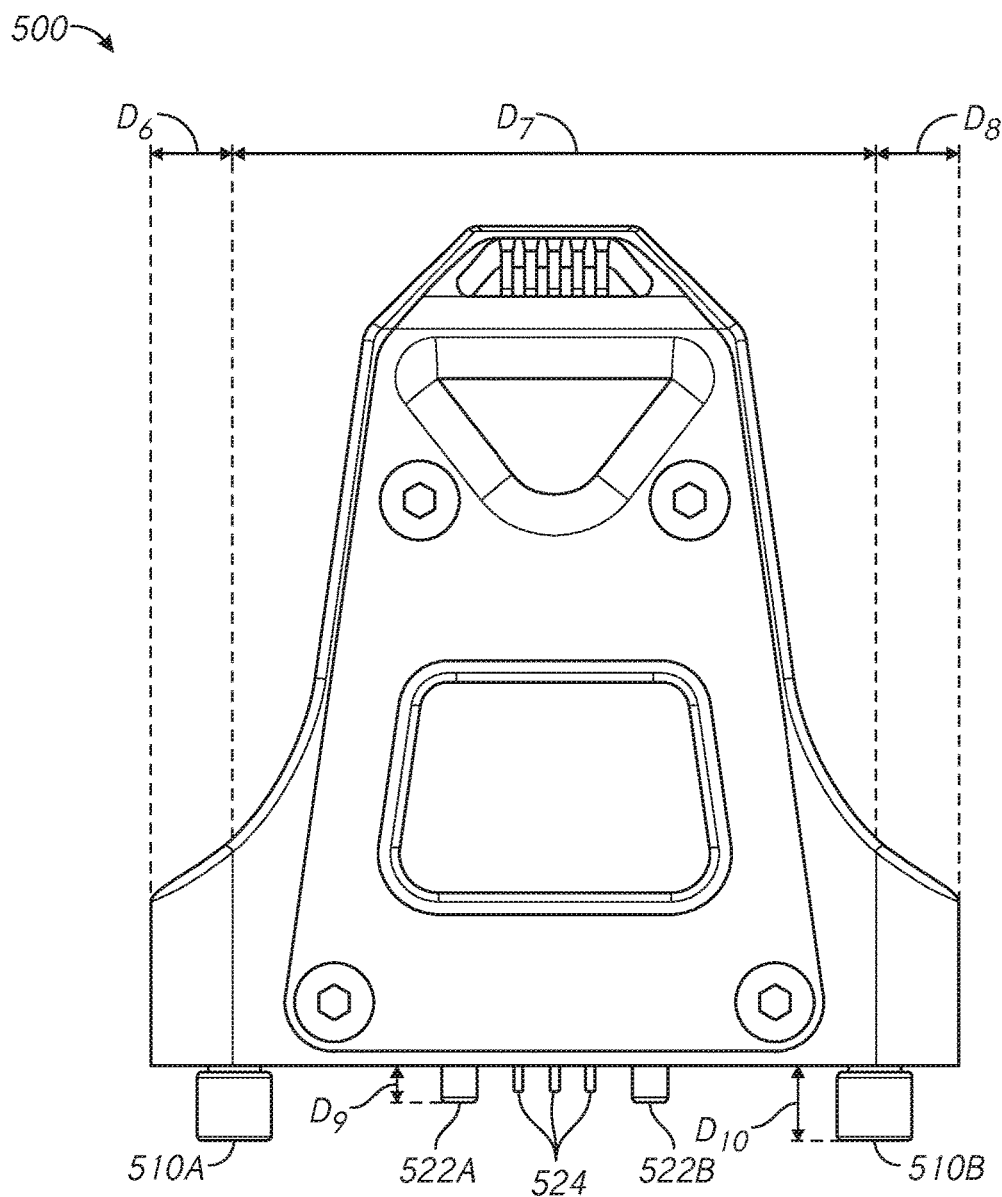
FIG. 5B is a view of the front of the handle module of FIG. 5A.

In some embodiments, as shown in FIG. 5B, the eleventh module connector 520 can include multiple electrical conductors 524 (for instance, three electrical conductors) and a conductor supporting member that surrounds and supports the multiple electrical conductors 524. The multiple electrical conductors 524 can be positioned in one or more conductor rows (for instance, one row) within the conductor supporting member. The multiple electrical conductors 524 can be positioned to extend perpendicular to an extending direction of a carrying handle of the handle module 500. The exposed surface of the conduct supporting member can be recessed relative to ends of the multiple electrical conductors 524. The multiple electrical conductors 524 can be, for example, spring-loaded electrical connectors. The impedance of each of one or more of the multiple electrical conductors 524 may not, in some implementations, vary as the spring of the spring-loaded connector stretches or compresses. The multiple electrical conductors 524 can move toward and away from the carrying handle as the eleventh module connector 520 is positioned next to, for instance, the second module connector 120 of the brain module 100 or another module.

The eleventh module connector 520 can further include projections 522A, 522B to assist in aligning and securing the handle module 500 with the top of the housing 102 or another module. The eleventh module connector 520 can extend a length of $D_9$ beyond a surface of a bottom of the handle module 500, and the fasteners 510A, 510B can extend a length of $D_{10}$ beyond the surface of the bottom of the handle module 500 where $D_{10}$ may be greater than $D_9$. In this matter, an amount of torque placed on the eleventh module connector 520 can, for example, be reduced or minimized relative to an amount of torque placed on the fasteners 510A, 510B when the handle module 500 may be coupled to the brain module 100. In some embodiments, the length of $D_9$ can be within a range about 0.5 mm to about 6 mm, about 1 mm to about 4 mm, about 1.5 mm to about 3.5 mm, about 2 mm to 3 mm, or about 2.4 mm to about 2.6 mm. In one embodiment, the length of $D_9$ can be about 2.5 mm. In some embodiments, the length of $D_{10}$ can be within a range about 0.5 mm to about 9 mm, about 1 mm to about 7 mm, about 2 mm to about 6 mm, about 3 mm to 5 mm, or about 3.5 mm to about 4.5 mm. In one embodiment, the length of $D_{10}$ can be about 4 mm.

Advantageously, in certain embodiments, by using spring-loaded electrical connectors as the multiple electrical conductors of the eleventh module connector 520 and fixed connectors as the multiple electrical conductors of the second module connector 120, wear in the coupling interface between the handle module 500 and the brain module 100 can primarily occur at the handle module 500 rather than the brain module 100. This can be desirable, for instance, because the handle module 500 may be less expensive to replace or easier to repair than the brain module 100.

Moreover, this connection interface can avoid the use of a cable to connect the handle module 500 and the brain module 100. A cable can (i) be particularly susceptible to damage and wear, (ii) represent an additional component in a modular camera system that already includes multiple components, or (iii) hang off from a modular camera system such that, for instance, forces on the cable place stresses on the coupling interfaces of the handle module 500 or the brain module 100.

In addition, this coupling interface can enable quicker and easier coupling and decoupling relative to some other coupling interfaces as the handle module 500 can be directly mounted to the brain module 100. The ease and reliability of coupling can be facilitated, in some embodiments, by the use of screws as the fasteners 510A, 510B. The screws can (i) enable quick and easy coupling of the handle module 500 to the brain module 100 using a mechanical tool, such as a wrench, screw driver, or the like, (ii) be used for multiple coupling cycles without wearing out, and (iii) provide a strong and stable mount relative to some other coupling interfaces such as a v-mount interface. Further, the screws can be positioned on the outside ends of a supporting structure of the carrying handle of the handle module 500 as illustrated so that a user may have easy access to the screws for securing and releasing the handle module 500. As can be seen, the carrying handle may be within a length of $D_7$, and the fasteners 510A, 510B can be positioned outside the length of $D_7$ and the footprint of the carrying handle and be instead positioned within a length of $D_6$ and a length of $D_8$. The lengths of $D_6$ and $D_8$ can be the same in some implementations. In some embodiments, the length of $D_6$ can be within a range about 0.5 mm to about 30 mm, about 2 mm to about 20 mm, about 3 mm to about 15 mm, about 5 mm to 9 mm, or about 6 mm to about 8 mm. In one embodiment, the length of $D_6$ can be about 7 mm. In some embodiments, the length of $D_7$ can be within a range about 10 mm to about 100 mm, about 25 mm to about 80 mm, about 40 mm to about 70 mm, about 50 mm to 60 mm, or about 53 mm to about 55 mm. In one embodiment, the length of $D_7$ can be about 54 mm.

The handle module 500 can include a user interface 530. In some embodiments, the user interface 530 can be a button usable to provide a stop and stop recording command to the brain module 100, and the user interface 530 may not include any other user inputs, such as user inputs to control, select, or process audio input channels, audio input sources, audio input gain, audio lines, audio levels, or fix/variable/off settings for the brain module 100 or a device associated with the brain module 100. In such embodiments, the user interface can thus provide an intuitive and simple interface for controlling the brain module 100 using the handle module 500. The user interface 530 can further include, in some implementations, an indicator like a LED as part of the button that indicates when the handle module 500 may be powered or the brain module 100 may be recording.

Lens and Lens Mount Module

FIG. 6A is a perspective view of a front of a lens 616 and a front of a lens mount module 614 aligned for coupling with the brain module 100 of FIG. 1A. The lens mount module interface 150 of the brain module 100 can releasably mechanically couple to a complementary brain module interface 615 on the lens mount module 614. FIG. 6A illustrates the lens mount module 614 in a disassembled configuration. The lens mount module 614 can have a lens interface 617 for releasable connection to a complementary interface 634 on the lens 616.

For example, a user may releasably connect the lens mount module 614 to the brain module 100 using a plurality of mounting bolts 621. In other embodiments, the lens mount module 614 and corresponding portion of the lens mount module interface 150 can include other mounting mechanisms such as snap- or friction-fit mechanisms, threaded mounts, and the like.

The lens mount module interface 150 of the brain module 100 can include the lens connector 152. The lens connector 152 can connect to a corresponding electrical interface (not shown) on the brain module interface 615 of the lens mount module 614. The interfaces may comprise a variety of electrical connection types and allow for communication between the brain module 100 and one or more of the lens mount module 614 and the lens 616, for example. In some embodiments, the interfaces allow the brain module 100 to communicate drive signals to the lens 616 for controlling focusing of the lens 616.

In some embodiments, the lens mount interface 617 can include a locking ring 618 and an interior surface 619 defining an opening for receiving the lens 616. The locking ring 618 can be tightened by a user following insertion of the ring 618 into the opening, locking the lens 616 into place. A variety of mechanisms for fastening the lens 616 into place are further possible.

The brain module 100 can be further configured to cooperate with any of a variety of commercially available lens systems from a variety of lens manufacturers. Thus, a plurality of lens mount modules 614 may be provided, each having a brain module interface for releasable connecting to the brain module 100, and each having a unique lens interface such as RED-PL Mount RED Mini PL Mount (Red Digital Cinema Camera Company), PL Mount, Canon Mount, Nikon Mount, Medium Format Mount, Mamiya Mount, RED 617 Mount, Linhof Mount, Alpa Mount, and the like.

The lens mount interface 617 on the lens mount module 614 can also receive any of a plurality of different types of lens systems from the same lens mount type for example, but without limitation, various sizes of lens systems including a 50-100 millimeter (T3) zoom lens, a 50-150 millimeter (T3) zoom lens, an 18-50 millimeter (T3) zoom lens, an 18-85 millimeter (T2.9) zoom lens, a 300 millimeter (T2.8) lens, 18 millimeter (T2.9) lens, 25 millimeter (T1.8) lens, 35 millimeter (T1.8) lens, 50 millimeter (T1.8) lens, 85 millimeter (T1.8) lens, 85 millimeter (T1.8) lens, 100 millimeter (T1.8) or any other lens. In certain embodiments, a 50-100 millimeter (F2.8) zoom lens, an 18-50 millimeter (F2.8) zoom lens, a 300 millimeter (F2.8) lens, 15 millimeter (F2.8) lens, 25 millimeter (F1.9) lens, 35 millimeter (F1.9) lens, 50 millimeter (F1.9) lens, 85 millimeter or (F1.9) lens may be used. Each lens mount module is customized to a corresponding lens or lenses such that despite which complementary lens mount module—lens assembly is attached thereto, images can be properly focused upon a light-sensitive surface of the image sensor in the brain module 100.

Example Embodiments

FIG. 6B illustrates an example modular camera system in accordance with certain embodiments described herein. In particular, FIG. 6B is a view of a side of the brain module 100 of FIG. 1A coupled to the port extender module 200 of FIG. 2A, the power module 300 of FIG. 3A, the display module 400 of FIG. 4A, the handle module 500 of FIG. 5A, and the lens 616 and lens mount module 614 of FIG. 6A according to one embodiment. The plane $P_8$ is orthogonal to the display screen 440 and can be considered to move with the display module 400 as the display module 400 tilts towards and away from the lens. When the display screen 440 may be positioned parallel to the front surface of the brain module, the plane $P_8$ can overlap with the plane $P_7$ rather than being separated by an angle $\angle B$ as illustrated in FIG. 6B. Advantageously, in certain embodiments, when the plane $P_8$ overlaps with the plane $P_7$, the bottom of the display screen 440 can be positioned about a top level of the handle module 500 so that the handle module 500 may not obstruct the display screen 440.

In some embodiments, a cable-less camera display is disclosed. The cable-less camera display includes an electronic display screen, a mount, a screen support, and one or more electrical wires. The electronic display screen comprising a viewing surface and control electronics. The mount comprising: a camera mounting surface, a multi-contact electrical connector positioned on the camera mounting surface and configured for direct, cable-less connection to a corresponding connector provided on a corresponding mounting surface of a camera, and at least one fastener configured for hand-manipulation by a user to secure the mount to the camera. The screen support defining an opening and holding the electronic display screen such that the viewing surface is visible through the opening, the screen support rotatably attached to the mount via a first interface between the screen support and the mount to allow rotation of the viewing surface about a first axis of rotation. The one or more electrical wires are connected to the control electronics and extending from the control electronics to the first interface through an interior of the screen support, passing through a channel defined by the first interface into an interior of the mount, and extending through the interior of the mount.

The cable-less camera display of the preceding paragraph can include one or more of the following features: The at least one fastener comprises two fasteners, and each of the two fasteners comprises at least one thumbscrew. The at least one fastener comprises two fasteners, and the two fasteners are situated on opposing sides of the multi-contact electrical connector from one another. The one or more electrical wires pass through the first interface by extending around a pivot point of the first axis. The one or more electrical wires pass through the first interface by extending at least two times around a pivot point of the first axis. The first interface is arranged below the electronic display screen. The first interface includes first and second junctions between the screen support and the mount, and the first and second junctions are spaced from one another by a distance of less than a width of the electronic display screen. The first and second junctions are equidistant from and on opposing sides of a vertical center line of the electronic display screen. The screen support includes a first portion and a second portion, the first portion defining the opening, the second portion attached to the mount at the first interface and rotatably attached to the first portion at a second interface to allow rotation of the viewing surface about a second axis of rotation substantially perpendicular to the first axis. The one or more electrical wires extend from the electronic display screen to the second interface through an interior of the first portion, pass through the second interface into an interior of the second portion, extend through the interior of the second portion to the first interface, pass through the first interface into the interior of the mount, and extend through the interior of the mount to the multi-contact electrical connector. The one or more electrical wires pass through the first interface by extending at least two times around a pivot point of the first axis, and the one or more electrical wires pass through the second interface by extending at least two times around a pivot point of the second axis. The viewing surface is rotatable about the first axis between a fully rearwardly tilted position and a fully forwardly tilted position; a fully vertical position of the electronic display screen lies between the fully rearwardly and fully forwardly tilted positions; and the multi-contact electrical connector is configured to mate with the corresponding connector by joining the multi-contact electrical connector and the corresponding connector along a connection path that is parallel to a straight line extending from a center of a top of the viewing surface through a center of the bottom of the viewing surface when the electronic display screen is in the fully vertical position. The multi-contact electrical connector comprises a plurality of spring-loaded connectors arranged in two rows. A total number of spring-loaded connectors in the plurality of spring-loaded connectors is twenty-six. At least twelve of the plurality of spring-loaded connectors are connected to a common electrical ground. The control electronics are configured to receive a first signal from the camera via a first spring-loaded connector and a second spring-loaded connector of the plurality of spring-loaded connectors, the first signal comprising a differential signal.

In some embodiments, a camera is disclosed. The camera comprising: a camera body comprising: a first surface comprising an opening through which light enters the camera body, a second surface on an opposite side of the camera body from the first surface, and a third surface connecting the first surface and the second surface, the third surface comprising a first display mounting surface, the first display mounting surface comprising a first multi-contact display connector and a plurality of first mounting holes, two of the plurality of first mounting holes situated on opposing sides of the first multi-contact display connector; an electronic display screen comprising a viewing surface and control electronics; a mount comprising: a camera mounting surface, a multi-contact camera connector positioned on the camera mounting surface and configured to connect to the first multi-contact display connector, and a plurality of thumbscrews configured to secure the mount to the plurality of first mounting holes; a screen support defining an opening and holding the electronic display screen such that the viewing surface is visible through the opening, the screen support rotatably attached to the mount via a first interface between the screen support and the mount to allow rotation of the viewing surface about a first axis of rotation; one or more first electrical wires connected to the control electronics and extending from the control electronics to the first interface through an interior of the screen support, passing through a channel defined by the first interface into an interior of the mount, and extending through the interior of the mount; and a processor positioned in the camera body, the processor configured to communicate display data to the control electronics via the first multi-contact display connector, the multi-contact camera connector, and the one or more first electrical wires so that the viewing surface presents images responsive to the display data.

The camera of the preceding paragraph can include one or more of the following features: The third surface is a top surface of the camera body. The third surface is substantially perpendicular to the first surface. The camera body comprises a fourth surface connecting the first surface and the second surface, the fourth surface comprising a second display mounting surface, the second display mounting surface comprising a second multi-contact display connector and a plurality of second mounting holes, two of the plurality of second mounting holes situated on opposing sides of the second multi-contact display connector; the multi-contact camera connector is configured to connect to the second multi-contact display connector; and the plurality of thumbscrews are configured to secure the mount to the plurality of second mounting holes. The third surface is a top surface of the camera body, and the fourth surface is a side surface of the camera body. The third surface is substantially perpendicular to the fourth surface. The camera body does not comprise a cover configured to cover the first multi-contact display connector. The multi-contact camera connector comprises a plurality of spring-loaded connectors, and the multi-contact display connector comprises a plurality of fixed connectors. The third surface comprises a handle mounting surface, the handle mounting surface comprising a multi-contact handle connector and a plurality of second mounting holes, two of the plurality of second mounting holes situated on opposing sides of the multi-contact handle connector; the camera further comprises a handle including: a multi-contact accessory connector positioned on an accessory mounting surface and configured to connect to the multi-contact handle connector, a plurality of fasteners configured to secure the handle to the plurality of second mounting holes, one or more user interface elements configured to receive a user input from a user, and one or more second electrical wires connected to the one or more user interface elements and extending from the one or more user interface elements to the multi-contact accessory connector through an interior of the handle; the processor is configured to perform an operation in response to receiving user input data from the handle via the one or more second electrical wires, the multi-contact handle connector, and the multi-contact accessory connector, the user input data responsive to the user input. When the mount is secured to the plurality of first mounting holes and the handle is secured to the plurality of second mounting holes, the handle is configured to not extend above a level of a bottom of the viewing surface when the viewing surface is positioned substantially perpendicular to the third surface.

Integrated Antenna

Figure 8A:
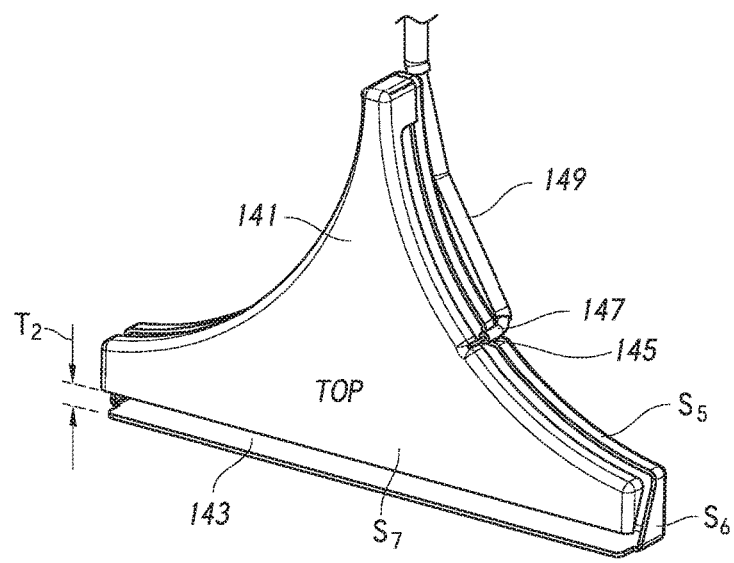
FIG. 8A is a perspective view of a top of an antenna of the brain module of FIG. 1A.
Figure 8B:
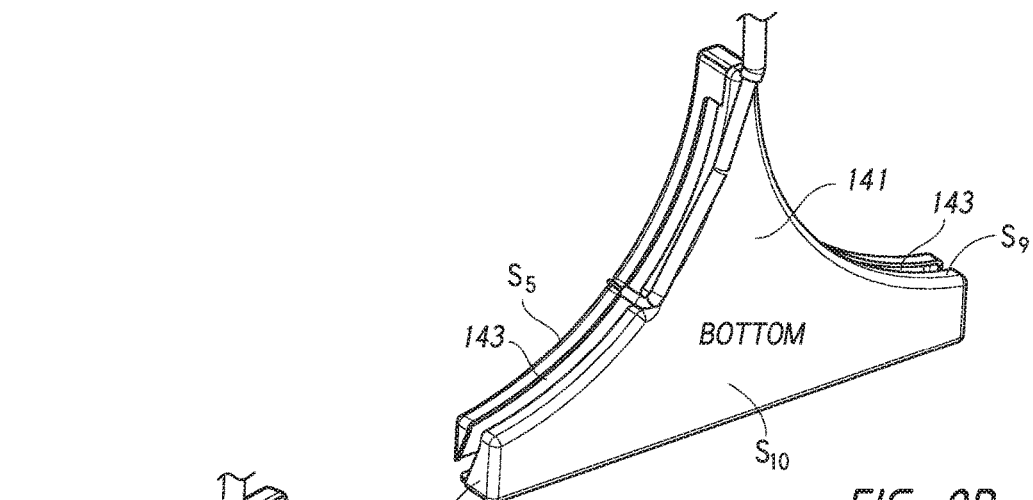
FIG. 8B is a first perspective view of a bottom of the antenna of FIG. 9A.
Figure 8C:
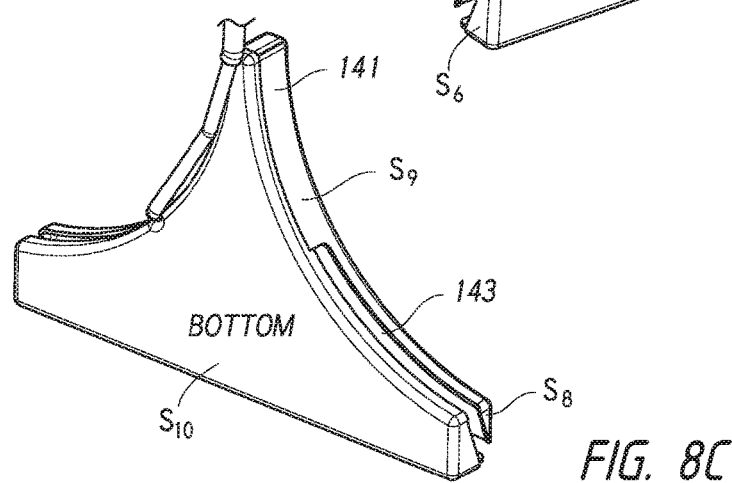
FIG. 8C is a second perspective view of a bottom of the antenna of FIG. 9A.

FIGS. 8A-8C illustrate an antenna 141 that can be integrated within the housing 102 of the brain module 100 of FIG. 1A as described herein. The illustration in FIGS. 8B and 8C depict a bottom of the antenna 141, and the illustration in FIG. 8A depicts a top of the antenna 141. The antenna 141 can be electrically coupled to one or more components of the brain module 100, such as a processor, to enable the one or more components of the brain module 100 to wirelessly communicate with other devices in the vicinity of the brain module 100 or with modules coupled to brain module 100.

The antenna 141 can be a slot antenna, such as a conformal cavity backed slot antenna, in some implementations. The antenna 141 can be constructed with the slot 143 (sometimes referred to as the antenna radiator) broken up over two orthogonal planes such that the radiation components generated by the antenna 141 can merge together to disburse radiated energy relatively evenly. Operations using the antenna 141 can be performed via a feedpoint 145, a ground point 147, and a coaxial cable 149.

As illustrated in FIG. 8A-8C, the slot 143 can extend continuously along the top $S_7$ of the antenna 141 and four sides $S_5$, $S_6$, $S_8$, and $S_9$ of the antenna 141 and may not extend along a tip side of the antenna 141, a side of the antenna 141 opposite the tip side, or a bottom $S_{10}$ of the antenna 141. The slot 143 can begin at a first side $S_5$ of the antenna 141 proximate the tip side, extend down the concave curved length of the first side $S_5$, diagonally cross (for instance, at an angle greater than 0° and less than 90°, such as 10°, 30°, 45°, 60°, 80°) the straight length a second side $S_6$ of the antenna 141, extend across the straight length of the top $S_7$ of the antenna 141, diagonally cross (for instance, at an angle greater than 0° and less than 90°, such as 10°, 30°, 45°, 60°, 80°) the straight length a third side $S_8$ of the antenna 141, and extend up the concave curved length of a fourth side $S_9$ of the antenna 141, and terminate proximate the tip side. The slot 143 on the first side $S_5$ and fourth side $S_9$ can be coplanar with respect one another, and the slot 143 on the second side $S_6$ and third side $S_8$ can extend parallel or be coplanar with respect one another.

The antenna 141 can desirably be structured, in certain embodiments, so that the antenna 141 can provide a relatively even radiation pattern even though the antenna 141 may be positioned within the housing 102 and below the top of the housing 102. The slot 143 may have a thickness of $T_2$, which can be about 1.35 mm or range from about 0.2 mm to about 10 mm, about 0.5 mm to about 3 mm, about 1 mm to about 1.7 mm, about 1.3 mm to about 1.4 mm. In other embodiments, different antenna structures can be used; for example, the slot 143 may not be continuous across the entire length and can be divided into two or more separate slots, or the antenna may include one or three or more concave curved lengths rather than two curved lengths.

In some embodiments, the antenna 141 can be a structure composed entirely of metal and hollow on the inside with potentially a non-conductive material (such as, a foam block) positioned inside. In other embodiments, the antenna 141 can be a structure including a flexible printed circuit (FPC) structure wrapped around a non-metal block (for example, a foam block). In yet other embodiments, the antenna 141 may have a further different structure. The antenna can be painted (such as to match a color of a part of the brain module 100 which the antenna is to be placed proximate) in some instances so as to partially or completely hide the antenna when viewing the housing 102.

Figure 8D:
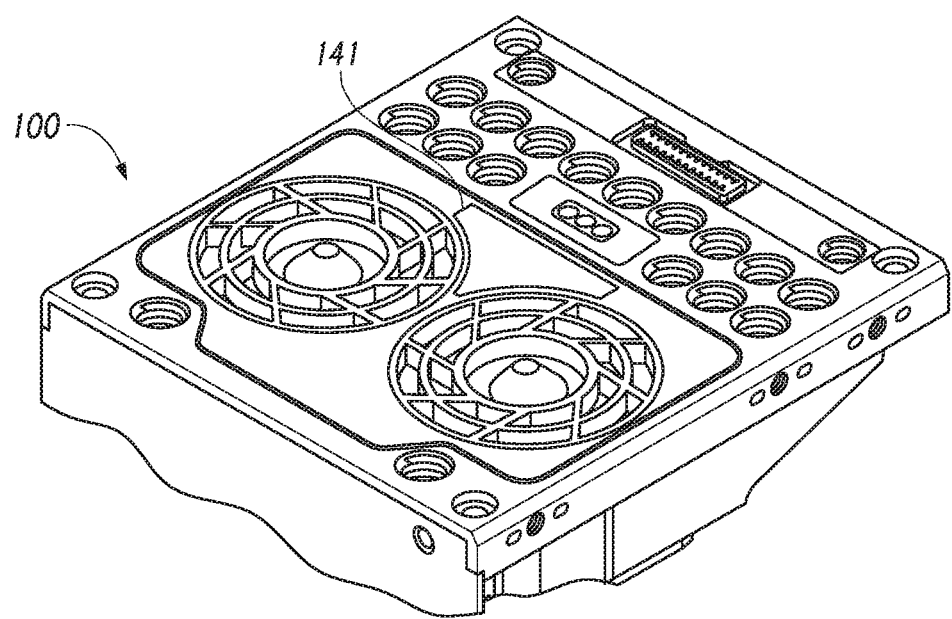
FIG. 8D is a magnified perspective view of a back of the brain module of FIG. 1A including denotation of a first example position of the antenna of FIG. 8A.
Figure 8E:
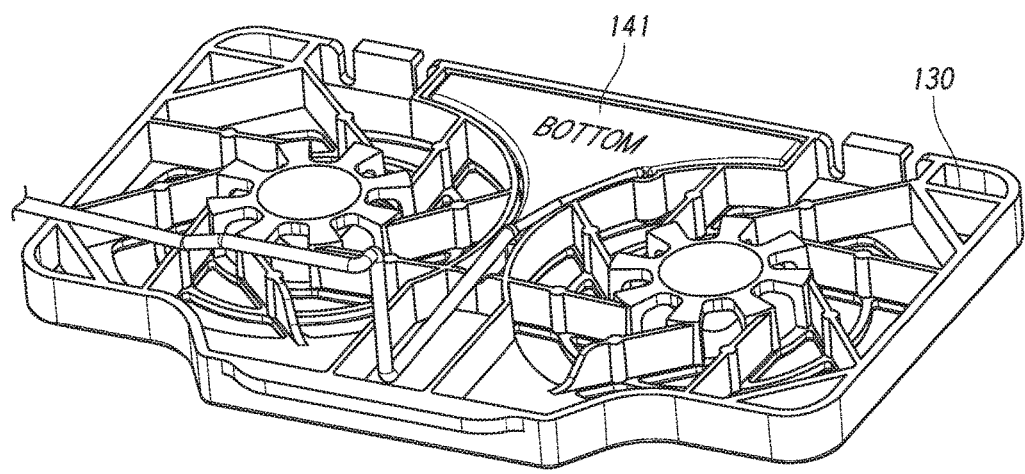
FIG. 8E is a perspective view of an example fan cover with the antenna of FIG. 8B positioned within the fan cover.
Figure 8F:
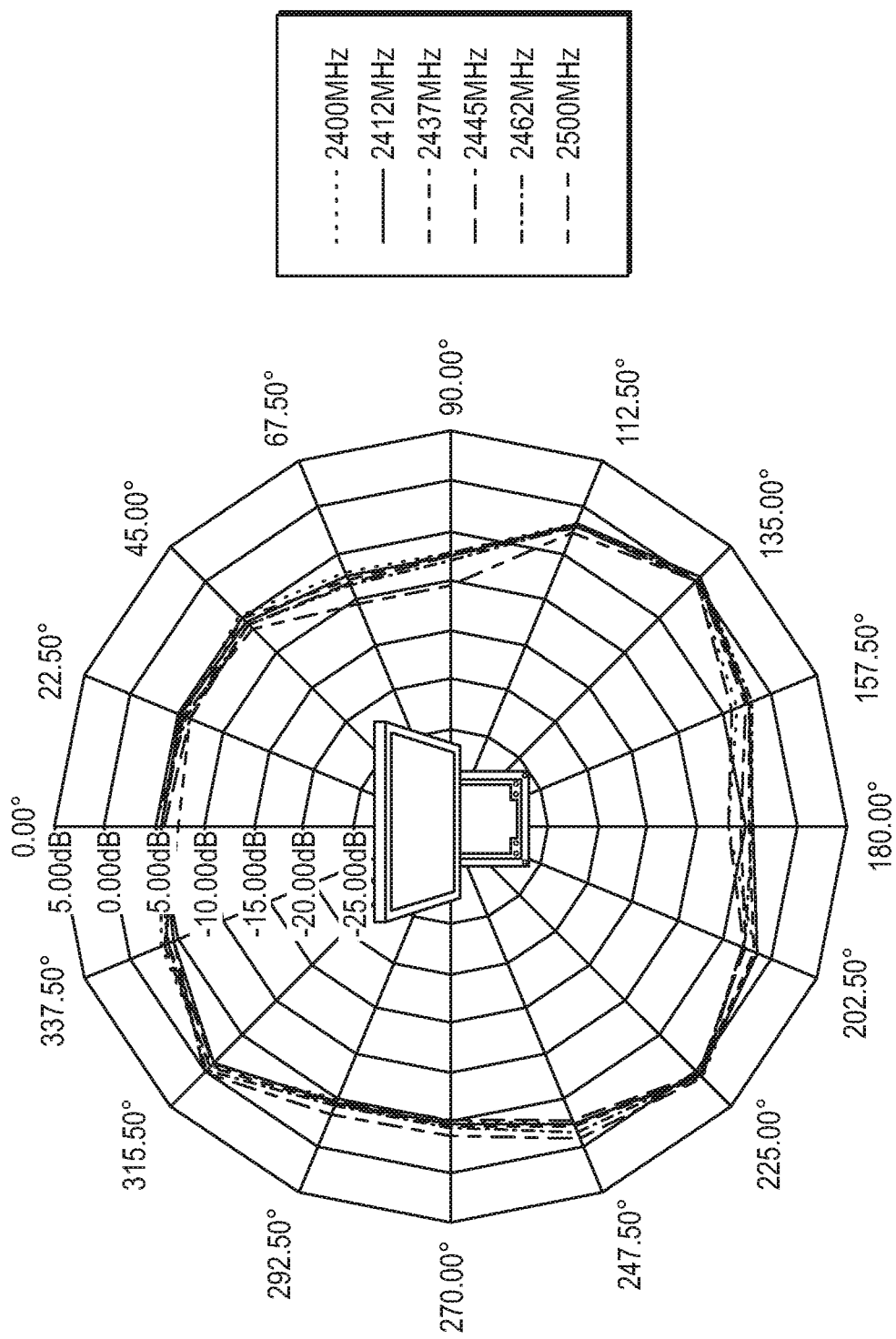
FIG. 8F is an example azimuthal radiation plot for the antenna of FIG. 8A positioned as depicted by FIG. 8D.
Figure 8G:
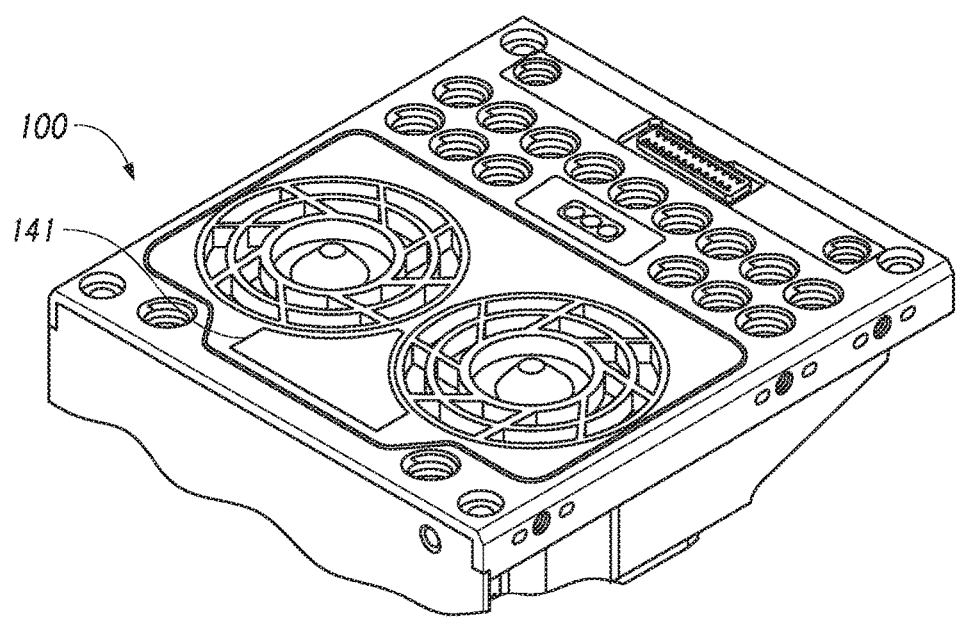
FIG. 8G is a magnified perspective view of a back of the brain module of FIG. 1A including denotation of a second example position of the antenna of FIG. 8A.

FIGS. 8D and 8G illustrate positions for the antenna 141 underneath the fan cover 130. The antenna 141 can, for instance, be secured to the fan cover 130. As can be seen from FIG. 8E, the antenna 141 can be positioned below the fan cover 130 near a center of the top of the housing 102. The antenna 141 can, for instance, be part of or within a fan support structure like the fan cover 130 and fan housing 710. As can be seen from FIG. 8G, the antenna 141 can instead be positioned below the fan cover 130 near an edge of the top of the housing 102. In some embodiments, the brain module 100 can include one antenna at both the center and the edge of the housing 102. In such embodiments, the brain module 100 can utilize one or both of the antennas for communication, such as simultaneously or alternately. In yet other embodiments, one or more other antennas may be positioned around the brain module 100, such as around other parts of the fan support structure like the fan cover 130 and fan housing 710. Moreover, the antenna 114 can be interposed at least partially between two fans within the fan housing 131, or the antenna 114 can extend at least partially along a curved path following part of a path traveled by an end of a fan blade within the fan housing 131.

FIG. 8F illustrates an azimuthal radiation plot for the antenna 141 when positioned as provided with respect to FIG. 8D. The numbers located around the outside of the plot indicate an angle relative to a lens facing direction for the brain module 100 of FIG. 1A, and distances from a center of the plot to the data lines indicate a signal strength in dB for various frequencies ranging from 2.4 GHz to 2.5 GHz relative to a reference dipole antenna at a test distance. As can be seen from the plot, the antenna 141 when constructed and positioned as provided with respect to FIG. 8D generates a relatively even radiation pattern.

Connection Interfaces

Referring again to FIG. 1A, the brain module 100 can include one or more module connectors configured to mate with corresponding connectors on one or more optional external electronics modules that are releasably attachable to the brain module 100. For instance, the first and third module connectors 110, 140 can be complementary to and electrically and mechanically mate with corresponding connectors include on various external modules, such as the display module 400 of FIG. 4A.

In the illustrated embodiment, the first and third module connectors 110, 140 include 26 conductive target pads configured to mate with 26 corresponding spring-loaded pins included in the tenth module connector 420. The use of spring-loaded pins and corresponding target pads can provide a number of advantages, some of which have been described herein. Among these advantages, the bias force of the spring provides a relatively stable contact force and resistance between the tip of the pin and the target, even under conditions of heavy shock and vibration. Spring-loaded pins according to certain embodiments engage with a substantially flat corresponding target surface, providing reliable contact if the tip of the pin touches any point within the target's diameter, allowing forgiveness in the event of misalignments. Moreover, the use of flat landing pads as targets, which can be flush with the surrounding connector support, provides an easily wipeable/cleanable connector interface that is not susceptible to accumulation of lint or other material that could degrade operation.

FIGS. 9A and 9B show two examples of port configurations for a connection interface, such as the connection interface formed by a connector of the brain module 100 with a corresponding connector of an attachable module. The ports of the connection interface shown in FIG. 9A are arranged in a top row 902 and a bottom row 904. Of the ports in the top row 902, nine are connected to a reference potential, such as a ground ("G"). The remaining four ports in the top row 902 are configured as first and second differential pairs 906, 908. As indicated by symbols "+" and "−" symbols, each differential pair 906, 908 is configured to communicate a differential signal pair, which can be a high speed radiofrequency signal, for example. The ports in the bottom row 904 are arranged in a similar fashion, with nine ports connected to a ground, G, or other reference potential, and the remaining four ports arranged as third and fourth differential pairs 910, 912. Some or all of the differential pairs 906, 908, 910, 912 can be configured to communicate high speed data (e.g., motion video data), and one or more of the pairs 906, 908, 910, 912 in some embodiments are configured to communicate clocking information.

FIG. 9B shows another example of a port configuration. Similar to the configuration shown of FIG. 9A, the configuration shown in FIG. 9B includes four pairs 906, 908, 910, 912 of ports each configured to communicate a respective differential signal. In one embodiment, the pairs 906, 908, 910 are configured to communicate video information or other data, while the remaining pair 912 is configured to communicate clock information. Unlike the configuration shown in FIG. 9A, a number of additional ports in the top and bottom rows are configured to communicate data signals rather than being connected to a reference potential, G. In particular, in the illustrated embodiment, five of the ports are configured to communicate respective non-differential serial data signals ("S") (e.g., I²C serial clock or I²C serial data). In addition, one of the ports is configured to communicate a power signal ("P").

As shown, the signals within each of the differential pairs 906, 908, 910, 912 are separated by at least one ground pin according to certain embodiments, which can reduce crosstalk among providing other advantages, resulting in increased reliability. Moreover, ports that are configured to transmit differential signals in the top row 902 are horizontally offset by at least one port from, and therefore not directly above, ports that are configured to transmit differential signals in the bottom row 904, which can similarly improve signal transmission.

Referring again to FIG. 1B, the target pads of the female module connectors 110, 140 of the brain module 100 may be arranged in the manner set forth in FIG. 9A or 9B. Moreover, the spring-loaded pins of the male connector 420 of the display module 400 (or of connectors of other compatible camera modules) can be arranged according to a horizontal mirror image of the patterns shown in FIG. 9A or 9B, such that upon connection of a female module connector 110 or 140 with a male connector 420 of a module, each target pad mates with a corresponding pin that is configured to communicate the same type of signal as the target pad (G, +, −, S, or P).

While certain example connectors and connection interface port configurations have been shown a variety of alternative implementations are possible. For instance, more or less ports may be included, the ports can be arranged in a different number of rows, etc. Moreover, in some embodiments the connectors 110, 140 on the brain module 100 are male while the connector 420 on the display module 400 and other compatible modules are female. In some other embodiments, traditional pin and socket connectors are used instead of spring-loaded pins.

In addition to maintaining a reliable connection, such as through the use of spring-loaded pins, the connection interfaces described herein can provide a high degree of functionality and adaptability, while maintaining a relatively small form factor.

The connection interface according to some embodiments, including the illustrated embodiments, is capable of implementing a High-Definition Multimedia Interface (HDMI)-compliant interface. The connection interface can be capable of communicating at least 2 k-resolution motion picture image data at a frame rate of at least 23 frames per second, for example. In various implementations, the connection interface can be capable of communicating motion picture image data at 23 frames per second or greater having a resolution of at least 4 k, at least 6 k, at least 8 k resolution, or resolutions between any of these amounts.

In addition to supporting large data rates, the connection interface according to certain embodiments can also be capable of delivering a relatively large amount of power, allowing connection to relatively power hungry devices without requiring a separate power connection. For instance, the connection interface can be capable of delivering at least 1.5 watts (W) of power, e.g., at least 500 milliamps (mA) of current at 3 volts (V). In some embodiments, the connection interface can be capable of delivering at least 9 W, e.g., 600 mA at 15 V, which may be sufficient to power a display module having a 9 inch liquid crystal display. In various implementations, the connection interface is capable of delivering at least to 0.5, 1, 2, 5, 9, 10, 20, or 50 W of power, or amounts between any of the foregoing values.

In addition to being capable of communicating large amounts of data or power, the connection interface according to certain embodiments can have a relatively small form factor, reducing the footprint of the module connectors 110, 140 on the camera, thereby allowing room for inclusion of additional componentry on the brain 100, increased aesthetic appeal, etc. For instance, referring to FIGS. 1B, 9A, and 9B, in one example implementation, the horizontal pitch 914, or distance between the center of adjacent pins in the module connectors 110, 140 is 1.5 millimeters (mm), and the vertical pitch 916, or distance between the center of a pin in the top row 902 and the pin directly below that pin in the bottom row, is 3 mm. In this example, the footprint of the portion 918 of the connector module 140, e.g., including the conductor supporting member surrounding the contact pads, but not including the channel 114, is about 20 millimeters wide (in a direction along the rows 902, 904) and about 5 mm tall (in a direction from a pin in the bottom row 902 to adjacent pin in the top row 904). In various implementations, the inter-pin pitch 914 is less than about 1, 2, 2.5, or 3 mm, and the inter-row pitch 916 is less than about 2, 3, 4, 5, or 6 mm.

Figure 9C:
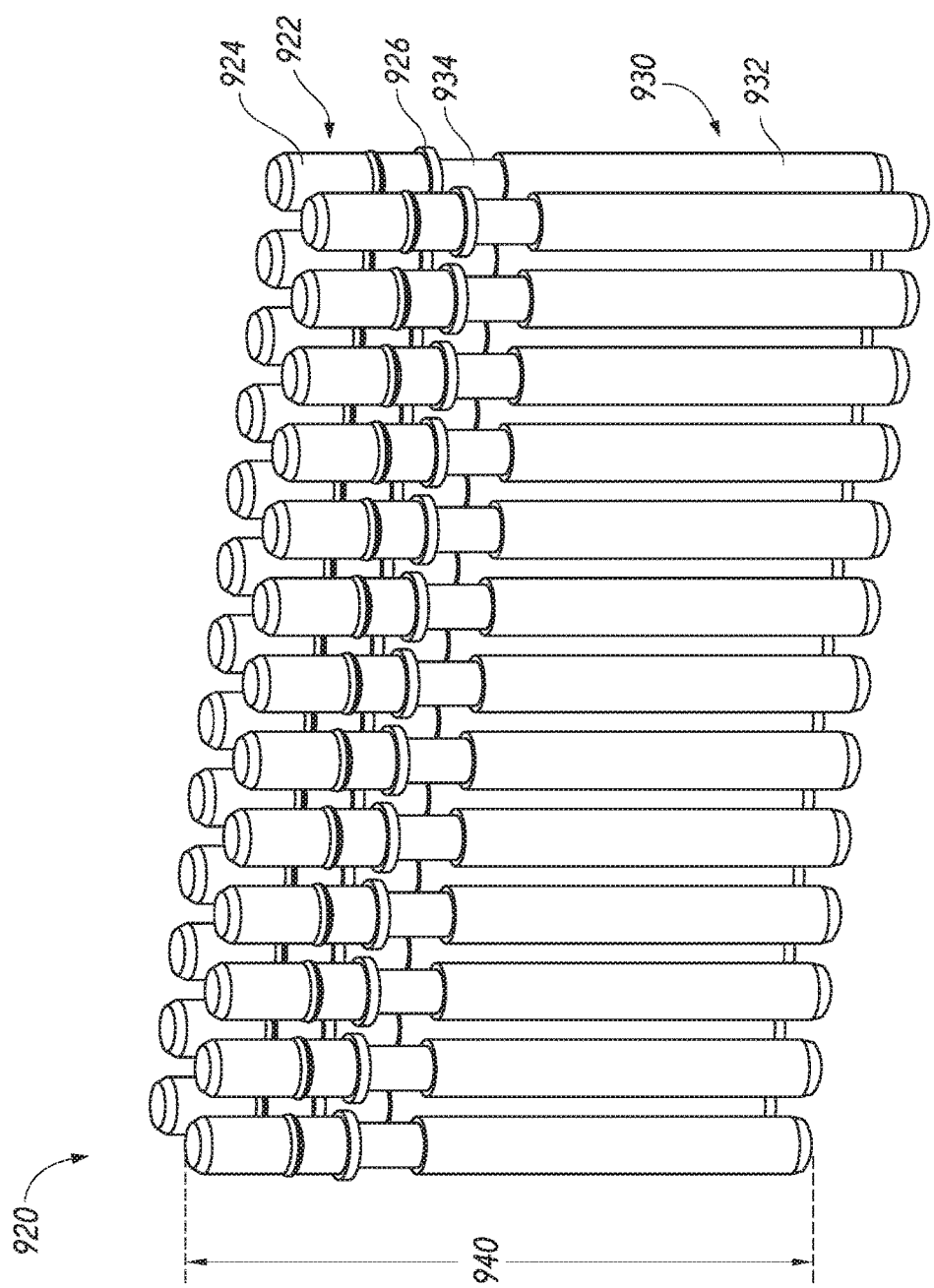
FIG. 9C shows a perspective diagram of an example module connection interface including spring-loaded pins.

FIG. 9C shows a perspective view of a connection interface 920 according to certain embodiments. For the purposes of illustration, only the conductive target members 922 and conductive spring-loaded pins 930 are shown, without showing the respective connector housings that surround and support the targets and pins. For instance, the target members 922 may be the conductive targets supported within the module connectors 110, 140 of the brain module 100, and the spring-loaded pins 930 may be those supported within the connector 420 of the display module 400.

Each target member 922 includes an elongate portion 924 and a head portion 926 with a flat end surface (not visible) transverse to the elongate axis of the target member 922. Each pin 930 includes an elongate portion 932 and a tip portion 934, which can have a flat end surface (not visible) transverse to the elongate axis of the pin 930, and which mates with the flat end surface of the corresponding target member 922. Each pin 930 includes a spring within the elongate portion 932 positioned to bias the tip portion towards the target member 922. As the tip portion 934 is brought into contact with the end surface of the head portion 926 of the corresponding target member 922, the force of the spring is overcome, causing the tip portion 934 to slide into the elongate portion 932.

According to some embodiments, the combined length 940 of the target members 922 and the pins 930 corresponds to the overall conductive length of the connection interface. In one embodiment, the length 940 is about 11.15 mm, the inter-pin pitch 914 is about 1.5 mm, the inter-row pitch 916 is 3 mm, the dielectric material forming the conductor supporting portions of the module connectors 110, 140 of the brain and the module connector 420 of the display module 400 (or other module) that support and surround the targets 922 and pins 930 respectively, is formed from PPA (e.g., Amodel® HFFR-4133 PPA resin), the tip portion 934, elongate portion 932, and spring of each pin respectively comprise Gold-plated Beryllium Copper, Gold-plated Nickel Silver, and Gold-plated stainless steel, and the target 622 comprises Gold-plated Beryllium Copper.

Figure 9D:
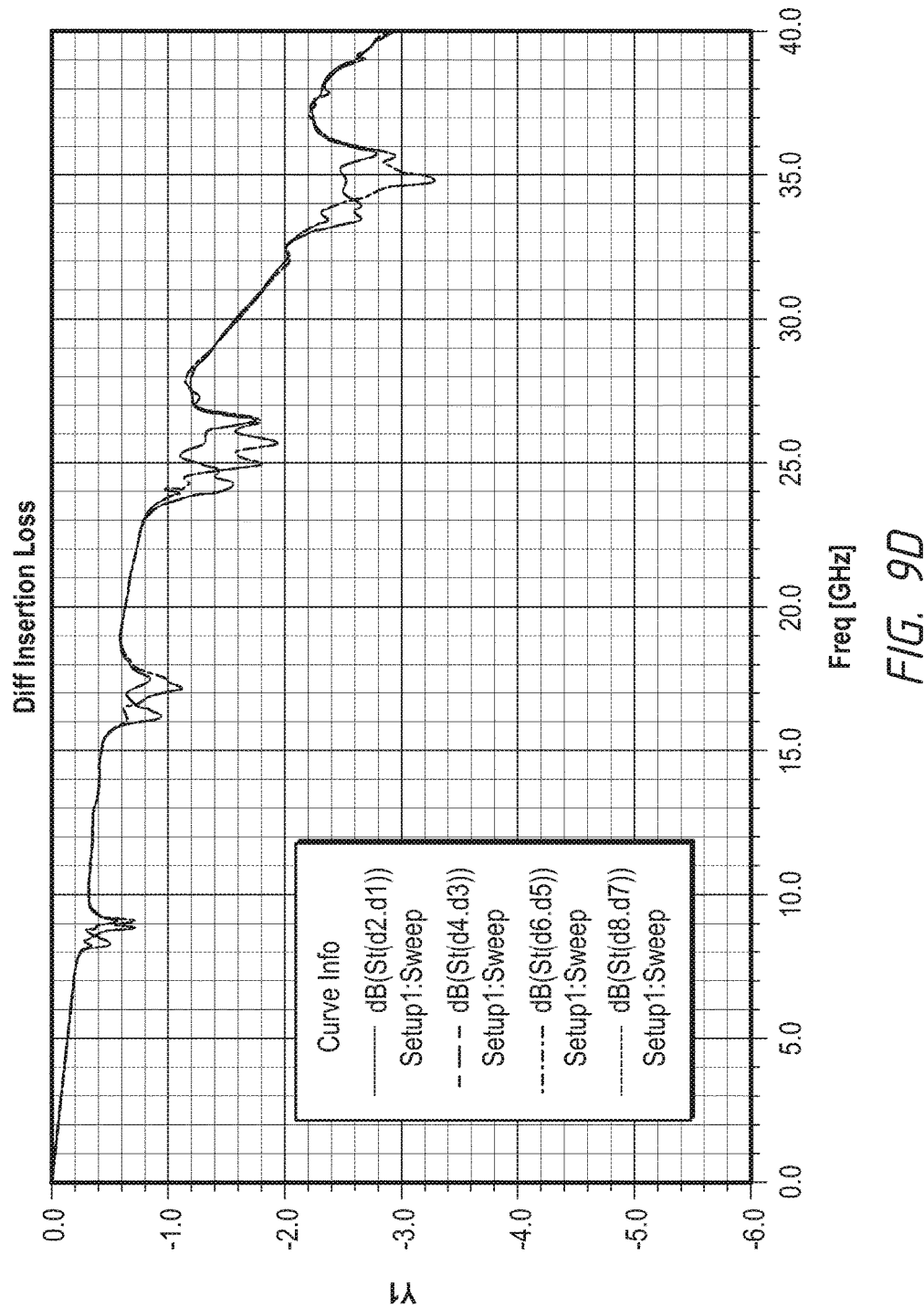
FIGS. 9D, 9E, and 9F depict performance of one example connection interface.
Figure 9E:
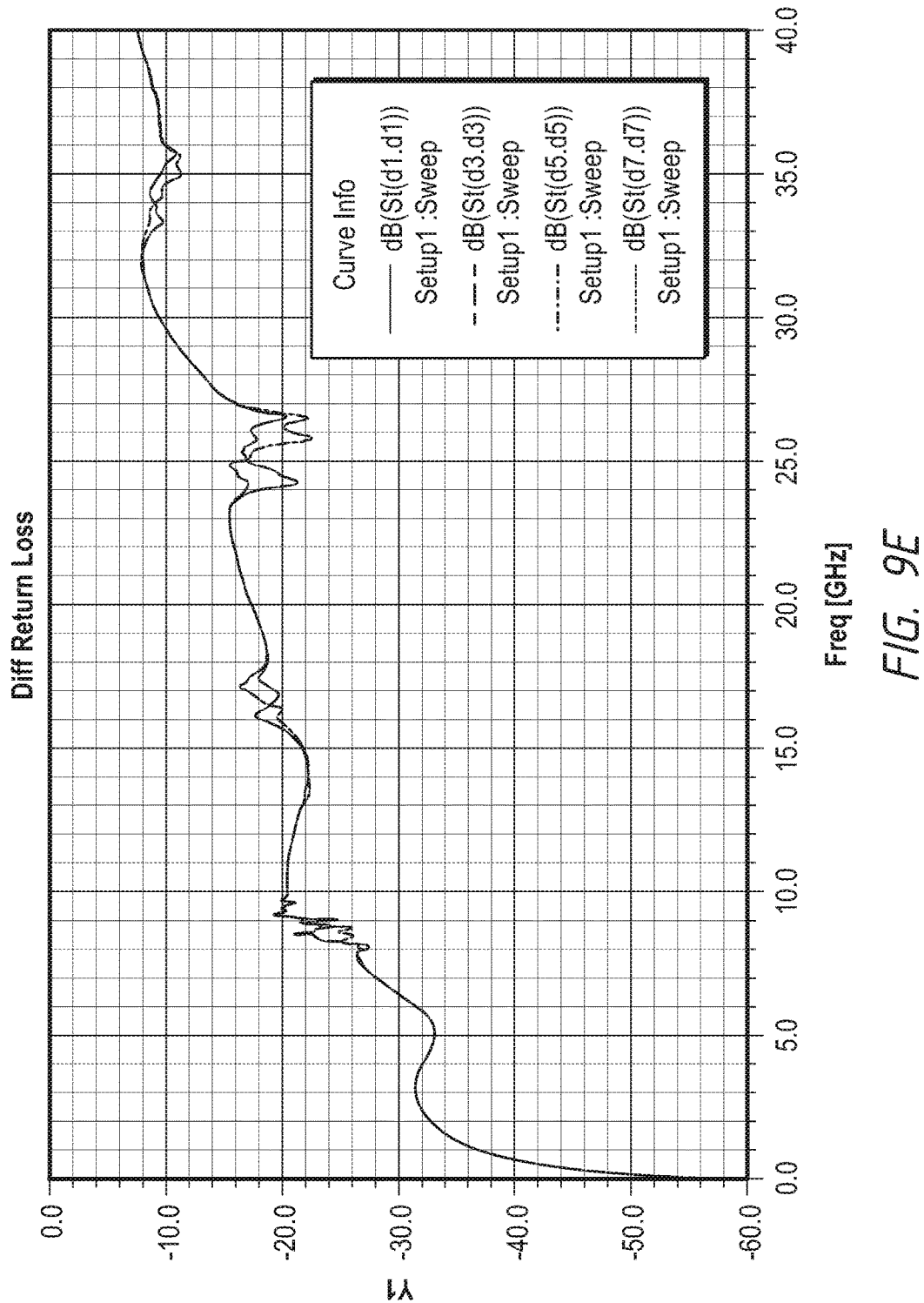
Figure 9F:
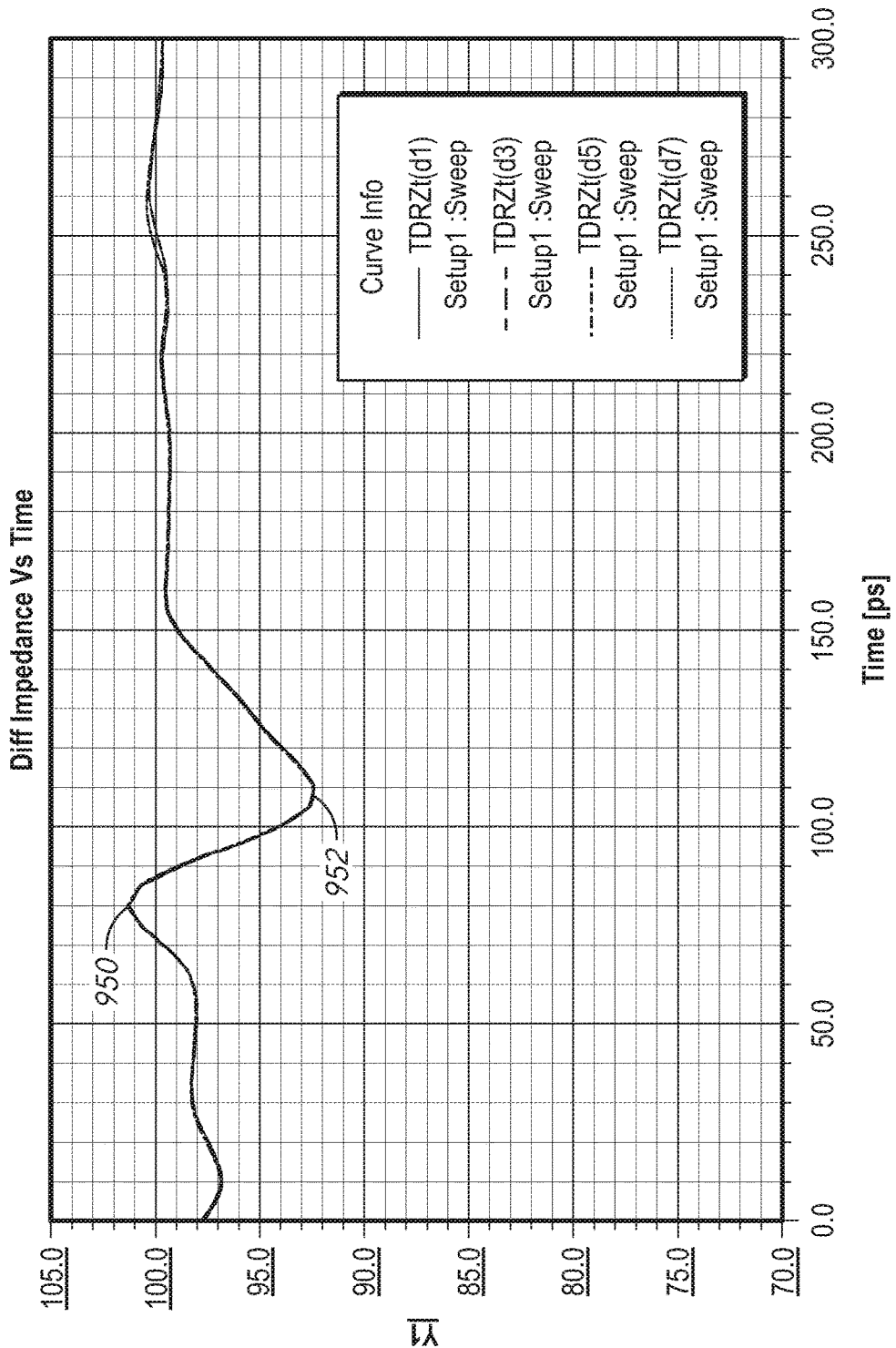

FIG. 9D shows insertion loss across the connection interface for the exemplary embodiment described in the preceding paragraph. In particular, the plot shows loss of signal power across the length 940 of the conductive portion of the connection interface for each of the four differential pairs 906, 908, 910, 912. The insertion loss is shown across a sweep from 0 to 40 gigahertz (GHz), and is less than about 1.2 decibels (dB) for each of the four differential pairs for input signals having a frequency less than about 23 GHz, and less than about 3.4 dB for frequencies up to about 40 GHz. FIG. 9E shows return loss in decibels for signals inserted via each differential pair 906, 908, 910, 912, across a sweep of input signals from 0 to 40 GHz. FIG. 9F shows the characteristic impedance across the connection interface for each of the four differential pairs 906, 908, 910, 912. As shown, the characteristic impedance does not deviate by more than about 8% of 100 ohms across the interface. In particular, the characteristic impedance across the connection interface has a maximum value of about 101 ohms corresponding to the peak 950, and has a minimum value of about 92 ohms corresponding to trough 952. One of the peak 950 or the trough 952 may correspond to the point of contact between the end of the tip portions 934 of the pins 930 and the flat end surface of the head portion 926 of the corresponding target member 922. In various implementations, the characteristic impedance of the connection interface does not deviate above or below 100 ohms by more than about 10, 15, or 20 percent.

CONCLUSION

The functionality of certain embodiments of the camera systems and associated modules described herein may be implemented as software modules, hardware modules, or a combination thereof. In various embodiments, the functionality may be embodied in hardware, firmware, a collection of software instructions executable on a processor, or in analog circuitry.

Although particular interface configurations and corresponding methods of coupling and decoupling are described herein, in some embodiments, other interface configurations and corresponding methods of coupling and decoupling can be used. For example, various mechanisms may be used to further secure the connections between the brain module 100 and the port extender module 200 or between the port extender module 200 and the power module 300. One or more sliding lock mechanisms or a locking pin which engages a peg can be used, for example. Such pins may, in some embodiments, comprise bobby pins, cotter pins, R-clips, split pins, and the like, or may be otherwise similar to such types of pins in structure and function.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements or states. Thus, such conditional language is not generally intended to imply that features, elements or states are in any way required for one or more embodiments or that one or more embodiments necessarily include logic for deciding, with or without author input or prompting, whether these features, elements/ or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

Disjunctive language such as the phrase "at least one of X, Y and Z," unless specifically stated otherwise, is to be understood with the context as used in general to convey that an item, term, etc. may be either X, Y, or Z, or a combination thereof. Thus, such conjunctive language is not generally intended to imply that certain embodiments require at least one of X, at least one of Y and at least one of Z to each be present.

Language of degree used herein, such as the terms "approximately," "about," "generally," and "substantially," can represent a value, amount, or characteristic close to the stated value, amount, or characteristic that still performs a desired function or achieves a desired result. For example, the terms "approximately", "about", "generally," and "substantially" may refer to an amount that is within less than or equal to 10% of, within less than or equal to 5% of, within less than or equal to 1% of, within less than or equal to 0.1% of, and within less than or equal to 0.01% of the stated amount.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Depending on the embodiment, certain acts, events, or functions of any of the methods described herein can be performed in a different sequence, can be added, merged, or left out altogether (e.g., not all described acts or events are necessary for the practice of the method). Moreover, in certain embodiments, acts or events can be performed concurrently, e.g., through multi-threaded processing, interrupt processing, or multiple processors or processor cores, rather than sequentially.

The various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The blocks of the methods and algorithms described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, a hard disk, a removable disk, or any other form of computer-readable storage medium known in the art. An exemplary storage medium is coupled to a processor such that the processor can read information from, and write information to, the storage medium. In the alternative, the storage medium can be integral to the processor. The processor and the storage medium can reside in an ASIC.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments described herein can be embodied within a form that does not provide all of the features and benefits set forth herein, as some features can be used or practiced separately from others.

What is claimed:

1. A digital video camera comprising:
   a camera body comprising a first surface, a second surface, and a plurality of third surfaces extending between the first surface and the second surface, the first surface comprising an opening through which light enters the camera body;
   an image sensor positioned in the camera body and configured to generate image data corresponding to the light contacting the image sensor; and
   a port expander releasably attachable to the second surface, the port expander comprising:
      a plurality of electrical ports including a first electrical port and a second electrical port, the first electrical port being configured to releasably couple to a first electrical cable and communicate an input signal received from the first electrical cable, the second electrical port being configured to releasably couple to a second electrical cable and output a video signal to the second electrical cable,
      a camera body-proximal surface and a camera body-distal surface defining a thickness of the port expander therebetween, the camera body-proximal surface configured to engage the second surface when the port expander is attached to the camera body,
      a plurality of sidewalls extending between the camera-body proximal surface and the camera body-distal surface and including a first sidewall, and
      a connector housing supporting the plurality of electrical ports and being immovable relative to the camera body-proximal surface, the connector housing extending from the first sidewall beyond a first plane defined by the camera body-proximal surface so that a portion of the connector housing extends along at least one of the plurality of third surfaces when the port expander is attached to the camera body, the first electrical port having an axial length that extends through the first plane.

2. The digital video camera of claim 1, wherein the connector housing extends beyond the first plane by a distance at least as great as the thickness of the port expander.

3. The digital video camera of claim 1, wherein the camera-body proximal surface comprises at least one electrical connector configured to mate with at least one corresponding electrical connector of the second surface.

4. The digital video camera of claim 3, further comprising a processor positioned in the camera body and configured to output the video signal to the second electrical port via an electrical path comprising the at least one corresponding electrical connector of the second surface and the at least one electrical connector of the camera-body proximal surface.

5. The digital video camera of claim 1, wherein the camera-body proximal surface comprises at least one fastening element configured to engage with a corresponding fastening element provided on the second surface.

6. The digital video camera of claim 1, wherein the first electrical port is arranged to point away from the first surface when the port expander is attached to the camera body.

7. The digital video camera of claim 1, wherein the camera body-distal surface comprises an accessory interface configured for releasable attachment of an electronic device.

8. The digital video camera of claim 1, wherein the camera body-distal surface comprises an accessory interface configured for releasable attachment of a camera battery device, and the accessory interface comprises an electrical connector configured to receive electrical power from the camera battery device.

9. The digital video camera of claim 1, wherein the connector housing additionally extends from the first sidewall beyond a second plane defined by the camera-body distal surface.

10. The digital video camera of claim 1,
wherein the plurality of third surfaces comprise a top side, a bottom side, a left side, and a right side,
wherein the plurality of sidewalls comprise a top sidewall, a bottom sidewall, a left sidewall, and a right sidewall, and
wherein the connector housing extends along one of the left side or the right side.

11. The digital video camera of claim 1,
wherein the second surface is provided on a rear portion of the camera body, the rear portion comprising a cooling grill configured to exchange air between an inside of the camera body and an outside of the camera body, and
wherein the cooling grill is positioned on the rear portion such that the port expander attaches to the camera body without covering the cooling grill.

12. The digital video camera of claim 11, wherein the second surface overhangs the cooling grill.

13. The digital video camera of claim 11, wherein the cooling grill comprises a first part and a second part, the first part defining a first plane and the second part defining a second plane perpendicular to the first plane.

14. The digital video camera of claim 11, wherein the cooling grill comprises an air exhaust grill.

15. The digital video camera of claim 1, wherein the camera body comprises a mounting interface configured to releasably attach a lens mount to the first surface.

16. The digital video camera of claim 1, wherein the input signal comprises an audio input signal.

17. The digital video camera of claim 1, wherein the connector housing extends from the first sidewall beyond the first plane so that the portion of the connector housing extends along and is flush against the at least one of the plurality of third surfaces when the port expander is attached to the camera body.

18. An electronic device configured to releasably couple to a digital video camera, the electronic device comprising:
a plurality of electrical ports including a first electrical port and a second electrical port, the first electrical port being configured to releasably couple to a first electrical cable and communicate an input signal received from the first electrical cable, the second electrical port being configured to releasably couple to a second electrical cable and output a video signal to the second electrical cable; and
an attachment housing comprising:
a camera body-proximal surface and a camera body-distal surface defining a thickness of the attachment housing therebetween, the camera body-proximal surface being configured to releasably attach to a first surface of a camera body,
a plurality of sidewalls extending between the camera-body proximal surface and the camera body-distal surface and including a first sidewall, and
a connector housing supporting the plurality of electrical ports and being immovable relative to the camera body-proximal surface, the connector housing extending from the first sidewall beyond a plane defined by the camera body-proximal surface so that a portion of the connector housing extends along a second surface of the camera body different from the first surface when the attachment housing is attached to the first surface, the first electrical port having an axial length that extends through the plane.

19. The electronic device of claim 18, wherein the connector housing extends beyond the plane by a distance at least as great as the thickness of the attachment housing.

20. The electronic device of claim 18, wherein the connector housing extends from the first sidewall beyond the plane so that the portion of the connector housing extends along and is flush against the second surface when the attachment housing is attached to the first surface.

\* \* \* \* \*